(12) United States Patent
Dennis

(10) Patent No.: US 9,495,016 B2
(45) Date of Patent: Nov. 15, 2016

(54) TYPING INPUT SYSTEMS, METHODS, AND DEVICES

(71) Applicant: John Zachary Dennis, Los Angeles, CA (US)

(72) Inventor: John Zachary Dennis, Los Angeles, CA (US)

(*) Notice: Subject to any disclaimer, the term of this patent is extended or adjusted under 35 U.S.C. 154(b) by 15 days.

(21) Appl. No.: 14/447,340

(22) Filed: Jul. 30, 2014

(65) Prior Publication Data

US 2014/0340313 A1  Nov. 20, 2014

Related U.S. Application Data

(63) Continuation of application No. 13/418,273, filed on Mar. 12, 2012, now Pat. No. 8,797,266.

(60) Provisional application No. 61/486,736, filed on May 16, 2011.

(51) Int. Cl.
| | | |
|---|---|---|
| *G06F 3/02* | (2006.01) | |
| *G06F 3/023* | (2006.01) | |
| *G06F 17/27* | (2006.01) | |
| *H03M 11/08* | (2006.01) | |

(52) U.S. Cl.
CPC ........... *G06F 3/0233* (2013.01); *G06F 3/0219* (2013.01); *G06F 3/0235* (2013.01); *G06F 17/276* (2013.01); *H03M 11/08* (2013.01)

(58) Field of Classification Search
None
See application file for complete search history.

(56) References Cited

U.S. PATENT DOCUMENTS

| | | | |
|---|---|---|---|
| 4,042,777 A | 8/1977 | Bequaert et al. | |
| 4,067,431 A | 1/1978 | Whitaker | |
| 4,775,255 A | 10/1988 | Langley | |
| 4,917,516 A | 4/1990 | Retter | |
| 5,189,416 A | 2/1993 | Estes | |
| 5,267,181 A | 11/1993 | George | |
| 5,281,966 A * | 1/1994 | Walsh .................. | G06F 3/0235 341/22 |
| 5,432,510 A | 7/1995 | Matthews | |
| 5,828,323 A | 10/1998 | Bartet | |
| 5,900,864 A | 5/1999 | Macdonald | |
| 6,378,234 B1 | 4/2002 | Luo | |

(Continued)

FOREIGN PATENT DOCUMENTS

| | | |
|---|---|---|
| EP | 1052564 | 11/2000 |
| WO | WO9602394 | 2/1996 |
| WO | WO2007148128 A2 | 12/2007 |

OTHER PUBLICATIONS

"Brown Corpus", Wikipedia, The Free Encyclopedia, http://en.wikipedia.org/wiki/Brown_Corpus, Apr. 11, 2011, 7 pages.

(Continued)

*Primary Examiner* — Joseph Haley
(74) *Attorney, Agent, or Firm* — Troutman Sanders, LLP

(57) ABSTRACT

Systems, devices, and techniques are disclosed relating to typing input devices. For example a ten-key input device can be provided for receiving input via ten input elements from the ten fingers on a right hand and a left hand. All of the letters of the alphabet can by typed with the ten input elements according to a translation map that maps the ten input elements or combinations of the ten input elements to the letters of the alphabet.

7 Claims, 48 Drawing Sheets

(56) References Cited

U.S. PATENT DOCUMENTS

| | | |
|---|---|---|
| 6,542,091 B1 | 4/2003 | Rasanen |
| 7,202,853 B2 | 4/2007 | Ng et al. |
| 7,706,616 B2 | 4/2010 | Kristensson |
| 2011/0035696 A1* | 2/2011 | Elazari .................. G06F 3/0233 715/773 |

OTHER PUBLICATIONS

"Chorded Keyboard", Wikipedia, The Free Encyclopedia, http://en.wikipedia.org/wiki/Chorded_keyboard, Apr. 11, 2011, 7 pages.
Park, In Hwa, Authorized Officer, Korean Intellectual Property Office, in Application No. PCT/US2012/030699, International Search Report dated Oct. 26, 2012, 9pages.

* cited by examiner

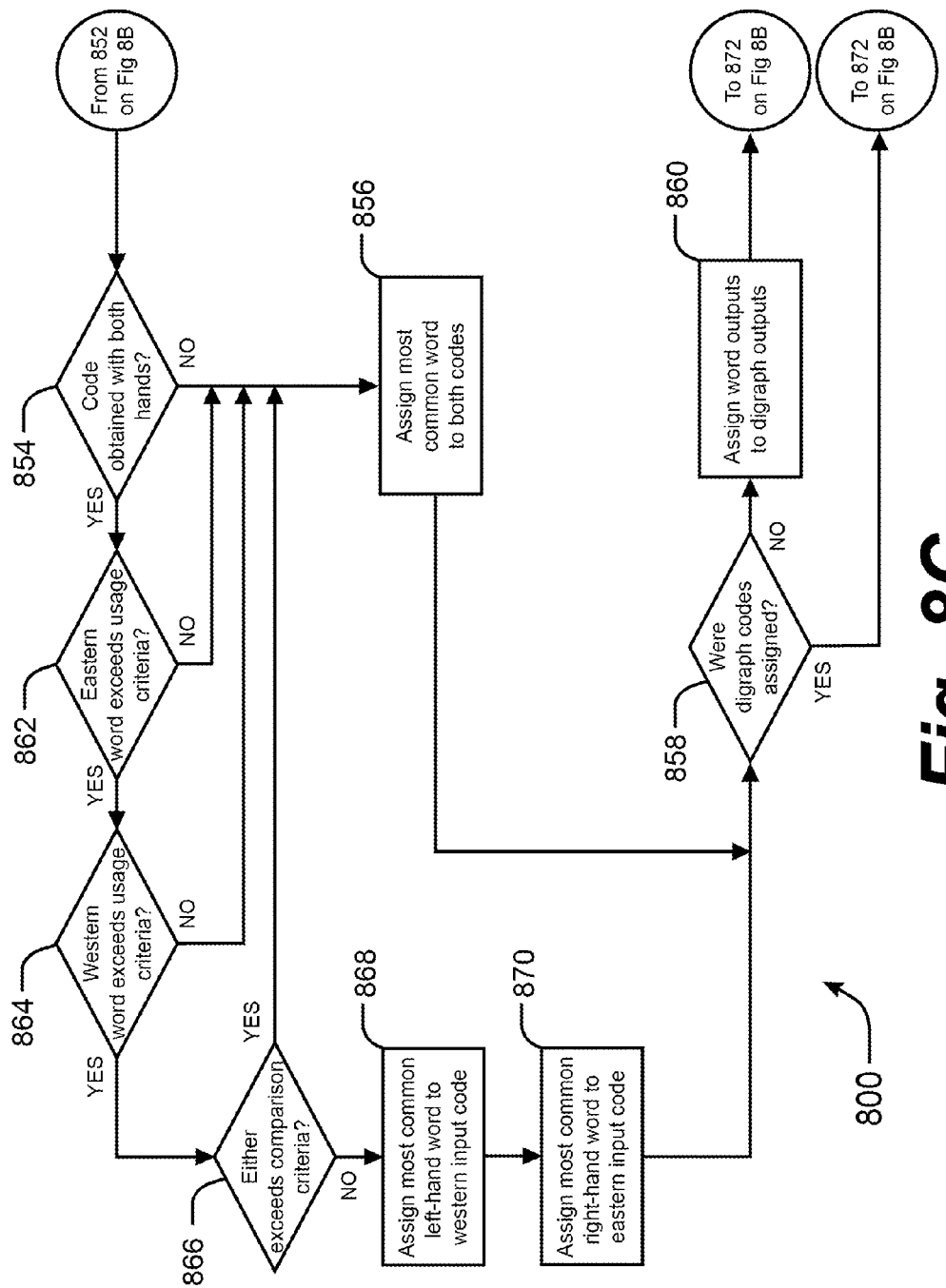

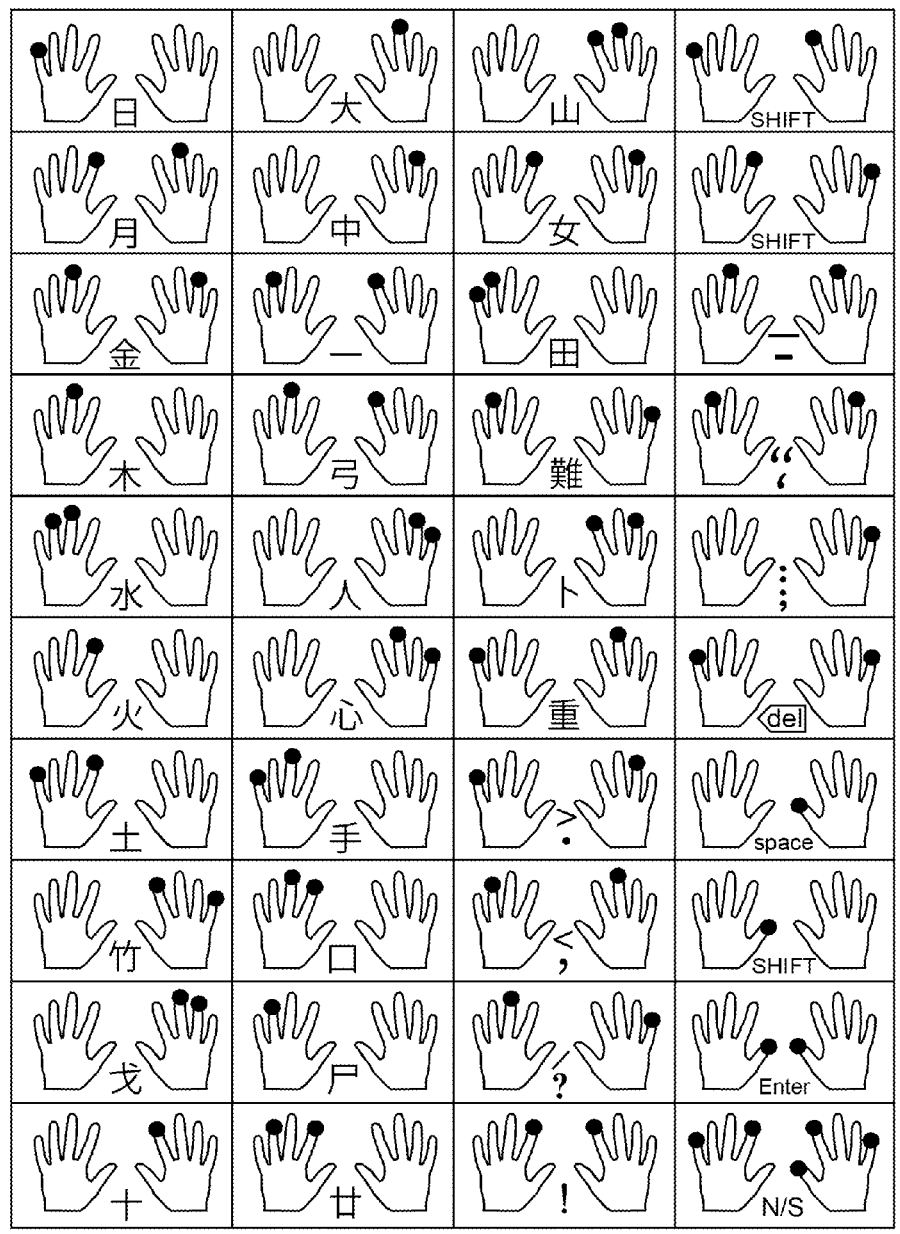

TYPING INPUT SYSTEMS, METHODS, AND DEVICES

CROSS REFERENCE TO RELATED APPLICATIONS

This application claims the benefit of priority of U.S. application Ser. No. 13/418,273, filed Mar. 12, 2012, and entitled "Typing Input Systems, Methods and Devices", which claims the benefit of priority of U.S. Provisional Application Ser. No. 61/486,736, filed May 16, 2011, and entitled "Typing Input Systems, Methods, and Devices", the disclosures of which are hereby incorporated by reference.

BACKGROUND

The present invention relates to systems and techniques for encoding key assignments for keyboards and other data input devices.

The most familiar type of data input device is the QWERTY keyboard, whose key arrangement was designed primarily by Charles Latham Sholes in the late 19th century. The original QWERTY keyboard features a single input key for each letter of the English alphabet and additional keys for numbers, symbols, and punctuation. With the rise of computer use, the QWERTY keyboard layout has been expanded to include numerous modern computer function keys and other useful controls. It is believed that the QWERTY scheme was deliberately laid out with keys in impractical positions in order to slow down skilled typists, presumably to prevent jamming of the mechanical typewriters for which it was designed. Some of the least commonly used letters in the English language (J and K) are placed on the home row, and some of the most commonly used letters (E, T, O, I, and N) are not. In practice, the QWERTY layout requires awkward pathways of finger movement to construct words and users often suffer from repetitive strain injuries ("RSI") as a result of frequent and long-term use of these keyboards.

The Dvorak keyboard was designed by August Dvorak and William L. Dealey in the mid-1930's in an effort to maximize typing efficiency. The Dvorak keyboard places all vowels on the home row for the left hand and the most common consonants on the home row for the right hand, therefore allowing a user to type in more of a rhythm and minimizing the number of awkward patterns necessary to construct words. Although the Dvorak keyboard has become more accessible in recent years due to software applications that eliminate the need for specialized hardware, the Dvorak keyboard has never achieved a high level of commercial success, and the QWERTY layout has remained the dominant standard for word processing and other applications.

With the introduction of cellphones and other handheld computing devices that allow text messaging (and more recently, for email and other uses), new input systems have become popular. For cellphones, the E.161 scheme was used to allow access to all 26 letters of the alphabet using the numbers 2-9 of a standard 12-key telephone keypad. The multi-tap approach (pressing a key repeatedly to cycle through the letter options) has been refined to include predictive texting (such as T-9) and other features, but still remains a cumbersome method of typing messages.

More modern touch-screen devices have increased the number of options, including an on-screen QWERTY keyboard and other methods of inputting text (handwriting recognition, Swype, SlideID, Shapewriter, etc.) but many users still prefer the QWERTY keyboard and many modern phones and PDA's are manufactured to include a physical keyboard for use with the device. Such keyboards are usually designed to be actuated by the user's thumbs, and typing speeds rarely exceed 40 words per minute, even for proficient users. Furthermore, most of these methods normally require the user to visually monitor the input source, preventing users from "touch-typing" and entering text and other data while the eyes are focused on other things.

Chord keyboards are known in the art and include between five and twelve keys. Most chord keyboards are designed so that either individual keys or combinations of multiple keys (chords) can be used to generate the 26 letters of the English alphabet as well as numeric and punctuation characters and function keys.

SUMMARY

This disclosure relates to systems and techniques for encoding key assignments for keyboards and other data input devices, such as input devices with a ten-key layout. For example, an input device can have ten input keys, one for each of the ten fingers on a right hand and a left hand. All twenty-six letters of the alphabet can be mapped to inputs received from one or more of the ten input keys. Numbers, punctuation, functions, and other symbols can also be mapped to inputs received from one or more of the ten input keys.

The ten input keys can be used to type all of the letters of an English alphabet. For example, eight of the input keys correspond to eight fingers of a right hand and a left hand excepting the thumbs and can be assigned to eight letters of the alphabet, these eight letters are referred to herein as the eight primary letters. A single input received via one of the eight input keys produces one of the eight primary letters assigned to that particular input key. Secondary letters can include the remaining eighteen letters of the alphabet. Various chord inputs—inputs received via a combination of two or more of the ten input keys—can produce the secondary letters.

In some implementations, a single action input (e.g., a press-and-release) of one of the user's eight fingers (excepting the thumbs) produces one of the eight primary letters (e.g., A, S, E, T, N, I, O, and P). A single action input using a thumb can produce a shift function. A single action input using the other thumb can produce a space. The remaining "secondary characters" in the alphabet (i.e., the remaining 18 letters) as well as punctuation characters and several computer function commands are produced by striking a chord. In some examples, all of the primary characters and most of the secondary characters in the data input system are associated with the finger that produces that character in a traditional QWERTY keyboard. In some implementations, the system also includes chords that consist of three or more keys that can be used to produce digraphs, trigraphs, common words, and to switch to additional maps in different modes that allow for the input of numbers, symbols, and other computer function keys.

The systems and techniques described herein can provide various advantages. For example, a ten-figure input typing method and system described herein can be based on a QWERTY keyboard layout making it easy for users of a QWERTY keyboard to adapt to the ten-key typing method and system. The systems and techniques described can have a reduced footprint compared to a traditional keyboard but also provide the same functionality with similar typing speeds. Also, the systems and techniques described herein can eliminate lateral movement of fingers and therefore can reduce repetitive stress injuries. The systems and techniques disclosed herein can be used with pressure sensors on various devices such as gloves, implantables, etc. The systems and techniques described herein can be installed as part of other devices where the user would prefer to avoid releasing their grasp (e.g., steering wheel, pilot's yoke, etc.).

In some implementations, the systems and techniques described herein can be configured to have various commonly used words entered as short cut combinations as chords (i.e., stenography). The systems and techniques described herein need not require specialized hardware to learn. Such systems and techniques can be learned using a traditional QWERTY keyboard. Because in some implementations, the location of the fingers is not as important as the motion of the fingers for providing an input (e.g., touch-typing), a user can type without the need to pay attention to the location of the fingers.

The various methods that are described and claimed in this application can be implemented in various computer systems. Thus, a computer-readable medium can encode a computer program that causes data processing apparatus to perform operations of any of the methods claims. Likewise, various devices and systems can be used to implement the method described and claimed in this application, including a typing input apparatus that includes an input device for receiving input from ten input elements, and a processor programmed to perform the operations of any of the method claims.

Details of one or more implementations are set forth in the accompanying drawings and the description below. Other features, aspects, and potential advantages will be apparent from the description and drawings, and from the claims.

DESCRIPTION OF DRAWINGS

FIGS. 8A, 8B and 8C show an example process by which stenographic combinations are mapped to input codes.

FIG. 42 shows a graphical depiction of examples of combinations of typing inputs and corresponding outputs.

Like reference symbols in the various drawings indicate like elements.

DETAILED DESCRIPTION

This disclosure relates to systems and techniques for encoding key assignments on an input device. Alphabetic characters, punctuation characters and various functions can be encoded for use with an input device that has ten actuation points, such as input keys. Eight of the ten keys can be associated with a user's eight fingers (excepting the thumbs) and combinations thereof can produce letters or characters of an alphabet such as the English alphabet. In some examples, all of the alphabetic characters in the English language, various punctuation characters, and various functions can be produced with such an input device. The remaining two additional keys (each associated with one of the user's two thumbs) can be associated with a space bar and a shift function. In some examples, the alphabetic characters can be produced by either a single actuation of the same finger that would be used to press the key for the alphabetic character on a QWERTY layout, or a dual activation (a two-key chord) that includes the finger that would be used to press the key for that alphabetic character on a QWERTY layout plus an additional key. Such an input device provides a natural progression for users familiar with the QWERTY keyboard layout to a ten-key layout.

In some examples, the systems and techniques disclosed herein can be implemented a computing device with only ten input keys. In some examples, the techniques disclosed herein can be implemented by appropriately programming existing computing systems, such as by programming a computing device with an existing QWERTY keyboard.

Figure 1:
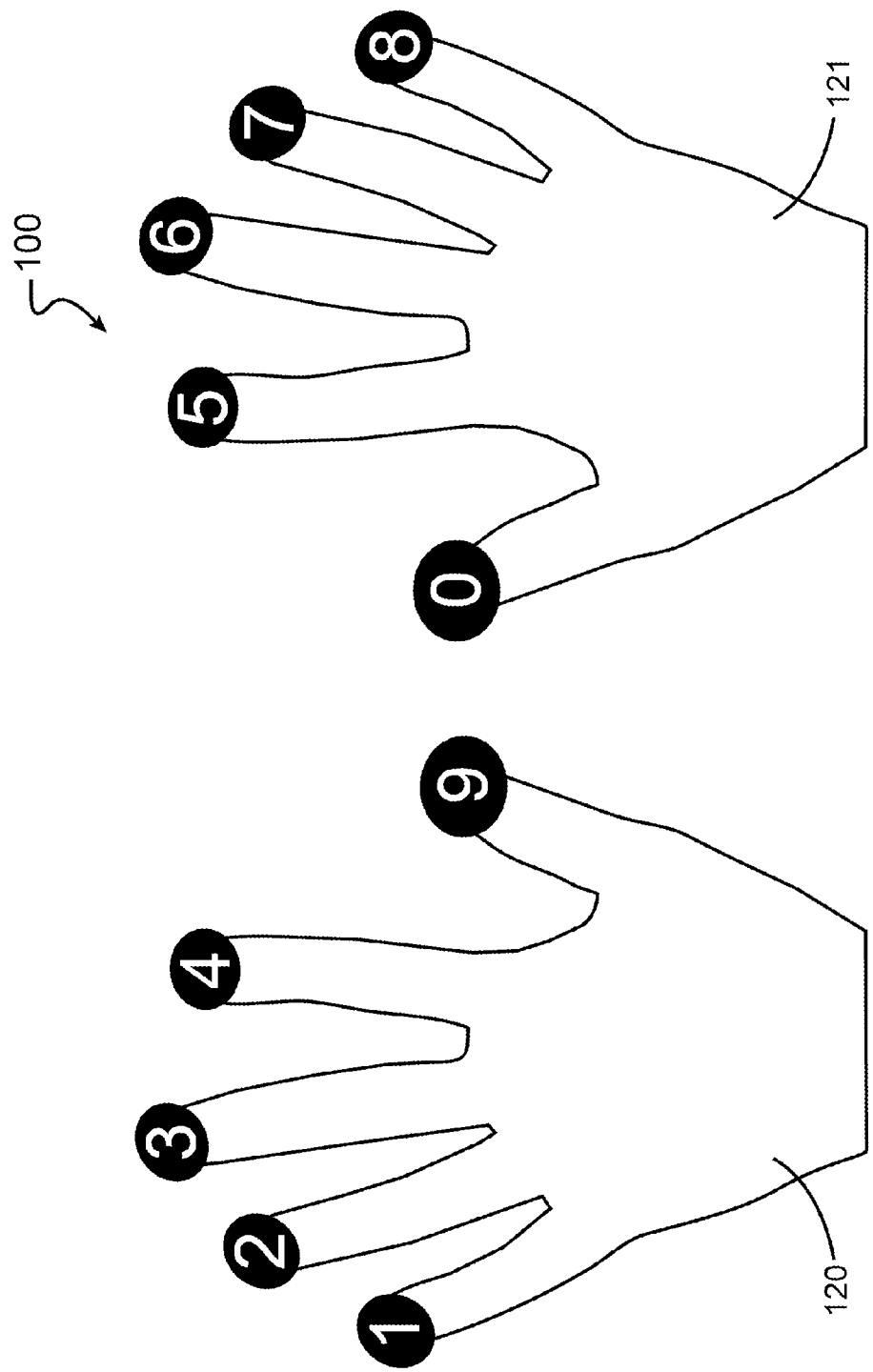
FIG. 1 shows an example of nomenclature for labeling fingers.

FIG. 1 shows an example 100 of nomenclature for labeling fingers. FIG. 1 shows two hands—a left hand 120 and a right hand 121. The left hand 120 has five fingers, including a Finger 1 (a pinky finger), Finger 2 (a ring finger), Finger 3 (a middle finger), Finger 4 (an index figure), and Finger 9 (a thumb). The right hand 121 has five fingers, including a Finger 5 (an index finger), Finger 6 (a middle finger), Finger 7 (a ring finger), Finger 8 (a pinky finger), and Finger 0 (a thumb). Fingers 1 through 8 include all of the fingers on the left hand 120 and the right hand 121 except the thumbs. The left thumb is Finger 9, and the right thumb is Finger 0.

Figure 2:
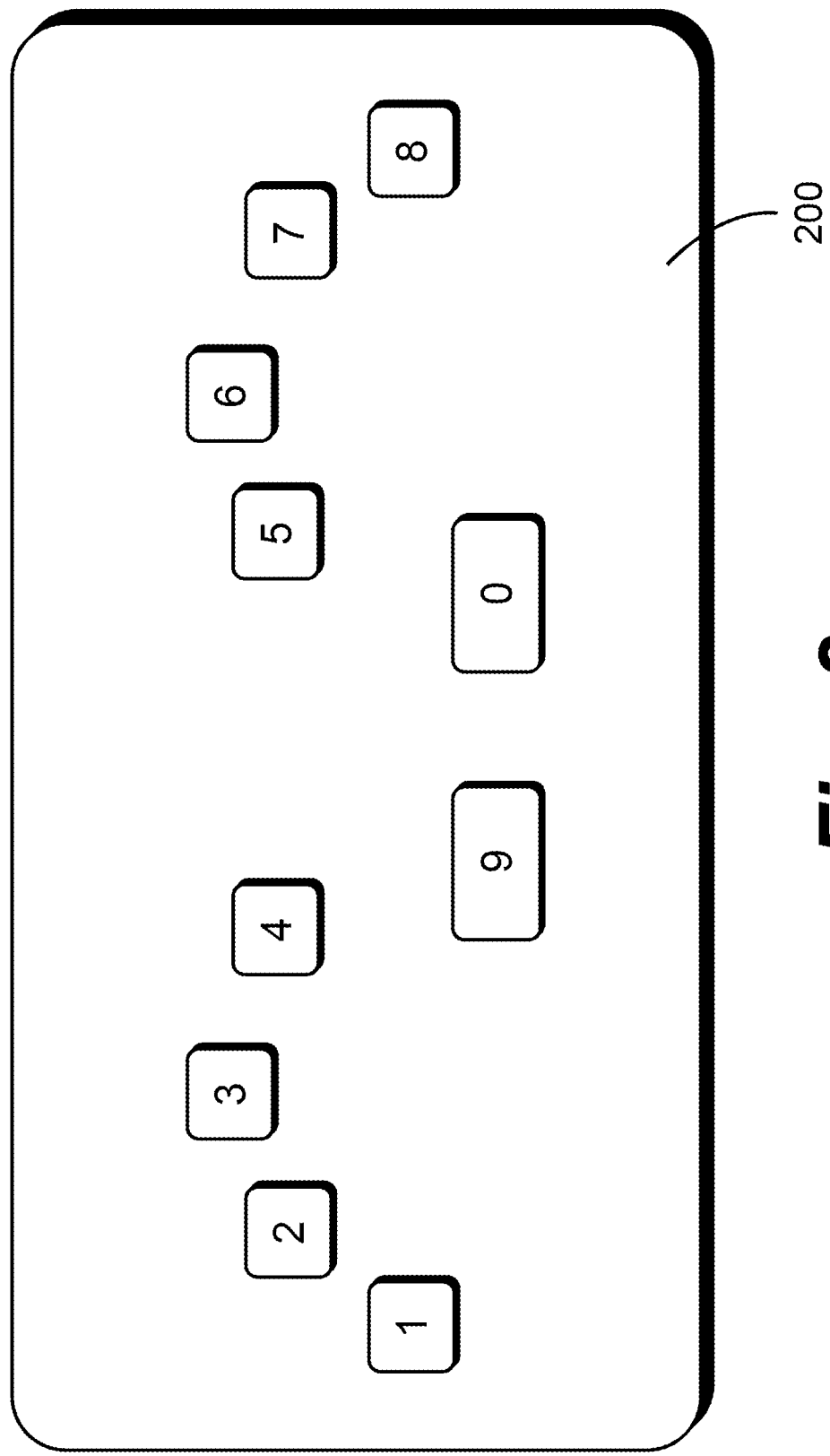
FIG. 2 shows an example of an input device having ten input keys.

FIG. 2 shows an example of an input device 200 having ten input keys—Input Key 0, Input Key 1 . . . Input Key 9. The Fingers 0-9 on the left hand 120 and the right hand 121 correspond to the ten Input Keys 0-9 respectively. For example, an input (e.g., an input action such as press-and-release) from Finger 1 corresponds to Input Key 1. In other words, a user can provide input via Input Key 1 by input action from Finger 1, via Input Key 2 by input action from Finger 2, etc.

Figure 3:
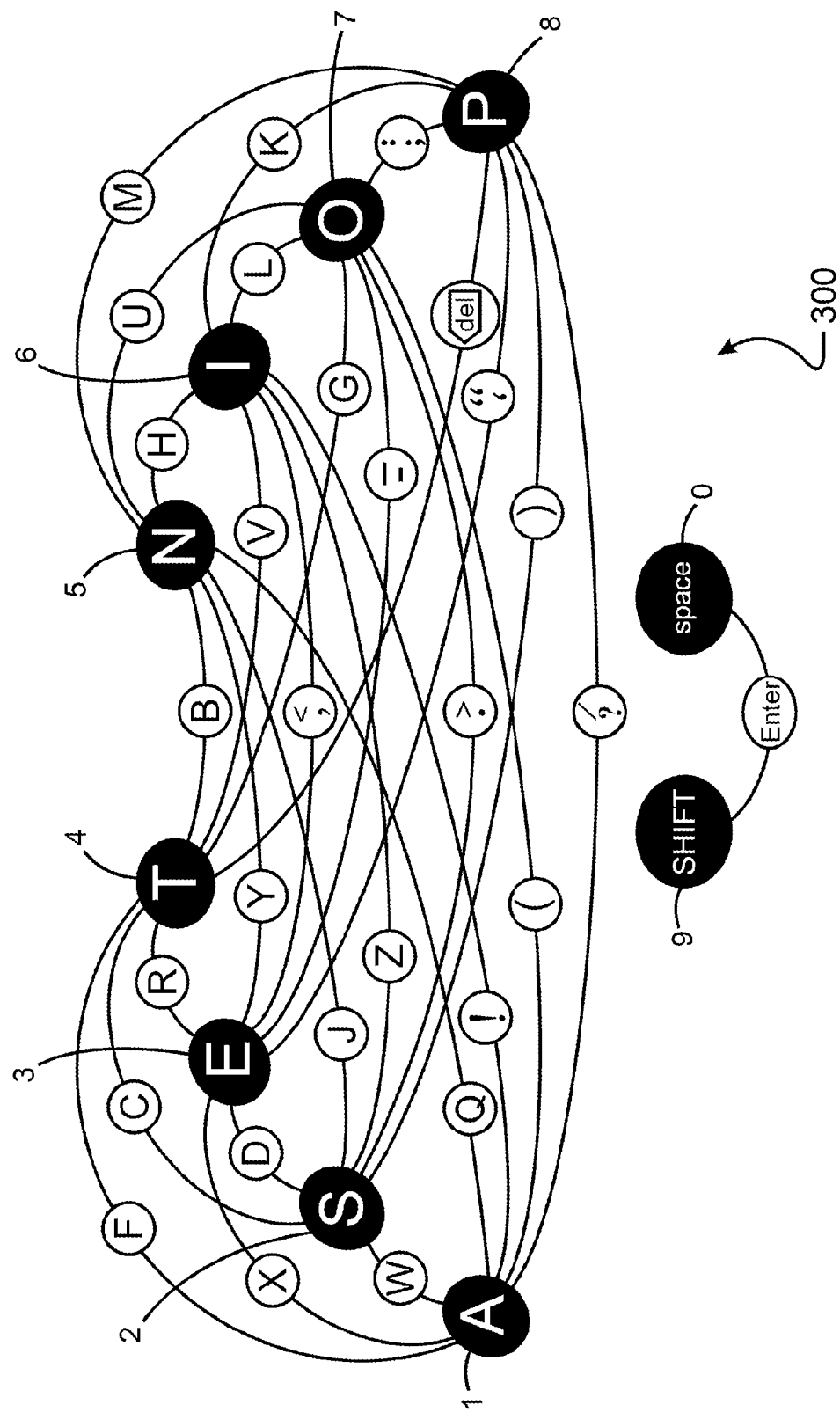
FIG. 3 shows a graphical depiction of at least a portion of an example of a map.

All of the letters, numbers, and punctuation used in normal written English can be produced using the ten Input Keys 0-9, such as those shown in FIG. 2 when in a primary mode. FIG. 3 shows an example of at least a portion of a home map 300 that, while in the primary mode, maps input received from one or more Fingers 0-9 through their respective corresponding Input Keys 0-9 to an output. The home map 300 has ten positions 0-9, one for each of the ten Fingers 0-9 and for each of the corresponding ten Input Keys 0-9.

The home map 300 shows eight primary letters, one at each of the positions 1-8. The eight primary letters are outputs that map to a signal action input from each of the Fingers 1-8 respectively. For example, a single action input from Finger 1 via Input Key 1 produces the letter "A". A single action input received by Input Key 2 produces the letter "S". A single action inputs received by Input Keys 1-8 map to the letters "A," "S," "E," "T," "N," "I," "O," and "P" respectively. In this example, the primary letters were predetermined based on a combination of their location on a QWERTY keyboard and their frequency of use in the English language. For example, the eight primary letters are mapped in FIG. 3 to the same finger that those letters correspond to on a QWERTY keyboard. For example, a single action from the Finger 1 produces the letter A on both the QWERTY keyboard and the input device 200; the letter S is typed on input device 200 and on a QWERTY keyboard using the Finger 2. Also, the eight primary letters were predetermined based on a commonality of use of the eight primary letters in the English language. For example, the letter that maps to Input Key 3 is the letter "E". The letter "E" is the most commonly used letter in the English language. Also, the letter "T", mapped to Input Key 4, is the second most commonly used letter in the English language. The primary letters mapped to Input Keys 1, 2, 3, 4, 5, 6, and 7 are all within the top seven most commonly used letters in the English language. The letter "P", mapped to Input Key 8, is the most commonly used letter typed with Finger 8 on the QWERTY keyboard.

Figure 4:
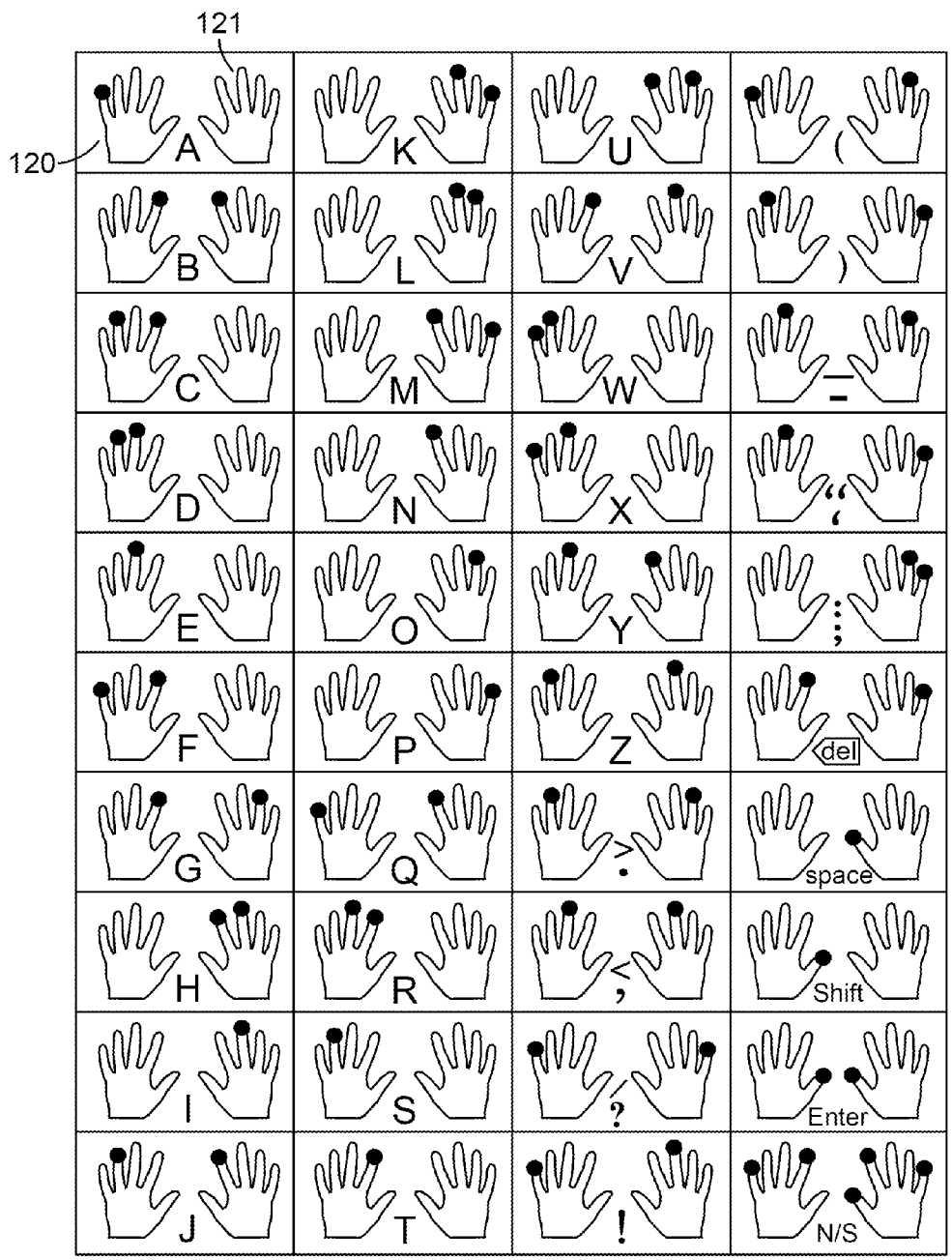
FIG. 4 shows a graphical depiction of examples of combinations of typing inputs and corresponding outputs.

The remaining 18 letters of the English alphabet, the secondary letters, map to chord inputs. Receiving a chord input includes receiving input action from two or more of the Fingers 0-9 via corresponding Input Keys 0-9 during a same time period. For example, a chord is received when an action input from Finger 1 and from Finger 2 are received by Input Key 1 and Input Key 2. This chord (chord 12) maps to the letter W as shown in FIG. 3 and FIG. 4. Some chords produce punctuation or other commands typically used during typing. For example, a period is produced by the chord 27 (i.e., concurrent action input with both Input Key 2 and Input Key 7). The backspace function is produced by the chord 48 (i.e., concurrent action input with both Input Key 4 and Input Key 8). In some examples, the order in which the input keys are pressed down when a chord is generated is not important. For example, if the user presses Input Key 1 followed by Input Key 3 and releases them, the chord 13 is generated and the letter X is produced. Similarly, if the user presses Input Key 3 followed by Input Key 1 and releases them, the chord 31 is generated and the letter X is again produced. In some examples, the chord formulations are interchangeable for two-key chords, but the sequence in which the input keys were pressed is tracked for use with some of the processing features discussed below.

Most of the chords, in the example shown, include an input key that corresponds to a finger that types the same letter, punctuation, or function on a QWERTY keyboard (according to traditional QWERTY typing technique). For example, the letter "V" is produced on a QWERTY keyboard using Finger 4 and is produced in this example with the chord 46 (i.e., Input Key 4 and Input Key 6 using Finger 4 and Finger 6). Some exceptions include the characters "Z", "X", and "C", which approximately half of keyboard users strike differently on a QWERTY keyboard (traditional QWERTY technique uses fingers 1, 2, and 3 to strike these keys respectively, while approximately half of keyboard users use fingers 2, 3, and 4 respectively). In some examples, the difficulty level of each chord is selected based on the frequency of use of the corresponding letter. For example, a chord can have a respective level of difficultly according to the fingers involved in the chord. A chord that involves a pinky finger, for example, can be ranked as more difficult. As a result chords that include a pinky finger are assigned to less frequently used letters like "x" and "k" and characters such as exclamation points and parentheses. Chords that include one of the index fingers can be ranked as a relatively easier chord (such as 24=C). Chords that include equivalent fingers on each hand are also relatively easier (such as 36=comma). Chords that include adjacent non-index fingers (23=D) are relatively more difficult. Chords that involve non-equivalent fingers on opposite hands are relatively more difficult (47=G). Chords that involve non-adjacent, non-index fingers on the same hand are relatively more difficult (13=X). Some pairs of chords are arranged for easy mnemonics whether by physical similarity ("X"/"K" (chord 13/68), "C"/"U" (chord 24/57), and "Y"/"V" (chord 35/46)), phonetic similarity ("J"/"G" (chord 25/47)), or other (F/M radio (chord 14/58), R/H factor (chord 34/56)).

The backspace function is produced by a chord, chord 48, that includes Input Key 8 that corresponds to a same finger (right pinky) that normally strikes this key on a traditional keyboard. The backspace key on a QWERTY keyboard is often used repeatedly to correct errors that are not noticed until two or more subsequent keystrokes have taken place. In order to simplify the process of reversing direction using the backspace function, the user can hold down one of the input keys in the chord with one hand (Input Key 4 with the left hand or Input Key 8 with the right hand) and press the other input key repeatedly to erase material without having to press both keys in the chord repeatedly, or hold both the keys together to generate repeated backspaces. This technique can also be applied to pressing pairs of letters such as "ff," "ll," or "mm," where one finger in the chord is held down and the other pressed a second time to indicate a double letter.

The space bar is the most commonly used key on a QWERTY keyboard and is produced in the present example using the same finger as in a QWERTY keyboard. For instance, the space function on a QWERTY keyboard is produced using Finger 0 (the right thumb) and is also produced in the example in FIG. 3 using the Finger 0. Also, when a user presses the space bar, he often steps on other inputs succeeding or preceding the space bar input. Interference with the typing of letters as a result of stepping on the space function is minimized in home map 300 because Input Key 0 is dedicated to the space function, with one exception—a chord for return/enter (Input Key 0 and Input Key 9). As a result, even if users step on other combinations with the space bar, the stepping does not produce unwanted chords. Also, input from Finger 0 can be programmed to output a leading space or a trailing space for the letter that was stepped on.

The shift function is produced by a single action stroke of Input Key 9 using the left thumb. The shift key—Input Key 9 —can be programmed to produce the same effect if the input produced by the Input Key 9 steps on or does not step on a subsequent input—i.e., a user holds the Input Key 9 while pressing a combination, or presses and releases the Input Key 9 and then presses a combination; the output is the same. For example, a single action input of Input Key 9 can act as a sticky key such that the next input is subject to the shift function (i.e., capitalized or in the case of pairs of punctuation characters, the second component of the pair). For example, to type a capital "T", a single input is provided via Input Key 9 (e.g., a press and release) and then a single action input of Input Key 4 (e.g., a press and release) is provided. A colon can be produced by single action input of Input Key 9 followed by the chord 78. In some examples, a letter can be capitalized by adding Input Key 9 to the input for the letter to form a chord including the Input Key 9. For example, to produce a capital letter "T", the chord 49 can be input. So as not to interfere with shifting Input Keys 1-8, the shift key is part of only one chord that produces a result other than the shift function. That other chord is the chord 90 which produces the return/enter function.

As described above, if the shift function key (Input Key 9) is pressed and released and then followed by another input key for a letter or punctuation character, the shift output will be generated for the other input key. In some examples, however, the space function (Input 0) is an exception to this rule; if the shift function key (e.g., Input Key 9) is pressed and released and the space bar is subsequently pressed, the output can be mapped to a space rather than the return key produced by the chord 90. If the shift function key (Input Key 9) is pressed independently two times in a row, the CAPS LOCK function is activated, and all subsequent output characters are capitalized. Pressing the shift key while in CAPS LOCK (i.e., for a third time) will unlock the caps function, returning the system to an original state.

Other function keys can also be produced using the "upper case" version of a two-key chord. For example, the "Ctrl" function can be produced by pressing the shift function key (Input Key 9) either prior to or in conjunction with the chord 16. The "Alt" function is produced by pressing the shift function key (Input Key 9) either prior to or in conjunction with the chord 17. Because these functions can be used in combination with other keys, such as Ctrl-C in Windows to copy selected material, these functions can also be sticky such that they remain activated until a subsequent key or chord is pressed.

The various combinations, whether single action inputs or chord inputs, shown in FIG. 3 are described in more detail in Table 1. Both forms of the input code for order-independent chords are shown.

TABLE 1

| Input Code | Output | Shift Output |
|---|---|---|
| 1 | a | A |
| 45/54 | b | B |
| 24/42 | c | C |
| 23/32 | d | D |
| 3 | e | E |
| 14/41 | f | F |
| 47/74 | g | G |
| 56/65 | h | H |
| 6 | i | I |
| 25/52 | j | J |
| 68/86 | k | K |
| 67/76 | l | L |
| 58/85 | m | M |
| 5 | n | N |
| 7 | o | O |
| 8 | p | P |
| 15/51 | q | Q |
| 34/43 | r | R |
| 2 | s | S |
| 4 | t | T |
| 57/75 | u | U |
| 46/64 | v | V |
| 12/21 | w | W |
| 13/31 | x | X |
| 35/53 | y | Y |
| 26/62 | z | Z |
| 36/63 | , | < |
| 27/72 | . | > |
| 18/81 | ? | / |
| 16/61 | ! | Ctrl |
| 27/72 | ( | Alt |
| 28/82 | ) | Esc |
| 37/73 | - | — |
| 38/83 | ' | " |
| 78/87 | ; | : |
| 48/84 | Backspace | Tab |
| 0 | space | space |
| 9 | Shift | CAPS |
| 90/09 | Enter | Enter |

The home map 300 in FIG. 3 and Table 1 show the input-to-output map for a primary mode. FIG. 4 shows another graphical depiction 400 of the left hand 120 and the right hand 121 and the combination of Fingers 0-9 for the combinations discussed in FIG. 3 and in Table 1. For each letter, the left hand 120 and the right hand 121 are shown with black dots over the fingers providing input for the letter, function, or punctuation at issue. The term "input code" in Table 1 refers to the numeric code produced by either the single action input or the chorded input. These input codes are mapped to letters, punctuation, and functions. The graphical depiction 400 is another way of showing at least a portion of map 300. The depiction of map 300 in FIGS. 3 and 4 is not an exhaustive depiction of all of the combinations of the input keys and outputs for those combinations in map 300 while in the primary mode. While in the primary mode, additional chords can be mapped to parts of words (e.g., digraphs, trigraphs, etc.) or to complete words, as discussed in more detail below. A map can be stored in a database format in a data storage device mapping various combinations of the Input Keys 0-9.

Figure 5:
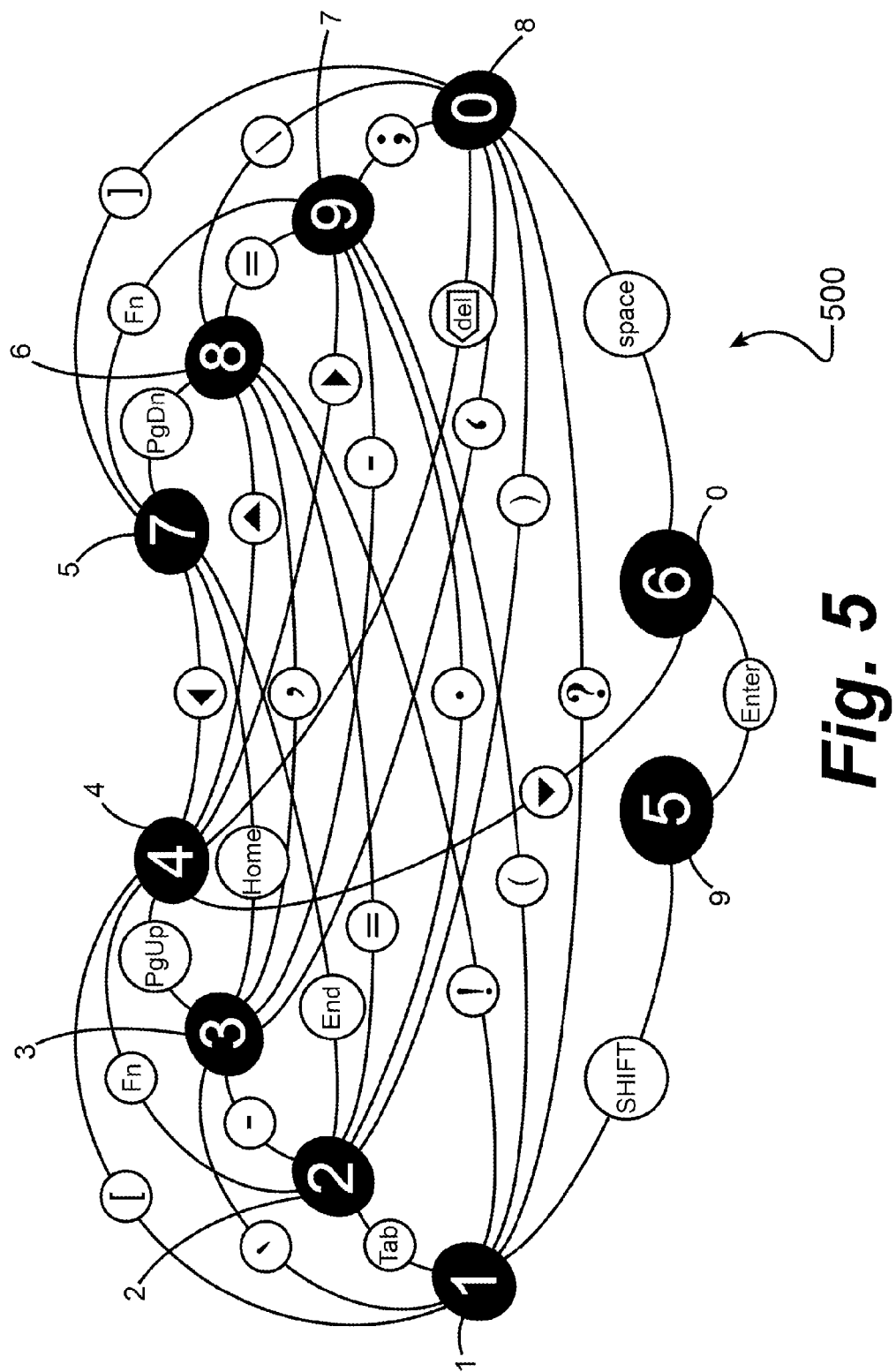
FIG. 5 a graphical depiction of at least a portion of an example of a map.

FIGS. 3 and 4 are graphical depictions of at least a portion of such a map. When a user types using the input device 200, the inputs provided using the Input Devices 0-9 will produce output according to the home map 300 while in the primary mode. If, however, the user wants to input numbers, for example, the user can switch from the home map 300 in the primary mode to numbers mode that includes a second map 500 (as shown in FIG. 5) that maps numbers and other symbols to Input Keys 0-9. The user can switch to the second map 500 in the numbers mode by inputting a switch command using a predetermined chord. As shown in FIG. 4, a switch command can be produced using the chord 14580. By pressing the same chord again, chord 14580, the user can switch back from the second map 500 to home map 300.

The second map 500 shows that a single action input of Input Keys 0-9 maps to the numbers 0-9 respectively. The shift function in the map 500 is produced by the chord 19. The space function is produced using the chord 08. The letters and symbols produced by various combinations if Input Keys 0-9 according to the map 500 are shown in the following Table 2:

TABLE 2

| Input Code 01458 | Output NUMBERS | Shift Output SYMBOLS |
|---|---|---|
| 1 | 1 | ! |
| 2 | 2 | @ |
| 3 | 3 | # |
| 4 | 4 | $ |
| 9 | 5 | % |
| 0 | 6 | ^ |
| 5 | 7 | & |
| 6 | 8 | * |
| 7 | 9 | ( |
| 8 | 0 | ) |
| 09/90 | Enter | Enter |
| 36/63 | , | < |
| 27/72 | . | > |
| 18/81 | ? | / |
| 45/54 | ← | ← |
| 46/64 | ↑ | ↑ |
| 47/74 | → | → |
| 04/40 | ↓ | ↓ |
| 12/21 | Tab | Tab |
| 78/87 | ; | : |
| 34/43 | PgUp | PgUp |
| 56/65 | PgDn | PgDn |
| 23/32 | - | _ |
| 67/76 | + | = |
| 14/41 | [ | { |
| 58/85 | ] | } |
| 25/52 | end | end |

TABLE 2-continued

| Input Code 01458 | Output NUMBERS | Shift Output SYMBOLS |
|---|---|---|
| 35/53 | home | home |
| 46/64 | + | = |
| 16/61 | ! | Ctrl |
| 17/71 | ( | Alt |
| 28/82 | ) | Esc |
| 37/73 | - | _ |
| 38/83 | ' | " |
| 13/31 | ` | ~ |
| 68/86 | \ | \| |
| 15/51 | (unused) | (unused) |
| 48/84 | Backspace | Tab |
| 24/42 | Fn | Fn |
| 57/75 | Fn | Fn |
| 08/80 | space | space |
| 19/91 | Shift | CAPS |

Figure 6:
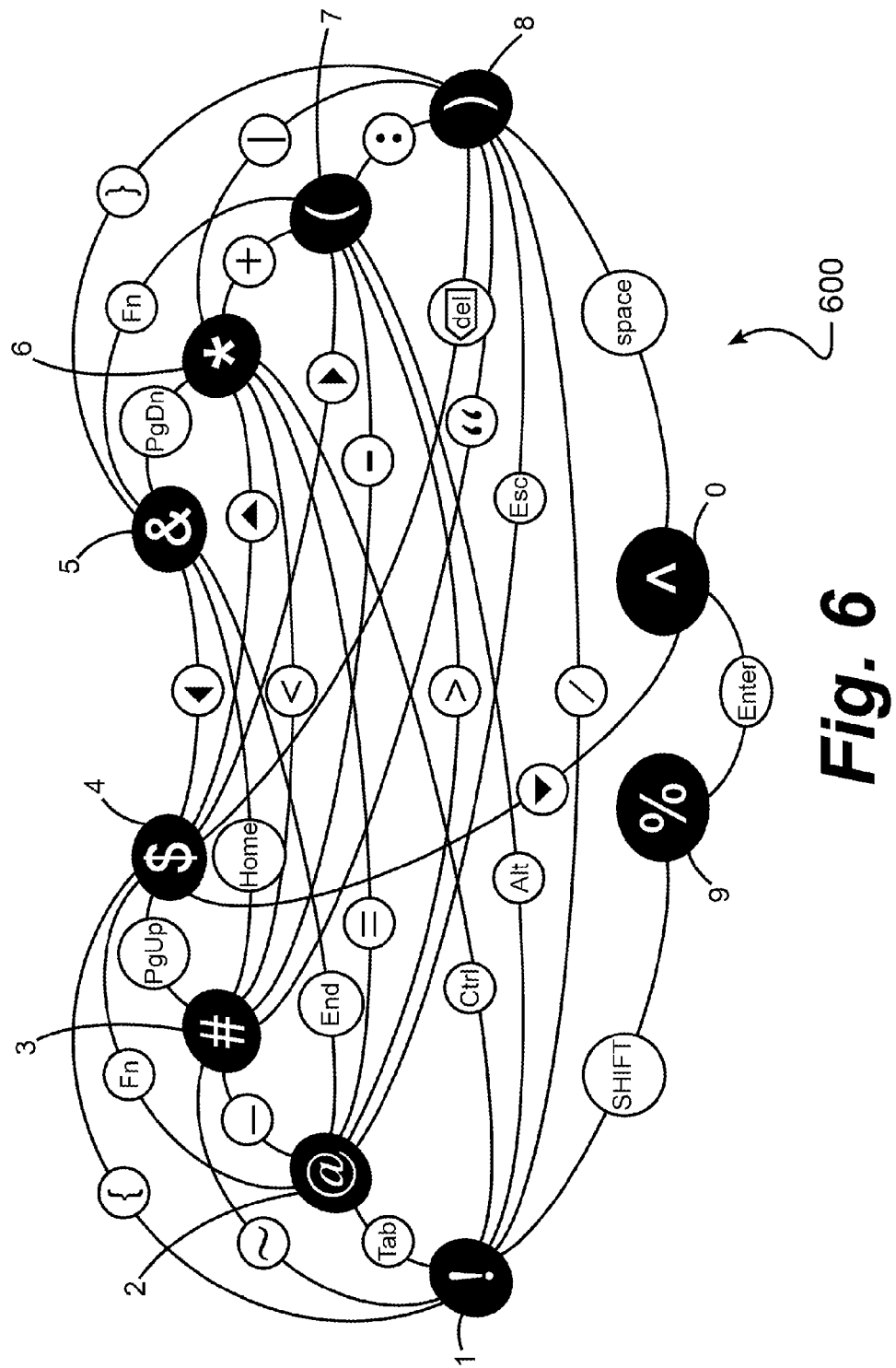
FIG. 6 a graphical depiction of at least a portion of an example of a map.

FIG. 6 shows an example of a third map 600 for use in a symbols mode to produce symbols using single action inputs and chord inputs on the ten-key input device 200. A user can switch from either the home map 300 or the second map 500 to the third map 600 by using a switch command produced by a predetermined chord. The predetermined chord to switch to the third map 600 can be, for example, the chord 145890. By pressing the same chord again 145890, the user can switch from the third map 600 to home map 300. While in the third map 600, the user can switch to the second map 500 by pressing the chord 14580 as discussed above. Table 3 shows the various combinations for characters and symbols and their corresponding output when in the third map 300 (Table 3/Map 600 is similar to Table 2/Map 500 with at least the exception that output and shift output are different). In some examples, all of the punctuation characters and function keys that can be obtained in primary mode (, < . > ? / ! ( ) - _ ' " ; : Ctrl Alt Del) are available in the numbers mode and the symbols mode, and their chord arrangement is unchanged between the home map 300, the second map 500, and the third map 600.

TABLE 3

| Input Code 014598 | Output SYMBOLS | Shift Output NUMBERS |
|---|---|---|
| 1 | ! | 1 |
| 2 | @ | 2 |
| 3 | # | 3 |
| 4 | $ | 4 |
| 9 | % | 5 |
| 0 | ^ | 6 |
| 5 | & | 7 |
| 6 | * | 8 |
| 7 | ( | 9 |
| 8 | ) | 0 |
| 09/90 | Enter | Enter |
| 36/63 | < | , |
| 27/72 | > | . |
| 18/81 | / | ? |
| 45/54 | ← | ← |
| 46/64 | ↑ | ↑ |
| 47/74 | → | → |
| 04/40 | ↓ | ↓ |
| 12/21 | Tab | Tab |
| 78/87 | : | ; |
| 34/43 | PgUp | PgUp |
| 56/65 | PgDn | PgDn |
| 23/32 | _ | - |
| 67/76 | = | + |
| 14/41 | { | [ |
| 58/85 | } | ] |
| 25/52 | end | end |

TABLE 3-continued

| Input Code 014598 | Output SYMBOLS | Shift Output NUMBERS |
|---|---|---|
| 35/53 | home | home |
| 46/64 | = | + |
| 16/61 | Ctrl | ! |
| 17/71 | Alt | ( |
| 28/82 | Esc | ) |
| 37/73 | — | - |
| 38/83 | " | ; |
| 13/31 | ~ | ` |
| 68/86 | \| | \ |
| 15/51 | (unused) | (unused) |
| 48/84 | Tab | Backspace |
| 24/42 | Fn | Fn |
| 57/75 | Fn | Fn |
| 08/80 | space | space |
| 19/91 | CAPS | Shift |

In the examples discussed above, single action inputs and two-key chord inputs produce single letters, functions, and punctuation. In some implementations, a chord can be mapped to multiple letters such as a digraph (i.e., combinations of two letters), trigraph, and/or a whole word. There are a total of two hundred fifty five possible combinations of Input Keys 1-8 (8 one-key, 28 two-key, 56 three-key, 70 four-key, 56 five-key, 28 six-key, 8 seven-key, and 1 eight-key) Although there are too many digraphs, trigraphs, and words in the English language that could be coded for using combinations of three, four, or more Input Keys 1-8, many of the most common words can be mapped to chords of three or more of the Input Keys 1-8. Stenographic combinations, such as digraphs, trigraphs, and word combinations, can be built from the input keys that make up the stenographic combination. In some examples, the stenographic combination can be built using input keys that make up a portion of the stenographic combination. This facilitates efficiency in learning such digraph, trigraph, or word combinations. New users of a ten-key input device can discover such combinations by building them once they have learned the basic alphabet. Also, stenographic combinations increase the speed with which a user can type by simplifying the number of independent input actions needed to input a digraph, trigraph, or word. Also, stenographic combinations often prevent output errors that can result from a first input stepping on a second input.

Figure 7:
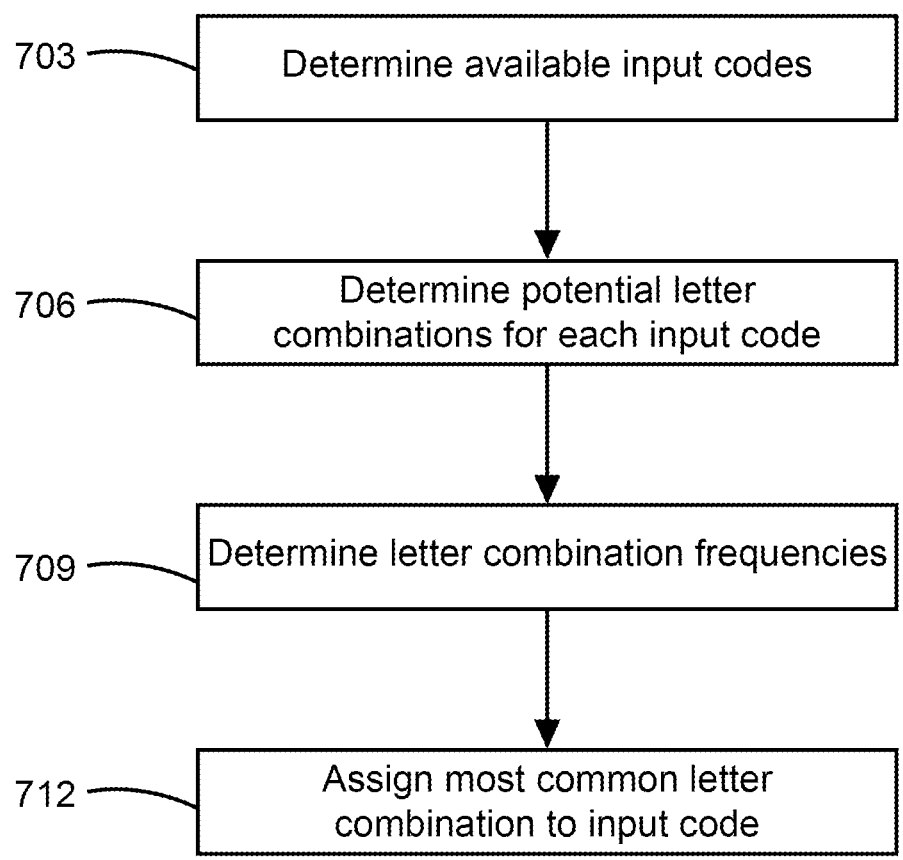
FIG. 7 shows an example process by which stenographic combinations are mapped to input codes.

FIG. 7 shows an example process 700 by which combinations of letters are mapped to stenographic combinations of input keys. An input code corresponding to three or more keys can be input as a chord. The chorded combination can be mapped to a word (e.g., if bracketed by spaces or bracketed by spaces and punctuation) and can be mapped to a part of a word (e.g., a digraph, a trigraph, etc. when preceded by a letter or followed by a letter). All of the potentially available input codes are determined at 703. For example, each possible combination of each group of keys that may be pressed simultaneously as a stenographic combination—from a minimum of three keys (e.g. 123, 124, 125, etc.) up to a maximum of seven keys (e.g. 1234567, 1234568, etc.) can be considered.

At 706, all of the potential letter combinations for a given input code are determined by scanning a dictionary to determine all of the potential letter combinations for each input code that occur within the English language. The potential output for each stenographic combination of input keys includes letter combinations whose input code as typed discretely contain all of the input keys in the input key combination and no additional keys. The "discrete" input codes are those which would be entered if the user entered each letter one at a time as single letters or two-key chords. As an example, Table 4 shows all of the potential letter combinations that correspond to the input code 127 that are found within words in the dictionary. For example, the letter combination "aso" is found within the words "gasoline," "mason," "parasol," and "reason" as well as many other words. Similarly, the letter combination "woo" is also found a number of times within the dictionary, including as part of the words "swoon," "swoop," "wood," and "wool" (among others), and also as an independent word, "woo."

TABLE 4

| Potential Letter Combination | Discrete Input Code |
|---|---|
| aos | 1-7-2 |
| aso | 1-2-7 |
| asso | 1-2-2-7 |
| awo | 1-12-7 |
| oas | 7-1-2 |
| osa | 7-2-1 |
| ossa | 7-2-2-1 |
| ow | 7-12 |
| owa | 7-12-1 |
| ows | 7-12-2 |
| soa | 2-7-1 |
| sow | 2-7-21 |
| swo | 2-12-7 |
| wo | 12-7 |
| woo | 12-7-7 |
| wow | 12-7-12 |

At 709, the number of occurrences of each letter combination is counted in a large text sample. For example, the Brown Corpus can be used as a text sample to determine letter combination frequency. The Brown Corpus consists of about one million words of American English that have been compiled from a wide variety of sources. The text sample is scanned to determine the number of times each combination of letters for a given input code occurs. The following table shows the number of times that each of the potential letter combinations in the above example (input code 127) is found in the text sample:

TABLE 5

| Potential Letter Combination | Number of Instances in Text Sample |
|---|---|
| aos | 82 |
| aso | 718 |
| asso | 294 |
| awo | 13 |
| oas | 145 |
| osa | 155 |
| ossa | 14 |
| ow | 13408 |
| owa | 607 |
| ows | 612 |
| soa | 64 |
| sow | 13 |
| swo | 76 |
| wo | 9364 |
| woo | 362 |
| wow | 1 |

At 712, the most common letter combination is assigned to the given input code. In the above example, for the input code 127, the letter combination "ow" is the most frequent letter combination, and therefore is assigned to the input code. Therefore, when a user presses all three keys (1, 2, and 7) together, the output will be the letter combination "ow."

In some examples, the output mapped to a chord does not depend on the order in which the input keys are pressed in the chord so long as they are all simultaneously pressed before releasing any of the input keys in the chord. For example, the chord 456 can be mapped to the digraph letter combination "th" because Input Key 4 maps to the letter "T" and the chord 56 maps to the letter "H". By striking all three input keys simultaneously to form a three-key chord, the digraph "th" is output. Any order of entry of the Input Keys 4-5-6 can be mapped to produce the output "th" as long as the pressing of all three input keys overlaps. Mapping for digraph combinations facilitates typing more quickly as well as decreasing the likelihood of errors occurring while the user is typing quickly.

In some examples, different outputs (e.g., different digraphs) can be produced depending on the order of input of the input keys of a chord. For example, the digraph "a1" can be produced by the chord 167 or chord 176 where Input Key 1 is pressed before Input Keys 6 and 7. On the other hand, the digraph "1a" can be produced by the chord 671 or chord 761 where the either of the Input Keys 6 or 7 are pressed before the remainder of the keys in the combination. Whether an input code in the form of a chord maps to a single output such as a digraph, trigraph, or word or to multiple outputs can depend on the frequency of digraphs, trigraphs, and/or words that could possibly map the input code. For example, if two very commonly used digraphs could map to a chord, each could be mapped to the chord with the first key that is input dictating which of the two possible outputs is used. In another example, two digraphs could be mapped to the same chord but because the difference in frequency of use in a language of one of the digraphs exceeds the frequency of use of the other digraph by a threshold amount, only the more frequent of the two outputs is mapped to the chord.

It is also possible to enter entire words using stenographic combinations. If the digraph input is bracketed by a leading and a trailing space, or a leading space and a trailing punctuation character, the word output is generated. For example, if the user enters the input code 0 (the space character), followed by the input code 347, the displayed output is "ro". If the user follows this by entering the input code 0 (the space character), the computer will change the digraph output to the word output, and change the displayed output to "or". Similarly, if the user "steps on" the stenographic combination with the 0 key (i.e. entering the input code 3470), the computer will produce the word output. For input code combinations where there is no digraph output, the word will appear and does not require a trailing space or punctuation character.

In some examples, chords of four or more keys are mostly mapped to entire words, prefixes, and suffixes. For example, the word "that" consists of the letter "t" which is mapped to a single action input from Input Key 4, "h" which is mapped to the chord of Input Keys 5 and 6, and "a" which is mapped to a single-action input from Input Key 1, and another "t." The word "that" can be mapped to all of these individual input keys as a chord; to build the word as a combination, the user simply presses all four of these keys together (chord 1456) and releases.

As with the digraph combinations, in some examples different word outputs can be produced depending on the order of the input of the input keys of a chord. For example, the word "who" can be produced by the chord 12567 (or any similar combination of these five keys where the first key pressed is the 1 or 2 key). On the other hand, the word "how" can be produced by the chord 56712 (or a similar combination of these five keys where the first key pressed is the 5, 6, or 7 key).

Some chords can have possible combinations that are not frequently used, such as the input code 178 which results in the possible digraph combinations of "o?", "(p", and "a:". Similarly, for the chord 1678, the most common word that corresponds to this input code is "lap", which only appears a total of 19 times in the text sample. Chords having infrequently used digraph or word combinations that do not meet the usage criteria can produce an error output. These unused combinations can be made available for a user to customize for specific outputs, if desired.

In some examples, a three-key chord can map to three useful combinations such as the chord 457 which maps to "but", "not", and "out". In such a case, the first input key in the chord can determine the output. For example for the chord 457, if Input Key 4 is the first input key struck, the chord is mapped to 'but'. If Input Key 5 (which corresponds to the 'n' character when struck alone) is the first key struck in the chord, the chord is mapped to "not". If the Input Key 7 key (which corresponds to the "o" character when struck alone) is the first key struck, the chord is mapped to "out".

In some examples, frequently used words that may have particularly difficult combinations can be mapped to an easier chord that otherwise has no other output, or supersede the original combination from the combination generation process, if desired. For example, the words "for" and "from" are frequently used words that can be mapped to a relatively easy chord that is not built entirely from the individual letters of those words. Such a chord would need to be memorized. For example, a combination for both these words can be based on the chord 147 for the word "of" to facilitate ease of memorization. For example, the word "for" can be mapped to the chord 1467. The word "from" can be mapped to the chord 14567.

Figure 8A:
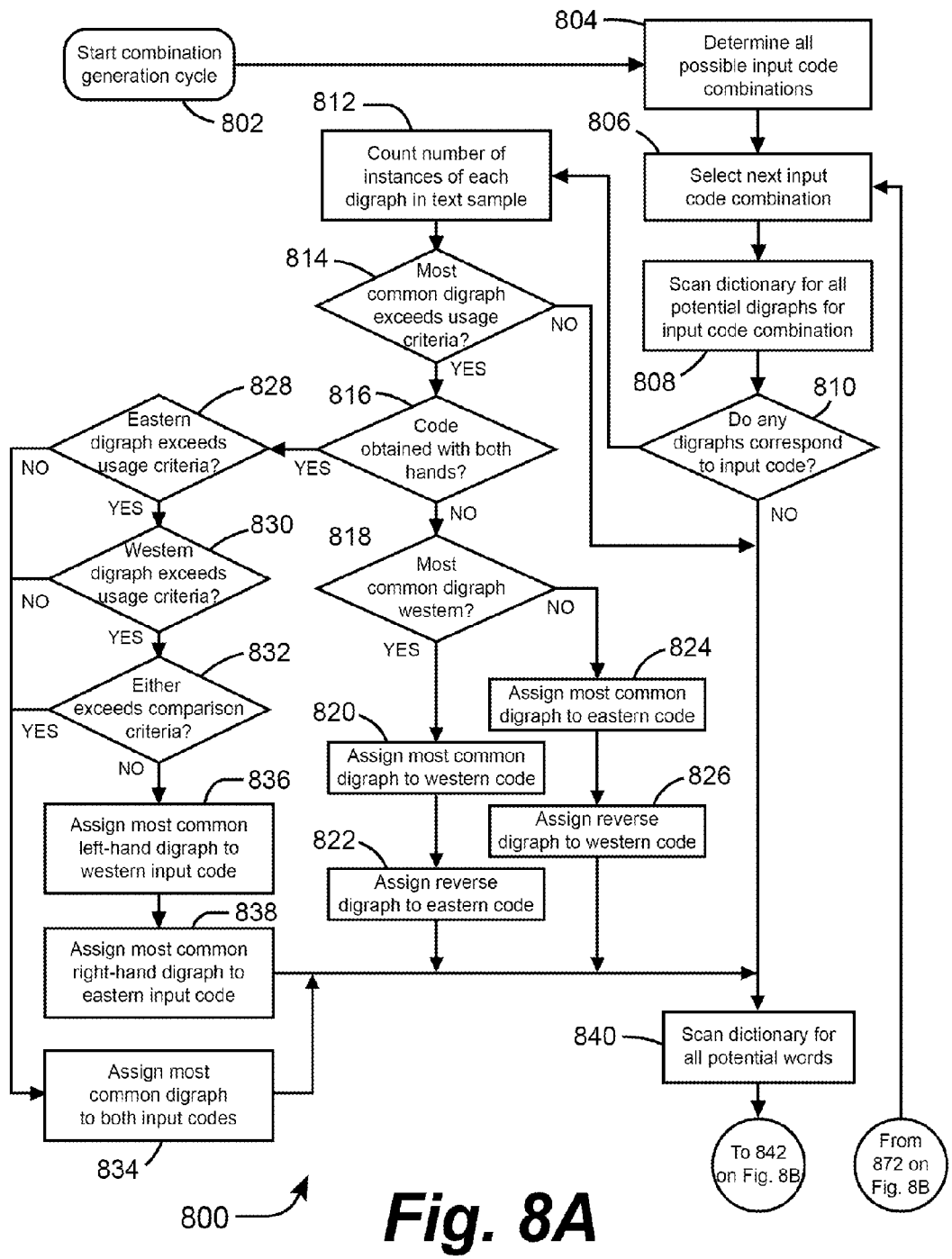
Figure 8B:
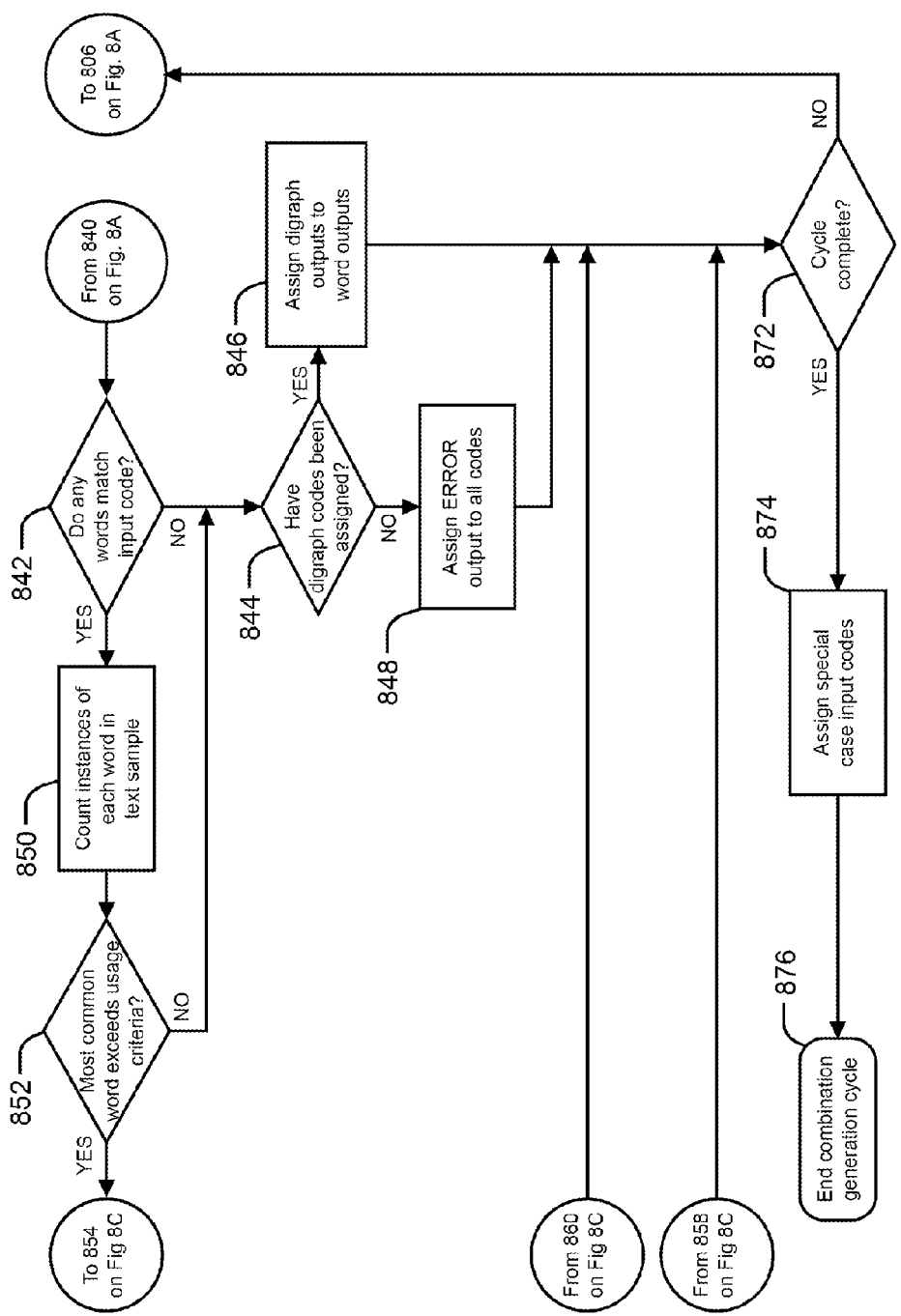

FIGS. 8A, 8B and 8C show an example process 800 for determining a map of stenographic combinations. The map can make a distinction between which hand (left-hand or right-hand) is used to begin the combination (i.e. which input key is pressed down first) as well as make a distinction between letter combinations (digraphs, trigraphs, etc.) and entire words. As with the process described in FIG. 7, this process determines the potential outputs for each possible combination of each group of keys that may be pressed simultaneously as a stenographic combination. A dictionary database and a text sample (e.g., the Brown Corpus) are used to determine which combinations of letters correspond to each specific input code.

The cycle begins at 802, and at 804 determines all of the potential combinations that are available from a minimum of three keys (e.g. 123, 124, 125, etc.) and up to the total number of keys on a typing device being mapped. In the example discussed below in connection with Table 11, combinations of up to a maximum of seven keys (e.g. 1234567, 1234568, etc.) are determined. At 806, the process proceeds sequentially through the list of input codes by selecting the next input code combination. At 808 the computer scans a dictionary for all potential digraphs whose discrete input codes contain all of the input codes in the input code combination, and only these input codes. For example, at 808 the following potential digraphs would be identified for the input code 236: "di", "dz", "ez", "id", and "ze". These are all combinations of letters that are found in the dictionary database, either as entire words, or as fragments that are part of one or more words. Additional digraphs that could exist for this input code combination are "zd", "s," (the S character followed by a comma), ",s", "d,", ",d" "z," and ",z", but in the present example these are not identified as potential digraphs because these digraphs are not found in any word in the dictionary (in the case of digraphs containing a comma, the dictionary database contains no punctuation characters aside from apostrophes and hyphens). The following table shows the discrete input codes associated with each digraph in this example.

TABLE 6

| Potential Digraph | Discrete Input Code |
|---|---|
| di | 23-6 |
| dz | 23-26 |
| ez | 3-26 |
| id | 6-23 |
| ze | 26-3 |

At 810, if the process has not identified any potential digraphs for the input code combination, no digraph is assigned to the input code and it skips the remainder of the digraph generation cycle and enters the word generation cycle at 840. In all cases where the input code includes five or more input keys, there will be no potential digraphs (because all individual letters are coded for with either one or two keys, all combinations of five or more keys will produce letter combinations of three or more characters) and the process will proceed forward to the word generation cycle at 840.

If one or more potential digraphs have been identified, the process counts the number of instances of each digraph in the text sample at 812. Once the text sample has been scanned for each potential digraph they are ranked according to frequency. The table below shows the results for the above example of input code 236. Note that although "dz" was identified as a potential digraph because it was found to exist as a digraph within uncommon words such as "gadzooks", "kudzu," and "madzoon" it did not occur any times within an example text sample.

TABLE 7

| Potential Digraph | Discrete Input Code | Number of Instances in Text Sample |
|---|---|---|
| di | 23-6 | 16727 |
| id | 6-23 | 12697 |
| ze | 26-3 | 2021 |
| ez | 3-26 | 194 |
| dz | 23-26 | 0 |

At 814, it is determined whether the most common digraph exceeds the "usage criteria." The usage criteria refers to values that are used to filter the potential output and determine whether the digraph (or word) occurs often enough to be worth assigning to an input code. The usage criteria can be set by a user of a system determining a stenographic combination map. Typically usage criteria are based on the size of the text sample and are either a specifically defined number of occurrences or a percentage of the total number of words in the text sample. For example, the digraph usage criteria for three-key digraph input code can be 100; if the digraph does not occur more than 100 times in, for example, the Brown Corpus text sample, it is considered to be too obscure to be useful as a stenographic combination. If the most common potential digraph does not exceed the digraph usage criteria, no digraph is assigned to the input code and the process skips ahead to the word generation cycle at 840. In the above example for the input code 236, the most common potential digraph ("di") easily exceeds the digraph usage criteria of 100.

In 816, the computer considers whether the input code is obtained with either one or both hands. Outputs for both digraphs and words are divided into two classifications: "western" and "eastern". For combinations that include input keys from both hands, digraphs and words whose first letter is struck by the left hand on a normal QWERTY keyboard (i.e. digraphs or words beginning with Q, W, E, R, T, A, S, D, F, G, Z, X, C V, and B) are considered to be "western" combinations. Digraphs and words whose first letter is struck by the right hand on a normal keyboard (i.e. combinations beginning with Y, U, I, O, P, H, J, K, L, N, and M) are considered to be "eastern" combinations. When entering a two-hand input code, if the user enters the code beginning with any of the input keys struck with the left hand (input keys 1-4) the output will be the "western" digraph or word, and if the user enters the code beginning with any of the input keys struck with the right hand (input keys 5-8) the output will be the "eastern" digraph or word. In the relatively less common case that the input code is obtained with the fingers of only one hand (input codes 123, 124, 134, 234, 567, 568, 578, 678, 1234, and 5678), the digraph is classified as "western" if the lowest digit in the discrete input code occurs in the first of the discrete input code pairs. The digraph is classified as "eastern" if the lowest digit in the discrete input code occurs in the second of the discrete input code pairs. For example, the digraph "pr" associated with the two-hand discrete input code 8-34 is classified as an "eastern" digraph because the P is normally struck with the right hand on a keyboard. In another example, the digraph "ad" associated with the one-hand discrete input code 1-23 is classified as a "western" digraph because the lowest digit in the input code (1) occurs in the first of the two input codes (1 and 23) associated with the letters in the digraph.

If the input code is obtained with only one hand, it is determined at 818 whether the most common digraph is classified as western. If so, the most common digraph is assigned to the western digraph input code at 820, and the digraph will become the output if the user enters the input code beginning with any of the digits in the input code for the first letter of the digraph. The reverse of the digraph will be assigned at 822 as the eastern digraph input code, and will become the output if the user enters the input code beginning with any of the remaining digits in the input code. In the above example for the digraph "ad" associated with the input code 123 (and the discrete input code 1- 23 ), the digraph is classified as western at 818, the digraph "ad" is assigned to the western digraph input code at 820, and the reverse digraph "da" is assigned to the eastern digraph input code at 822. Thus, when the user presses the input code 123, if they press the 1 key first, followed by the 2 and 3 (or vice versa), the output generated will be the digraph "ad". If the user begins the input code 123 by pressing the 2 or 3 key first, the output generated will be the digraph "da".

If the digraph is determined not to be a western digraph at 818, the process is similar but reversed; the most common digraph will be assigned to the eastern digraph input code at 824 and the reverse of the most common digraph will be assigned to the western digraph input code at 826.

If the digraph is entered with fingers on both hands, the process determines at 828 whether the most common eastern digraph exceeds the digraph usage criteria. If it does not (or if no viable eastern digraph exists), the most common digraph (which will be a western digraph) is assigned to both the eastern and western input codes at 834. If the most common eastern digraph does exceed the criteria, so, the process determines whether the most common western digraph also exceeds the digraph usage criteria at 830. If it does not (or if no viable western digraph exists), the most common digraph (which will be an eastern digraph) is assigned to both the eastern and western input codes at 834. In both of these cases, the output will be the same regardless of which hand or finger is used to begin the input code.

If there are digraphs of both the western (left-hand) and eastern (right-hand) variety that exceed the digraph usage criteria, the process determines at 832 whether the eastern or western digraph exceeds the "comparison criteria" in relation to the other. The comparison criteria can be set by a user. The comparison criteria is a factor by which the potential digraph (and word) combinations will supersede the most common combinations for the opposite hand. In an example, for three-key combinations, a digraph comparison criteria of 10 is used; if a digraph occurs ten times more frequently than the most common digraph for the opposite hand, it will supersede the lesser combination and both methods of entering the combination (western or eastern) will produce an output that corresponds to the most common digraph.

If the most common digraph exceeds the digraph comparison criteria at 832, the most common digraph is assigned to both the western and eastern input codes at 834. If the most common digraph does not exceed the digraph comparison criteria, the most common digraph whose first letter is a left-hand key is assigned as the western digraph input code at 836 and the most common digraph whose first letter is a right-hand key is assigned as the eastern digraph input code at 838. In the above example for the input code 236, the number of instances of the most common western digraph "di" occurs approximately 1.25 times more often than the most common eastern digraph "id". This does not exceed the digraph comparison criteria, so the digraph "di" is assigned as the western digraph input code and will appear if the user begins the input code with either of the left-hand keys (i.e. input key 2 or 3) and the digraph "id" is assigned as the eastern digraph input code and will appear if the user begins the input code with the right-hand key (input key 6).

Regardless of whether or not the digraph codes have been assigned, the digraph generation cycle converges at 840 to determine whether any complete words exist for the input code. Similar to the process for digraphs, the dictionary will be scanned for all words that contain letters whose discrete input codes include all of the digits in the input code. In the example for the input code of 236 above, there are a total of sixteen words whose discrete input codes correspond properly with the input code. The following table shows the discrete input codes for each of these words.

TABLE 8

| Potential Word | Discrete Input Code |
|---|---|
| dei | 23-3-6 |
| di | 23-6 |
| did | 23-6-23 |
| die | 23-6-3 |
| died | 23-6-3-23 |
| dies | 23-6-3-2 |
| id | 6-23 |
| seize | 2-3-6-26-3 |
| seized | 2-3-6-26-3-23 |
| seizes | 2-3-6-26-3-2 |
| side | 2-6-23-3 |
| sided | 2-6-23-3-23 |

TABLE 8-continued

| Potential Word | Discrete Input Code |
|---|---|
| sides | 2-6-23-3-2 |
| size | 2-6-26-3 |
| sized | 2-6-26-3-23 |
| sizes | 2-6-26-3-2 |

At 842, it is determined whether any words exist for the input code combination. If there are no complete words found in the dictionary that correspond to the input code combination, the process moves to 844 and determines whether digraph input codes have been assigned. If digraph input codes had been assigned in the earlier process, then the eastern and western digraph codes are assigned to the eastern and western word codes, respectively, at 846. Thus, if the user presses a space character, followed by the input code, followed by another space or other punctuation character, the output will be the assigned digraph (western or eastern, as appropriate). If the digraph input codes have not been assigned, then an ERROR output is assigned to the input code at 848, and pressing this input code will result in an output of a special character that indicates to the user that no stenographic combination has been assigned to this input code.

If the input code combination corresponds to one or more complete words that are found in the dictionary, the number of instances of these words are counted in 850. If the most common word does not exceed the word usage criteria at 852 (the word usage criteria can be the same or different than the digraph usage criteria discussed above at 814), the process moves to 844 as above (with either digraphs becoming the designated output or an ERROR code).

If the most common word exceeds the word usage criteria, the process determines at 854 whether the input code is obtained using one or both hands. If the input code is obtain with only one hand, the most common word is assigned to both the eastern and western input codes at 856. In this case, the output word will result regardless of which finger is used to begin the input code combination.

At 858, it is determined whether digraph input codes have been assigned. If no digraph input codes have been assigned, the word input codes are assigned to the digraph input codes instead at 860. In this case, the output eastern and western input codes will be the same—the most common word—regardless of which order the keys are pressed, and regardless of whether the input code is bracketed by a space character and a space or punctuation character (delimiter characters). If digraph codes have been assigned, then these will remain as originally assigned and the word output will only appear if the input code is bracketed. For example, for the one-hand input code 123, the most common word output is "we," which occurs 2043 times in the text sample as an independent word. However, since "ad" has been assigned to the western digraph input code and "da" has been assigned to the eastern digraph input code, the word "we" will only appear if the input code is preceded by a space and followed by a space or punctuation character.

If the input code is obtained with both hands it is determined at 862 whether the most common eastern word exceeds the word usage criteria. If it does not, the most common word (a western word) will be assigned to both the eastern and western input codes at 856 and the process moves to 858 to determine whether digraph input codes have been assigned (as described above).

At 864 it is determined whether the most common western word exceeds the word usage criteria. If it does not, the most common word (an eastern word) will be assigned to both the eastern and western input codes at 856, and the process once again converges at 858. For example, for the input code 236, the most common of the potential western words is "did", which occurs 1001 times in the text sample and exceeds the usage criteria. The only eastern word associated with the input code 236 is "id," which is recognized in the dictionary but does not actually occur as an independent word in the text sample. Since the digraphs "di" and "id" have already been assigned as the western and eastern digraph input codes, respectively, the word "did" is assigned to the western and eastern word input codes for 236 and will only appear as an output if the input code is bracketed by delimiter characters.

If both the most common eastern and the most common western words exceed the usage criteria, it is determined at 866 whether the eastern or western word exceeds the word comparison criteria (the word comparison criteria can be the same or different as the digraph criteria discussed above at 832) in relation to the other, similar to the process for digraphs at 832. As with digraphs, if the most common word exceeds the word comparison criteria, the most common word is assigned to both the western and eastern word input codes at 856.

If the most common word does not exceed the comparison criteria, the most common word whose first letter is a left-hand key is assigned as the western word input code at 868 and the most common word whose first letter is a right-hand key is assigned as the eastern word input code at 870.

An example of this process is for the four-key input code 1236. The input codes can possibly produce any of the following letters: A (input code 1), S (input code 2), E (input code 3), I (input code 6), W (input code 21), X (input code 31), D (input code 32), and Z (input code 26). The input codes 16 and 36 code for the exclamation point and comma, respectively, but these characters not used in the combination generation process (only the apostrophe and hyphen are included as a potential non-letter character). The potential output for this stenographic combination can only consist of words whose input code contains all of these codes and no additional codes. The following table shows the potential words that are considered for the input code 1236:

TABLE 9

| Potential Word | Discrete Input Code | Eastern/Western | Number of Instances in Text Sample |
|---|---|---|---|
| aid | 1-6-23 | Western | 138 |
| aide | 1-6-23-3 | Western | 10 |
| aided | 1-6-23-2-23 | Western | 12 |
| aids | 1-6-23-2 | Western | 24 |
| aside | 1-2-6-23-3 | Western | 60 |
| axis | 1-13-6-2 | Western | 40 |
| dais | 13-1-6-2 | Western | 2 |
| dazed | 13-1-26-3-3 | Western | 3 |
| dia | 23-6-1 | Western | 4 |
| idea | 6-23-3-1 | Eastern | 195 |
| ideas | 6-23-3-1-2 | Eastern | 139 |
| said | 2-1-6-23 | Western | 1949 |
| six | 2-6-13 | Western | 230 |
| wei | 12-3-6 | Western | 2 |
| wide | 12-6-32-3 | Western | 167 |
| wise | 12-6-2-3 | Western | 42 |

The most common western word is "said", which occurs 1949 times. The most common eastern word is "idea" which occurs 195 times. In an example, the comparison criteria for 4-key word combinations is 8. Since "said" occurs more than 8 times as often as "idea", it exceeds the word comparison criteria and the western word supersedes the eastern word. Furthermore, since there is no digraph for the input code 1236, the word "said" will appear any time the user presses and releases this group of input keys—regardless of which order they are pressed, and regardless of whether this input code is bracketed by a space and space/punctuation pair.

At 872 it is determined whether the combination generation cycle is complete; whether digraph, word, or ERROR codes have been assigned to all available combinations. If not, the cycle returns to 806 and proceeds for the next input code combination.

If the cycle is complete, special case input codes are assigned at 874, and the combination generation cycle ends at 876. For example, in an example the digraph output for the western input code 4567 (originally "gh") is replaced with the letter combination "tion" and the output for the eastern input code (also originally "gh") is replaced with the letter combination "ing"—both useful suffixes. There are nine special cases summarized in the tables below.

The following tables summarize the all of the available combinations for the specific usage and comparison criteria in an embodiment.

TABLE 10

| Number of Keys in Input Code | Usage Criteria | | Comparison Criteria | |
|---|---|---|---|---|
| | Digraph | Word | Digraph | Word |
| 3 | 100 | 100 | 10 | 10 |
| 4 | 1000 | 100 | 8 | 8 |
| 5 | N/A[1] | 100 | N/A[1] | 3.5 |
| 6 | N/A[1] | 100 | N/A[1] | 2 |
| 7 | N/A[1] | 100 | N/A[1] | 2 |

Notes:
[1]Since the maximum number of keys used to form a single letter is two, digraphs cannot be formed by five or more keys.

TABLE 11

| Input Code | Digraph | | Word | |
|---|---|---|---|---|
| | Eastern | Western | Eastern | Western |
| 123 | ad | da | we | we |
| 124 | ac | ca | fact | fact |
| 125 | wn | ja | — | — |
| 126 | wi | wi | — | — |
| 127 | wo | ow | — | — |
| 128 | — | — | — | — |
| 134 | ar | ra | are | are |
| 135 | ay | ay | any | any |
| 136 | xi | ix | — | — |
| 137 | xo | ox | — | — |
| 138 | xp | xp | — | — |
| 145 | ab | (nf) ba[1] | — | — |
| 146 | fi | if | if | if |
| 147 | fo | of | of | of |
| 148 | — | — | — | — |
| 156 | ha | ha | — | — |
| 157 | qu | ua | — | — |
| 158 | am | ma | am | man |
| 167 | al | la | all | all |
| 168 | ak | ka | — | — |
| 178 | — | — | — | — |
| 234 | (ce) est[1] | (ce) est[1] | set | set |

TABLE 11-continued

| Input Code | Digraph Eastern | Digraph Western | Word Eastern | Word Western |
|---|---|---|---|---|
| 235 | nd | nd | end | need |
| 236 | di | id | did | did |
| 237 | do | od | do | do |
| 238 | 's | 's | deep | deep |
| 245 | nc | nc | — | — |
| 246 | ci | ic | its | its |
| 247 | co | oc | cost | cost |
| 248 | — | — | — | — |
| 256 | sh | sh | his | his |
| 257 | su | us | soon | us |
| 258 | sm | ms | — | — |
| 267 | sl | ls | — | — |
| 268 | sk | ks | — | — |
| 278 | — | — | — | — |
| 345 | be | be | be | be |
| 346 | ve | ir | ever | ever |
| 347 | ro | or | get | or |
| 348 | rp | pr | per | per |
| 356 | he | he | he | he |
| 357 | eu | yo | one | one |
| 358 | em | me | my | my |
| 367 | el | le | — | — |
| 368 | ke | ke | keep | keep |
| 378 | o' | o' | — | — |
| 456 | th | th | bit | hit |
| 457 | (tu) but[2] | (ng) not/out[2] | but[2] | not/out[2] |
| 458 | tm | mb | — | — |
| 467 | gi | ig | lot | lot |
| 468 | — | — | — | — |
| 478 | top | top | top | top |
| 567 | (ho)ion[1] | (ho)ion[1] | union | union |
| 568 | mi | im | him | him |
| 578 | mo | om | up | up |
| 678 | lp | pl | look | look |
| 1234 | wr | wr | were | were |
| 1235 | and | and | and | and |
| 1236 | said | said | said | said |
| 1237 | — | — | — | — |
| 1238 | — | — | — | — |
| 1245 | can | can | can | can |
| 1246 | — | — | — | — |
| 1247 | two | two | two | two |
| 1248 | past | past | past | past |
| 1256 | wh | wh | has | has |
| 1257 | now | now | now | now |
| 1258 | mass | mass | mass | mass |
| 1267 | will | low | will | low |
| 1268 | ask | ask | ask | ask |
| 1278 | — | — | — | — |
| 1345 | ran | year | ran | year |
| 1346 | five | five | five | five |
| 1347 | for | for | for | for |
| 1348 | part | part | part | part |
| 1356 | — | — | — | — |
| 1357 | — | — | — | — |
| 1358 | may | may | may | may |
| 1367 | — | — | — | — |
| 1368 | — | — | — | — |
| 1378 | — | — | — | — |
| 1456 | that | that | that | that |
| 1457 | fu | fu | about | about |
| 1458 | — | — | NUMBERS[3] | NUMBERS[3] |
| 1467 | fl | lf | (total) for[4] | (total) for[4] |
| 1468 | — | — | — | — |
| 1478 | — | — | — | — |
| 1567 | hall | hall | hall | hall |
| 1568 | main | main | main | main |
| 1578 | — | — | — | — |
| 1678 | — | — | — | — |
| 2345 | cy | cy | best | best |
| 2346 | tried | tried | tried | tried |
| 2347 | dg | dg | good | order |
| 2348 | step | press | step | press |
| 2356 | she | she | she | she |
| 2357 | du | ud | done | used |
| 2358 | seems | seems | seems | seems |
| 2367 | dl | ld | else | old |
| 2368 | — | — | — | — |
| 2378 | — | — | — | — |
| 2456 | ch | ch | this | this |
| 2457 | cu | uc | cut | just |
| 2458 | — | — | — | — |
| 2467 | cl | cl | still | lost |
| 2468 | ck | ck | — | — |
| 2478 | stop | post | stop | post |
| 2567 | ious[1] | ious[1] | john | john |
| 2568 | miss | miss | miss | miss |
| 2578 | — | — | — | — |
| 2678 | — | — | — | — |
| 3456 | (hr) the[1] | (hr) the[1] | the | the |
| 3457 | ru | ur | boy | our |
| 3458 | rm | mr | type | mr |
| 3467 | rl | rl | give | over |
| 3468 | rk | rk | kept | kept |
| 3478 | pro | pro | poor | poor |
| 3567 | ly | ly | only | only |
| 3568 | — | — | — | — |
| 3578 | open | open | open | open |
| 3678 | like | like | like | like |
| 4567 | (gh) tion[1] | (gh) ing[1] | both | into |
| 4568 | think | think | think | think |
| 4578 | put | put | put | put |
| 4678 | took | took | took | took |
| 5678 | lm | lm | — | — |
| 12345 | between | years | between | years |
| 12346 | first | first | first | first |
| 12347 | toward | toward | toward | toward |
| 12348 | expected | peace | expected | peace |
| 12356 | when | had | when | had |
| 12357 | down | down | down | down |
| 12358 | same | made | same | made |
| 12367 | well | well | well | well |
| 12368 | asked | paid | asked | paid |
| 12378 | — | — | — | — |
| 12456 | with | with | with | with |
| 12457 | cannot | cannot | cannot | cannot |
| 12458 | — | — | — | — |
| 12467 | social | last | social | last |
| 12468 | attack | attack | attack | attack |
| 12478 | — | — | — | — |
| 12567 | who | how | who | how |
| 12568 | — | — | — | — |
| 12578 | woman | woman | woman | woman |
| 12678 | — | — | — | — |
| 13456 | have | have | have | have |
| 13457 | before | often | before | often |
| 13458 | army | matter | army | matter |
| 13467 | felt | life | felt | life |
| 13468 | take | private | take | private |
| 13478 | — | — | — | — |
| 13567 | alone | lay | alone | lay |
| 13568 | make | make | make | make |
| 13578 | — | — | — | — |
| 13678 | — | — | — | — |
| 14567 | (again) from[4] | (half) from[4] | (again) from[4] | (half) from[4] |
| 14568 | — | — | — | — |
| 14578 | among | among | among | among |
| 14678 | talk | talk | talk | talk |
| 15678 | human | human | human | human |
| 23456 | these | these | these | these |
| 23457 | course | under | course | under |
| 23458 | system | mrs | system | mrs |
| 23467 | told | lived | told | lived |
| 23468 | spirit | piece | spirit | piece |
| 23478 | stopped | process | stopped | process |
| 23567 | (should) ould[1] | (house) ould[1] | should | house |
| 23568 | mind | mind | mind | mind |
| 23578 | some | some | some | some |
| 23678 | looked | looked | looked | looked |
| 24567 | such | such | such | such |

TABLE 11-continued

| Input Code | Digraph | | Word | |
| --- | --- | --- | --- | --- |
| | Eastern | Western | Eastern | Western |
| 24568 | — | — | — | — |
| 24578 | most | most | most | most |
| 24678 | stock | stock | stock | stock |
| 25678 | — | — | — | — |
| 34567 | through | other | through | other |
| 34568 | them | them | them | them |
| 34578 | more | more | more | more |
| 34678 | — | — | — | — |
| 35678 | home | home | home | home |
| 45678 | book | might | book | might |
| 123456 | where | where | where | where |
| 123457 | because | because | because | because |
| 123458 | came | came | came | came |
| 123467 | world | world | world | world |
| 123468 | dark | dark | dark | dark |
| 123478 | power | power | power | power |
| 123567 | would | would | would | would |
| 123568 | knew | knew | knew | knew |
| 123578 | women | women | women | women |
| 123678 | walked | walked | walked | walked |
| 124567 | against | against | against | against |
| 124568 | back | back | back | back |
| 124578 | — | — | — | — |
| 124678 | lack | lack | lack | lack |
| 125678 | small | know | small | know |
| 134567 | another | another | another | another |
| 134568 | taken | market | taken | market |
| 134578 | from | from | from | from |
| 134678 | — | — | — | — |
| 135678 | example | play | example | play |
| 145678 | taking | making | taking | making |
| 234567 | could | could | could | could |
| 234568 | didn't | didn't | didn't | didn't |
| 234578 | come | come | come | come |
| 234678 | period | period | period | period |
| 235678 | simply | middle | simply | middle |
| 245678 | much | much | much | much |
| 345678 | problem | problem | problem | problem |
| 1234567 | already | however | already | however |
| 1234568 | american | american | american | american |
| 1234578 | company | major | company | major |
| 1234678 | work | place | work | place |
| 1235678 | played | played | played | played |
| 1245678 | almost | almost | almost | almost |
| 1345678 | family | probably | family | probably |
| 2345678 | economic | possible | economic | possible |

Special Cases (digraphs or words in parentheses have been superseded):
[1]Original digraph has been replaced by more useful combination in preferred embodiment.
[2]Output depends on the first key in the combination to be pressed.
[3]Input code switches keyboard input mode to Numbers/Symbols layout.
[4]Combination does not correspond directly to input code; must be memorized by user.

Figure 9:
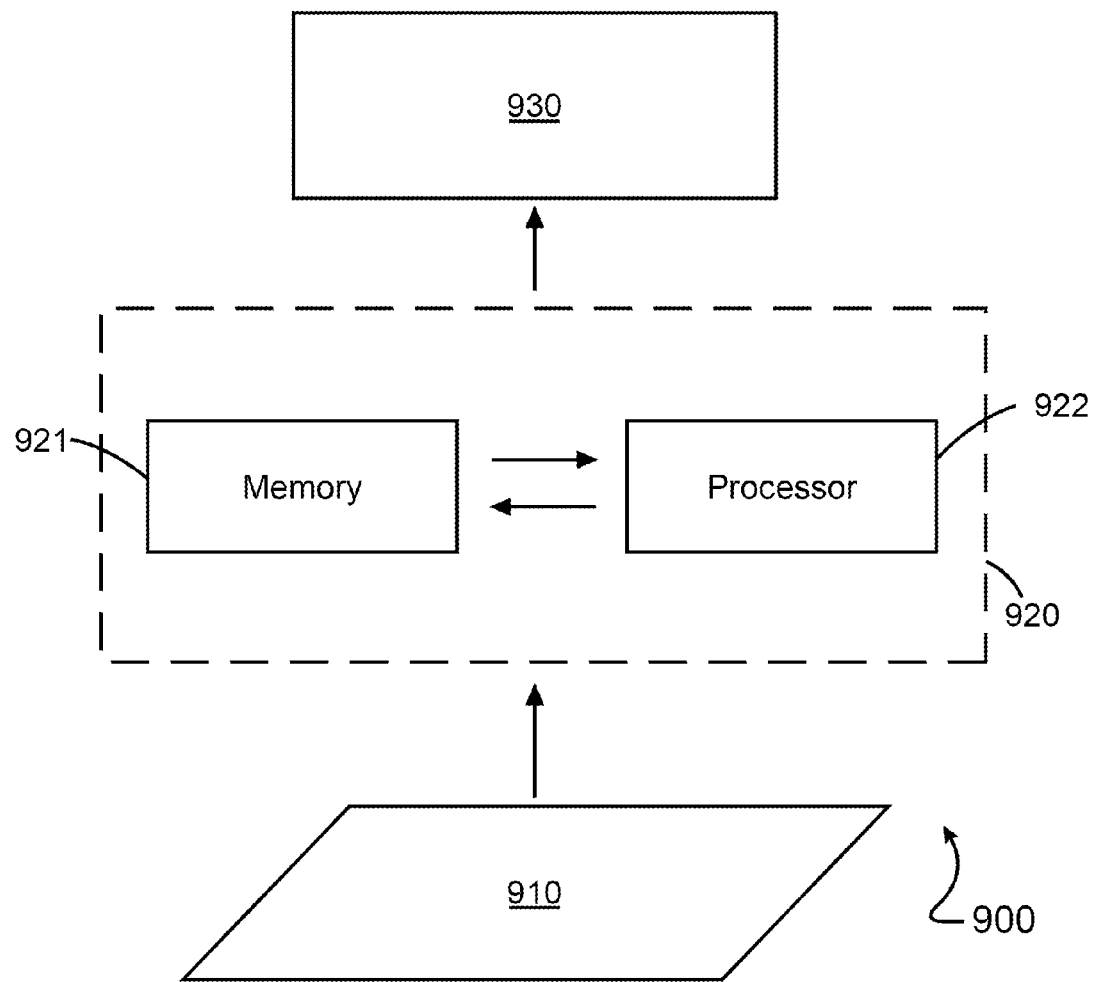
FIG. 9 shows an example system configured to produce output using a ten-key input device.

FIG. 9 shows an example system 900 configured to produce output using an input device 910. The input device 910 includes an input device that can receive input from ten fingers such as an input device that has only ten keys, or a QWERTY keyboard. In some examples, the input device can be a QWERTY keyboard programmed such that less than all of the typical alphabetic keys on the keyboard can be programmed to produce letter output from chorded input. The system includes a ten-key input device 910, a computing device 920, and a display device 930. The computing device includes a memory 921 (e.g., RAM and/or ROM) and a processor 922. The memory 921 can store instructions that when performed by the processor 922 cause the processor to perform operations, including producing an output based on an input communicated from the input device 910. The output can be determined based on one or more maps stored in the memory 921. The one or more maps can be stored in a database format in the computing device 920. The output is communicated to the display device 930. The display device can display the output in a user interface.

Figure 10:
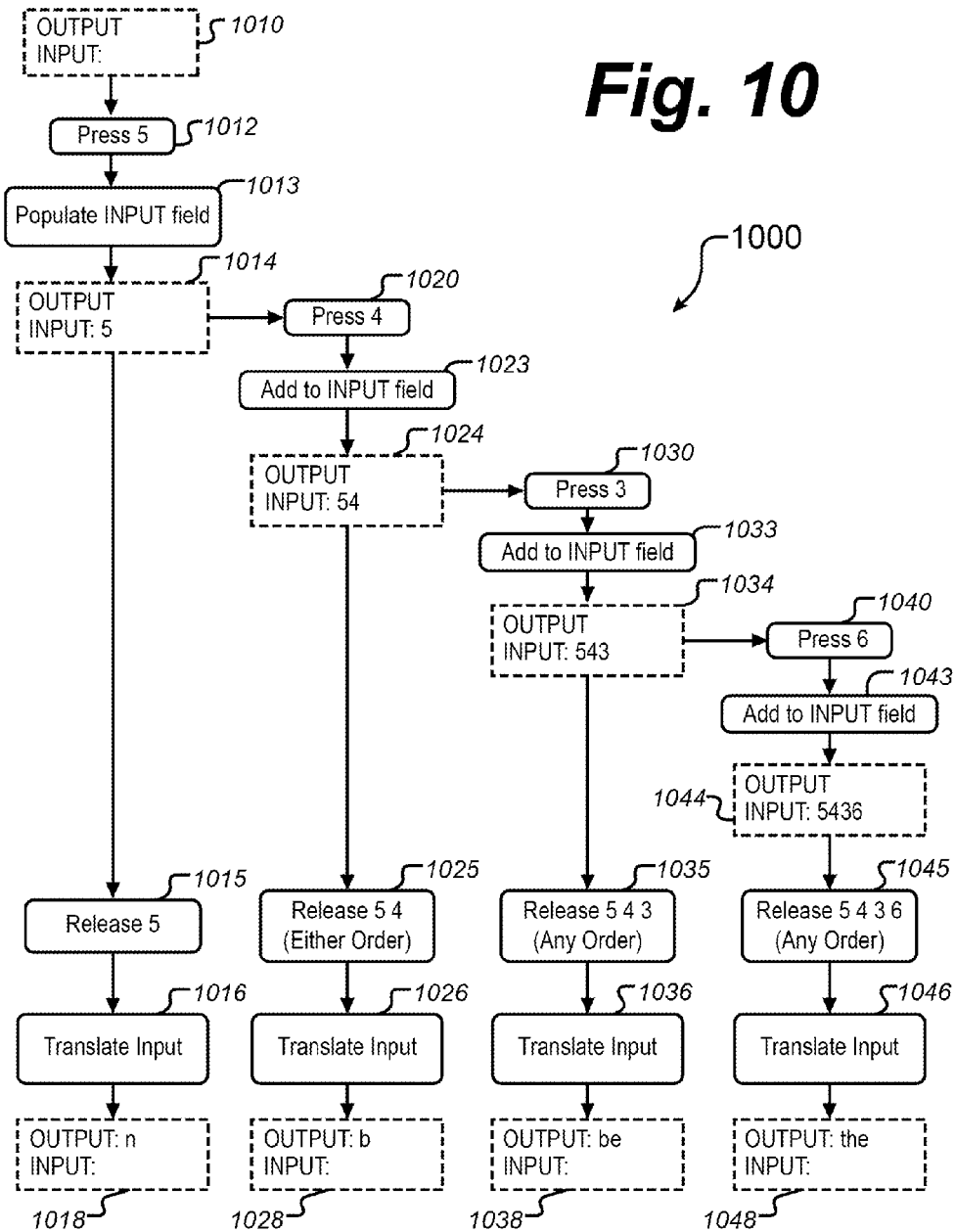
FIG. 10 shows an example process for receiving an input and determining a corresponding output for the received input.

FIG. 10 shows an example of a process 1000 for receiving an input and determining a corresponding output for the received input. The process 1000 is performed, for example, by a computing device such as computing device 920. At 1010, a field for OUTPUT and field for INPUT are shown. These fields can be stored, for example, in memory 921. At 1010, the OUTPUT and INPUT fields have no value. As input is received, the INPUT field is populated according to the received input. When an indication is received that the INPUT field value is complete (e.g., a release of one or more input keys), the INPUT field value gets translated into an OUTPUT value based on a map such as one of the home map 300, second map 500, or third map 600. The OUTPUT value can be communicated to a display device such as display device 930.

The following example is performed in the primary mode with the home map 300. At 1012, input is received from a user pressing on Input Key 5. In response to the input received at 1012, the INPUT field value is populated 1013 with a "5", representing input received from the Input Key 5 as shown at 1014. If the pressing is subsequently released at 1015, the INPUT field value of "5" is translated 1016 according to the home map 300 into an output value of "n". As a result, the INPUT field value is cleared and the OUTPUT field value is populated with the value of "n" as shown at 1018. The OUTPUT field value of "n" can be provided to a display device for display to the user.

However, if, before the user releases the Input Key 5, another input is received 1020 from a user pressing another input key, Input Key 4, then a "4" is added 1023 to the INPUT field value so that the INPUT field value is "54" as shown at 1024. If the pressing of the Input Keys 5 and 4 is subsequently released at 1025, the INPUT field value of "54" is translated 1026 according the home map 300 into an output value of "b". As a result, the INPUT field value is cleared and the OUTPUT field value is populated with the value of "b" as shown at 1028. The OUTPUT field value of "b" can be provided to a display device for display to the user.

However, if, before the user releases either or both of the Input Keys 5 and 4, another input is received at 1030 from the user pressing third input key, Input Key 3, then a "3" is added 1033 to the INPUT field value so that the INPUT field value is "543" as shown at 1034. If the pressing of the Input Keys 5, 4, and 3 is subsequently released at 1035, the INPUT field value of "543" is translated 1036 according to the map 300 (as described above map 300 can include stenographic combinations such as those in Table 11) into an output value of "be". As a result, the INPUT field value is cleared and the OUTPUT field value is populated with the value of "be" as shown at 1038. The OUTPUT field value of "be" can be provided to a display device for display to the user.

However, if, before the user releases the Input Keys 3, 4, and 5, a fourth input is received at 1040 from the user pressing Input Key 6, then a "6" is added 1043 to the INPUT field value so that the INPUT field value is "5436" as shown at 1044. If the pressing of the Input Keys 5, 4, 3, and 6 is subsequently released at 1045 (in any order), the INPUT field value of "5436" is translated at 1046 according to map 300 into an output value of "the". As a result, the INPUT field value is cleared and the OUTPUT field value is populated with the value of "the" as shown at 1048. The OUTPUT field value of "the" can be provided to a display device for display to the user.

When multiple keys are active (i.e., simultaneously pressed), the release of any of the active keys (regardless of the order in which they were activated) can cause the processor to translate the INPUT field to produce a value in the OUTPUT field by looking up the output associated with the INPUT on a map. Once the OUTPUT field is processed the INPUT field and the OUTPUT fields can be cleared for translating a new input as additional input keys are activated. If some keys from the previous input/output are still pressed, releasing them will have no further effect, nor will they become part of a new chord. This allows for some stepping on previous inputs on subsequent inputs without causing an undesired chord or losing the subsequent activation of an input key.

In some implementations, autocorrect features can be used to correct common mistakes that occur as a result of operator error. Several different types of autocorrect techniques can be employed. Many such autocorrect features correct a mistake once a word is bracketed by (i.e., preceded by and succeeded by) a leading and a trailing space.

In some examples, step-on errors or fragmented chord errors can be autocorrected. In the examples where output is generated in response to a user releasing a key, step-on errors occur when a user begins a new input for a new letter, word, or portion of word before release of the input keys for the previous input. For example, if a user presses an Input Key 1, with a desired output of the letter "a" but before releasing the pressing of Input Key 1 presses another input key (i.e., steps on the input with Input Key 1) such as Input Key 5 with a desired output of "n", then a chord 45 will be recognized. The letter "q" will be output instead of the desired "an". Fragmented chord errors, which are essentially the opposite of step-on errors, occur when a user fails to press both input keys in a chord simultaneously (i.e. the user fails to press the second key in a chord prior to releasing the first key). For example, if a user presses and releases Input Key 5 followed by pressing and releasing Input Key 8, the letters "np" will be produced instead of the desired output "m".

Figure 11:
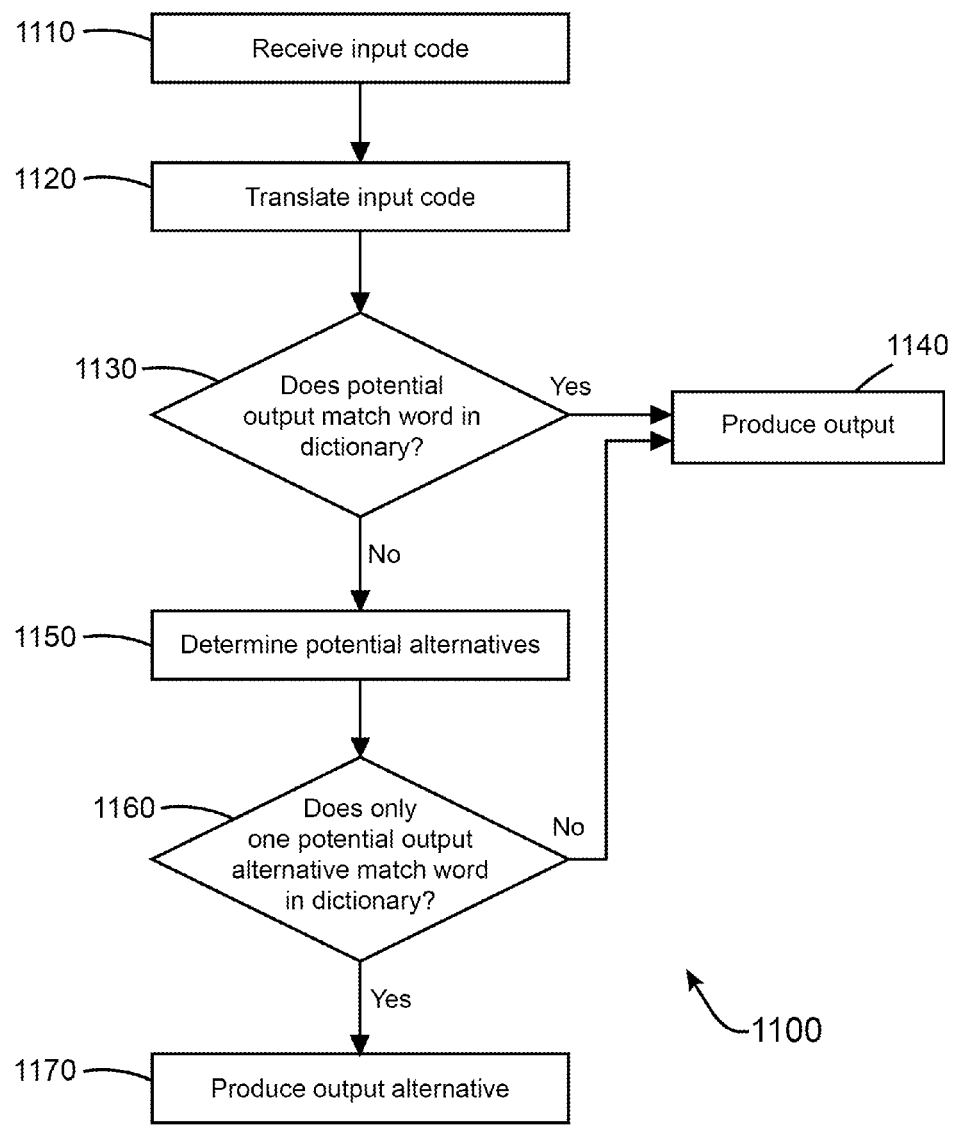
FIG. 11 shows an example process for identifying an alternative word for an incorrectly typed word.

FIG. 11 shows a process 1100 for automatically correcting a step-on or fragmented chord error. At 1110, an input code is received from a user using a ten-key input device for a word. At 1120, the input code is translated into potential output that contains the letters as typed according to a map such as map 300. At 1130, the potential output is looked up in a word list (e.g., a list of English words found in an in English dictionary), and it is determined whether the potential output corresponds to any word in the word list. If the potential output matches a word, the potential output is produced for further output or processing at 1140 such as for display on an output device. For example, if input code is 2-3-1-4 is received then the translation (using map 300) at 1120 produces the potential output "seat". Because the word "seat" occurs in the dictionary, the output "seat" is produced for further output or processing at 1140.

If at 1130, the potential output does not match any word, then the process determines at 1150 potential output alternatives based on the possible mistakes that a user may have made. If only one of these potential output alternatives corresponds to a word in the dictionary at 1160, it is produced as output at 1170. If none of the potential output alternatives match a word in the dictionary, than the original output (as typed) is produced at 1140. Similarly, if more than one potential alternative output match words in the dictionary, then it is not possible for the process to determine with certainty which error was made and the original output (as typed) is produced at 1140. For example, if the input code is 2-3-14, then the potential output "sef" is considered at 1130. This does not match any of the words in the dictionary, and potential alternatives are identified at 1150. The alternatives are determined by producing potential input codes and their corresponding potential output by replacing potential step-on errors with the discrete input codes and replacing potential fragmented chords with chords. In the above example, the following alternative input codes and corresponding potential output alternatives are produced at 1150: input code 23-14, which presumes a fragmented chord error occurred and corresponds to a potential output of "df", and input code 2-3-1-4, which presumes a step-on error occurred and corresponds to a potential output of "seat". At 1160 these potential outputs are compared to the words in the dictionary and only the potential output "seat" is found to match. At 1170 the output "seat" is produced instead of the original output of "sef".

Incorrectly ordered combinations forming a chord can also be automatically corrected according to the process 1100 in FIG. 11. As described above, some chords can be mapped to different outputs depending on the order the input keys are pressed (e.g., the order in which the first key is pressed). In cases where a chord is entered where the output is dependent on the order in which the input keys are pressed, at 1150 the process determines a potential alternative by building a word using the opposite (eastern or western, as described above) formulation. For example, if the user enters the input code 45-3-4567, the potential output "betion" is considered at 1130. This does not match any of the words in the dictionary, and at 1150 the potential output alternative "being" is identified by replacing the suffix "tion" (western) with the suffix "ing" (eastern). At 1160 this potential output alternative is found to occur in the dictionary, so at 1170 the output "being" is produced instead of the original output of "betion".

In addition to using the opposite (eastern or western) chord output to construct a potential alternate output word in the process 1100, it is also possible to also include all alternate letter combinations to develop potential alternate output words at 1150. For example, if the user enters the input code 27-1-237 at 1110 (which includes the western version of the input code 237, which translates to the digraph "di"), the code is translated into the potential output "gadi" at 1120. Since this does not match any of the words in the dictionary at 1130, potential output alternatives are constructed at 1150. The eastern version of the input code 237 translates to the digraph "id", but the input code could also potentially be mapped to the digraphs "dz", "ez", and "ze". These digraphs occur much less frequently (as shown in Table 7), but still produce formulations that may be found as part of words in the dictionary database. In the above example, the potential output alternatives "gaid", "gadz", "gaez", and "gaze" are produced at 1150. Since only one of these potential outputs ("gaze") is found to occur in the dictionary at 1160, the output "gaze" is produced at 1170.

Figure 12:
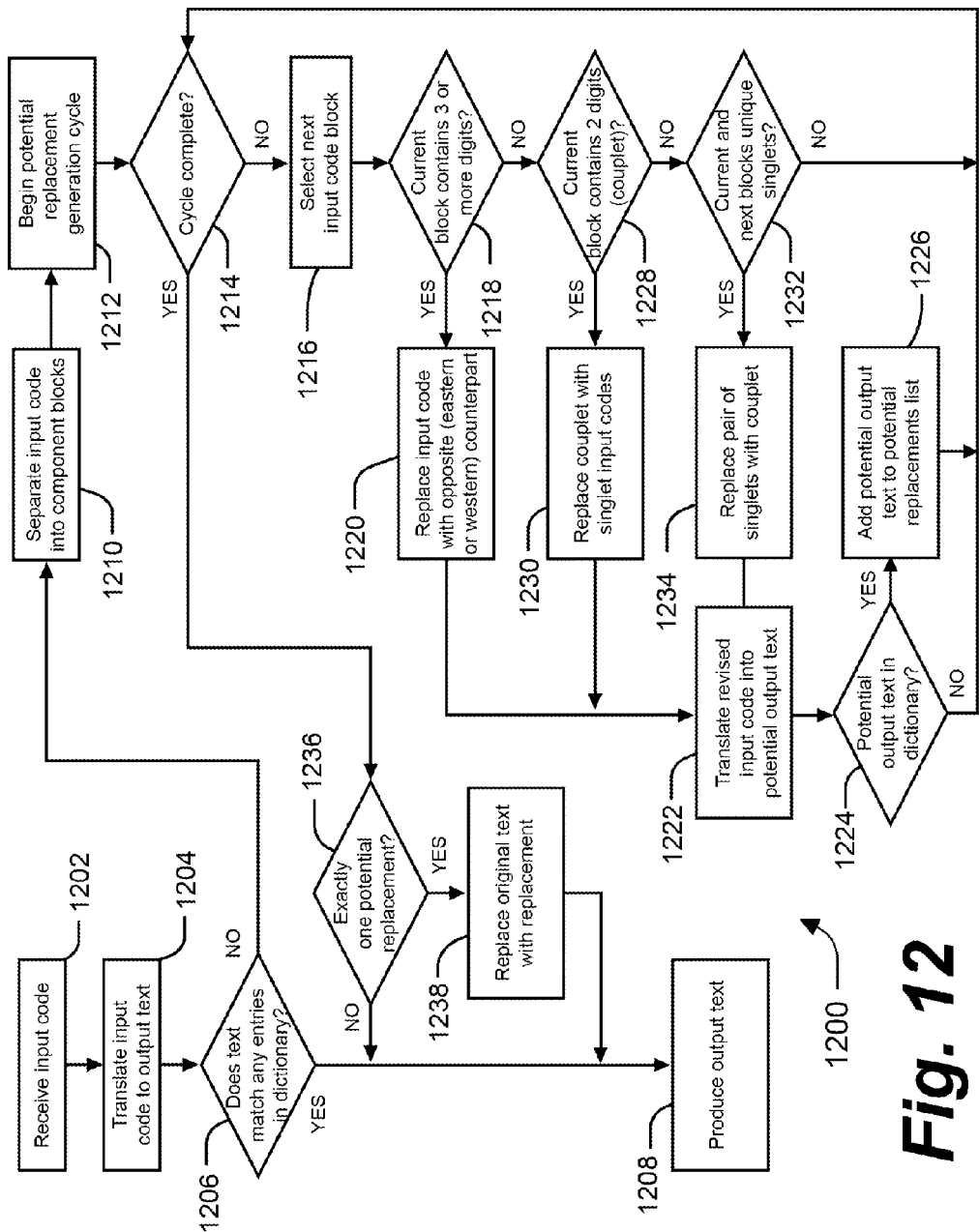
FIG. 12 shows an example process for correcting output as input is received.

FIG. 12 shows an example process 1200 for correcting step-on or fragmented chord errors as well as improperly ordered digraphs, trigraphs, and other letter combinations that may arise during the typing process due to user error. At 1202 an input code is received from a user using a ten-key input device for a word. At 1204 the input code is translated into potential output text that contains the letters as typed according to a map such as map 300. The potential output text is compared to a word list such as a dictionary at 1206, and it is determined whether the potential output text corresponds to any word or leading fragment of a word. If the potential output text matches a word, the text is produced for further output or processing at 1208. For example, the input code 54-1 received at 1202 would be translated to the potential output text "ba" at 1204. The potential output text "ba" matches a number of entries in the dictionary at 1206, as a leading fragment of such words as "bag", "bake", "ball", etc. The output text "ba" is therefore produced at 1208 for output or further processing.

If the potential output text does not correspond to any word or word fragment at 1206, the input code is broken into its component blocks at 1210. These component blocks include the input code digits as well as the order in which the keys in each input code block were activated. The potential replacement generation cycle, in which potential replacements for the incorrect input text are generated, begins at 1212. The cycle proceeds sequentially through each block in the input code. At 1214 the process determines whether the cycle has been completed. If it has not, the next input code block is selected at 1216 and becomes the current input code block.

At 1218 the current input code block is examined to determine whether it consists of three or more input code digits (i.e. three or more keys were pressed simultaneously). If so, the current input code block is replaced with the "eastern" or "western" counterpart at 1220. The revised input code is translated into potential text at 1222, and the potential text is compared to the word list at 1224 to determine whether the potential alternative is a viable replacement. If the potential output is not in the dictionary, the cycle proceeds through 1214 and moves on to the next input code block. If the potential word is found in the dictionary, the entry is added to a list of potential replacements at 1226 and the cycle proceeds through 1214 and moves on to the next input code block.

If the current input code block does not contain three or more digits at 1218, it is determined at 1228 whether the current block contains two digits—a couplet. If so, the couplet is replaced with a pair of single input codes—singlets—in the same order in which the couplet was originally entered at 1230. As above, the revised input code is translated into potential text at 1222 and the potential text is compared to the word list at 1224.

If the current input code block does not contain two digits at 1228 (in other words, it consists of a single digit), it is determined at 1232 whether the current and next input code blocks are both single digit input codes—singlets. If the next input code block is not a singlet (i.e. it is some other type of block or else the current input code block is the final input code block in the cycle) or is identical to the current input code block (due to a pair of repeated letters, such as "oo" in "soon"), the cycle returns to 1214 without producing a potential replacement and moves on to the next input code block. If the current and next input code blocks are non-identical singlets at 1232, they are replaced at 1234 with a couplet composed of the pair of singlets in the same order in which they were originally entered. As above, the revised input code is translated into potential text at 1222 and the potential text is compared to the word list at 1224.

Once the potential replacement generation cycle at 1214 is complete, it is determined at 1236 whether there is exactly one potential replacement. If there are no potential replacements that are found in the dictionary, the original text output (as typed) is produced at 1208 for display or further processing. Similarly, if there are two or more potential replacements at 1236, it is not possible to definitively identify the user error, and the original text output is produced at 1208. If there is exactly one potential replacement, the original text is replaced with the corrected text at 1238, and the corrected text is produced at 1208 for display or further processing.

For example, at 1202 the user enters the input code 54-1-4-4-367. At 1204, the input code is translated to the potential output text "battel". This potential output text is not recognized as corresponding to any word in the dictionary at 1206. The input code is separated into five component blocks at 1210, and enters the potential replacement generation cycle at 1212. The results of the potential replacement generation cycle are shown in Table 12, beginning at 1216 for each successive cycle. The sections of the revised input code that are shown in bold type are the input code blocks that were changed during the potential replacement generation cycle.

TABLE 12

| Cycle | Current Input Code Block | Next Input Code Block | Path in Potential Replacement Generation Cycle | Revised Input Code | Potential Replacement Text |
|---|---|---|---|---|---|
| 1 | 54 | 1 | 1218, 1228, 1230, 1222, 1224 | 5-4-1-4-4-367 | ntattel |
| 2 | 1 | 4 | 1218, 1228, 1232, 1234, 1222, 1224 | 54-14-4-367 | bqtel |
| 3 | 4 | 4 | 1218, 1228, 1232 | N/A | N/A |
| 4 | 4 | 367 | 1218, 1228, 1232 | N/A | N/A |
| 5 | 367 | — | 1218, 1220, 1222, 1224, 1226 | 54-1-4-4-763 | battle |

Of the five cycles that are completed in the example, only one of them produces potential replacement text that is found in the dictionary ("battle") and is added to the potential replacements list at 1226. After completion of the potential replacement generation cycle at 1214, it is determined at 1236 that there is only one potential replacement. The original text of "battel" is replaced with "battle" at 1238, and this is produced as output at 1208.

In some examples, the error correction for text input is performed before a word is completed (i.e. "on-the-fly"). It is also possible to perform a similar process once the user has indicated the end of a word through the inclusion of a delimiter character such as a space, period, or other punctuation character. This can be useful when an ambiguous result is obtained from the process 1200.

Figure 13:
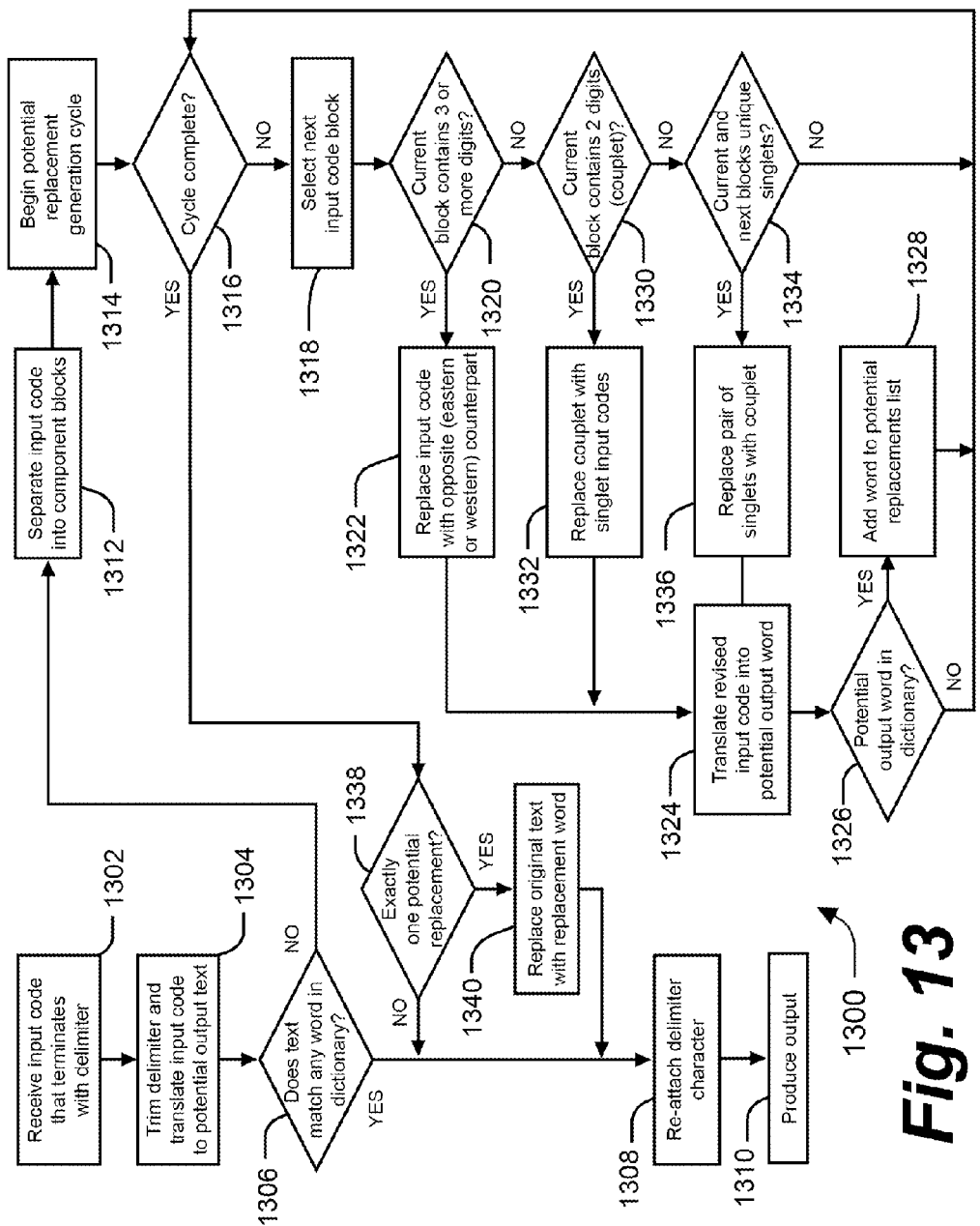
FIG. 13 shows a process for correcting output for completed words.

In some examples, the process 1300 described in FIG. 13 can be performed when a delimiter character is received that indicates the end of a word. The process is effectively identical to process 1200, except that potential output replacements are only viable if they match the entire word in the word list. For example, as described above the word fragment "ba" would match a number of words in the word list according to criteria for process 1200, but would not match any words according to the criteria for process 1300 because it is not a complete word.

For example, if the user enters the input code 7-4-3, it corresponds to the output text "ote". This is not found as a word or as a leading fragment of a word in the dictionary. Based on the process 1200, the alternate input codes 7-43 and 74-3 are generated, which correspond to the potential output text "or" and "ge" respectively. Both of these are recognized as potential entries in the dictionary ("or" as an independent word, and "ge" as part of the words "geese", "general", "get", etc.) so it is not possible to automatically recognize and correct the input error. However, if the user subsequently produces an input indicating a delimiter character (such as a space or other punctuation character), it is known that the user has completed typing the word. At this point, potential replacement words are identified according to the process 1300. Only text that corresponds to entire words will be added to the potential replacements list. In this example, the only viable potential output text is the word "or" (since "ge" is not a word) and the output can be produced without ambiguity.

Thus, at 1302 an input code is received that terminates with a delimiter. At 1304 the delimiter is trimmed and the input code is translated into potential output text. The potential output text is compared to a word list at 1306, and it is determined whether the potential output text corresponds to any word. If the potential output text matches a word, the delimiter character is re-attached at 1308, and the text is produced for further output or processing at 1310.

If the potential output text does not correspond to any word at 1306, the input code is broken into its component blocks at 1312. These component blocks include the input code digits as well as the order in which the keys in each input code block. The potential replacement generation cycle, in which potential replacements for the incorrect input text are generated, begins at 1314. The cycle proceeds sequentially through each block in the input code. At 1316 the process determines whether the cycle has been completed. If it has not, the next input code block is selected at 1318 and becomes the current input code block.

At 1320 the current input code block is examined to determine whether it consists of three or more input code digits (i.e. three or more keys were pressed simultaneously). If so, the current input code block is replaced with the "eastern" or "western" counterpart at 1322. The revised input code is translated into a potential output word at 1324, and the potential word is compared to the word list at 1326 to determine whether the potential word is a viable replacement. If the potential word is not in the dictionary, the cycle proceeds through 1316 and moves on to the next input code block. If the potential word is found in the dictionary, the entry is added to a list of potential replacements at 1328 and the cycle proceeds through 1316 and moves on to the next input code block.

If the current input code block does not contain three or more digits at 1320, it is determined at 1330 whether the current block contains two digits—a couplet. If so, the couplet is replaced with a pair of single input codes—singlets—in the same order in which the couplet was originally entered at 1332. As above, the revised input code is translated into a potential word at 1324 and the potential word is compared to the word list at 1326.

If the current input code block does not contain two digits at 1330 (in other words, it consists of a single digit), it is determined at 1334 whether the current and next input code blocks are both single digit input codes—singlets. If the next input code block is not a singlet (i.e. it is some other type of block or else the current input code block is the final input code block in the cycle) or is identical to the current input code block (due to a pair of repeated letters, such as "oo" in "soon"), the cycle returns to 1316 without producing a potential replacement and moves on to the next input code block. If the current and next input code blocks are non-identical singlets at 1334, they are replaced at 1336 with a couplet composed of the pair of singlets in the same order in which they were originally entered. As above, the revised input code is translated into a potential word at 1324, and the potential word is compared to the word list at 1326.

Once the potential replacement generation cycle at 1316 is complete, it is determined at 1338 whether there is exactly one potential replacement. If there are no potential replacements that are found in the dictionary, the original text output (as typed) is produced at 1310 after re-attaching the delimiter character at 1308. Similarly, if there are two or more potential replacements at 1338, it is not possible to definitively identify the user error, and the original text output is produced at 1310 after re-attaching the delimiter character at 1308. If there is exactly one potential replacement, the original text is replaced with the corrected word at 1340, and the corrected word is produced at 1310 for display or further processing after re-attaching the delimiter character at 1308.

The process 1300 described in FIG. 13 can apply to single characters that are input when the user intends to write a short word. For example, if the user intends to type the word "at" using the input code 1-4 but steps on the second key before releasing the first and enters the input code 14, the output text "f" will be produced according to the map 300. However, if the user subsequently presses the space key, the process 1300 will replace the output text "f" with "at".

Skewed combinations can also be identified and corrected. A skewed combination occurs when a user presses some elements of a chord while releasing other elements too early. Skewed combinations will result in undesired outputs. For example, if the user, intending to input the chord 3456, presses Input Keys 3, 4, and 5 but releases the pressing prior to pressing the fourth key in the chord, Input Key 6, the resulting output is "bei" as opposed to the desired "the". When a skewed combination is bracketed by spaces, the common mistakes of this type can be recognized and replaced with the output that would have been produced by the complete chord. In other examples, "ag" (produced by pressing-and-releasing Input Key 1, pressing both the Input Keys 4 and 7) becomes "of" (which should have been: pressing and releasing Input Keys 1, 4, and 7 as a single combination), and "wy" (pressing-and-releasing Input Keys 1 and 2, then pressing-and-releasing Input Keys 3 and 5) becomes "and" (which should have been: pressing-and-releasing Input Keys 1, 2, 3, and 5 as a single combination).

In some implementations, certain combinations of input keys can be shortcuts to known words. The shortcuts can act as deliberate autocorrect features. In other words, a user can increase typing speed by deliberately relying on the computer to correct errors rather than having to type out a whole word. In this way, the user can enter words that would normally require three or more keystrokes with two or fewer. For example, instead of using five separate actuations (three primary keys and two chords) to type the word 'there', the user can enter the chord 3456 for the word "the" followed by a chord for the letter "r", followed by a space. This particular combination for "ther" can be mapped to "there". For words that end with the suffix "-ed" (such as "wanted" or "shouted"), the user can append the letter "d" to the end of the base word and rely on the computer to correct the error automatically. Deliberately stepping on two-letter words (as described above in connection with autocorrecting "step on" errors) is another example of how this technique can be used to increase typing speed.

One advantage of the above described systems, devices and techniques is that users already familiar and proficient with the QWERTY keyboard can learn a ten-key input scheme as discussed above based on their knowledge of the QWERTY keyboard. In order to facilitate the learning process, several additional features can be provided.

Figure 14A:
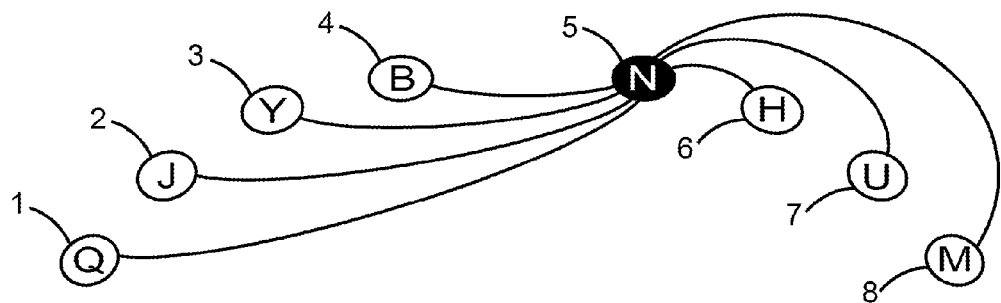
FIGS. 14A-14C show examples of menus for assisting a user to discover input combinations and their corresponding outputs.

In some implementations, if the user presses and holds a primary input key for a predetermined amount of time (e.g., one full second, which is long enough to generate a string of repeated characters on a standard keyboard), a set of output characters (letters, punctuation, function, digraphs, trigraphs, words etc.) is presented that can be produced using the primary key and various combinations of other input keys (depending on the user's subsequent input action). For example, if the user holds down Input Key 5 corresponding to the letter "n" (e.g., using the right index finger), a menu 1400 in FIG. 14A is displayed. The menu shows positions 1-8 corresponding to the eight Input Keys 1-8. In position 5, the letter "n" is shown corresponding to the input key, Input Key 5, that is being pressed. The other seven positions show the output produced by the chord that can be created with Input Key 5 and input key corresponding with the respective position. For example, in position 1 (corresponding to Input Key 1) the letter "q" is shown because "q" is the output produced by the chord 51. In position 2 (corresponding to Input Key 2) the letter "J" is shown because "J" is the output produced by the by the chord 52.

In this intermediate state, when a single key is held down, a memory buffer stores a numeric INPUT field value for the original input key that was activated (e.g., INPUT field value of 5). If the user releases the pressing of the original input key (e.g., Input Key 5) without further action, the INPUT field value is translated into its corresponding output (e.g., "N"). However, if before releasing the original input key (Input Key 5), the user presses and releases another input key (e.g., Input Key 1), the resulting output will consist of the appropriate chord for the pair of keys (Input Key 1 and Input Key 5) that was pressed (i.e., "q").

Figure 14B:
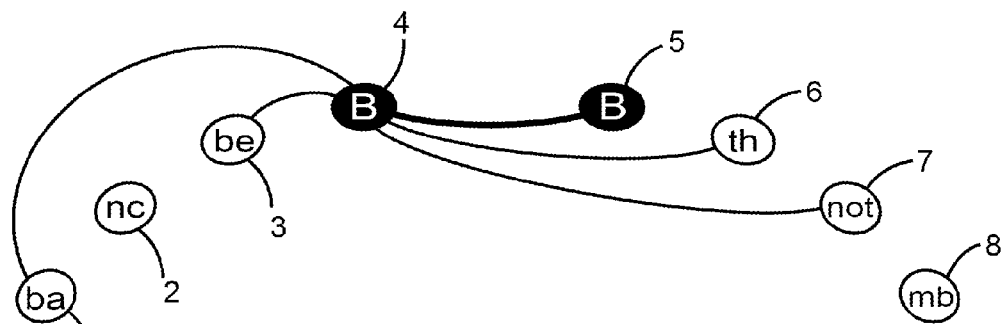

If the user holds down a pair of keys such as Input Key 5 and Input Key 4, a similar menu 1401 is displayed in FIG. 14B that shows the possible three-key chords that begin with Input Key 5 followed by and Input Key 4. Also, the corresponding outputs for the three-key chords are displayed. For example, in position 1 a "ba" is displayed which represents the output that will result if the chord 541 (one of the "eastern" versions of input code 145) is pressed and released.

Figure 14C:
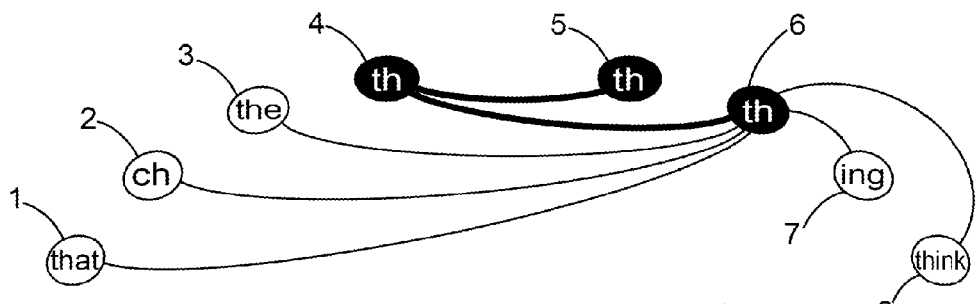

If three keys are pressed down such as Input Keys 5, 4, and 6, an additional menu 1402 is displayed in FIG. 14C showing the possible four-key chords that begin with the input keys 5, 4, and 6. Also, the corresponding outputs for the three-key chords are displayed. For example, in position 3 the word "the" is displayed. The word "the" is output in response to the chord 5463 (one of the "eastern" versions of input code 3456) being pressed and released. Further menus can be displayed as further input keys are pressed while the other previous pressed input keys are held down (e.g., for five-key chords, six-key chords, etc.)

In some implementations, a map, autocorrect features, and stenographic combinations can be calibrated to a particular user based on the users typing habits on a QWERTY keyboard and allow for semi-ambiguous correction of words where chords are not fully utilized to properly enter text. The calibration can be performed based on which finger is used by the user to strike each key on a QWERTY keyboard.

For example, although the letters on the top and middle rows of a QWERTY keyboard are 'universal' and almost all users will strike these keys with the same fingers (e.g., left pinky for Q and A, left ring for W and S, etc.), approximately half of keyboard users strike the letters on the left hand side of the bottom row (letters Z, X, C, V, and B) differently. As such, a map for translating inputs to outputs can reflect the user's particular preference for entering these letters.

Figure 15A:
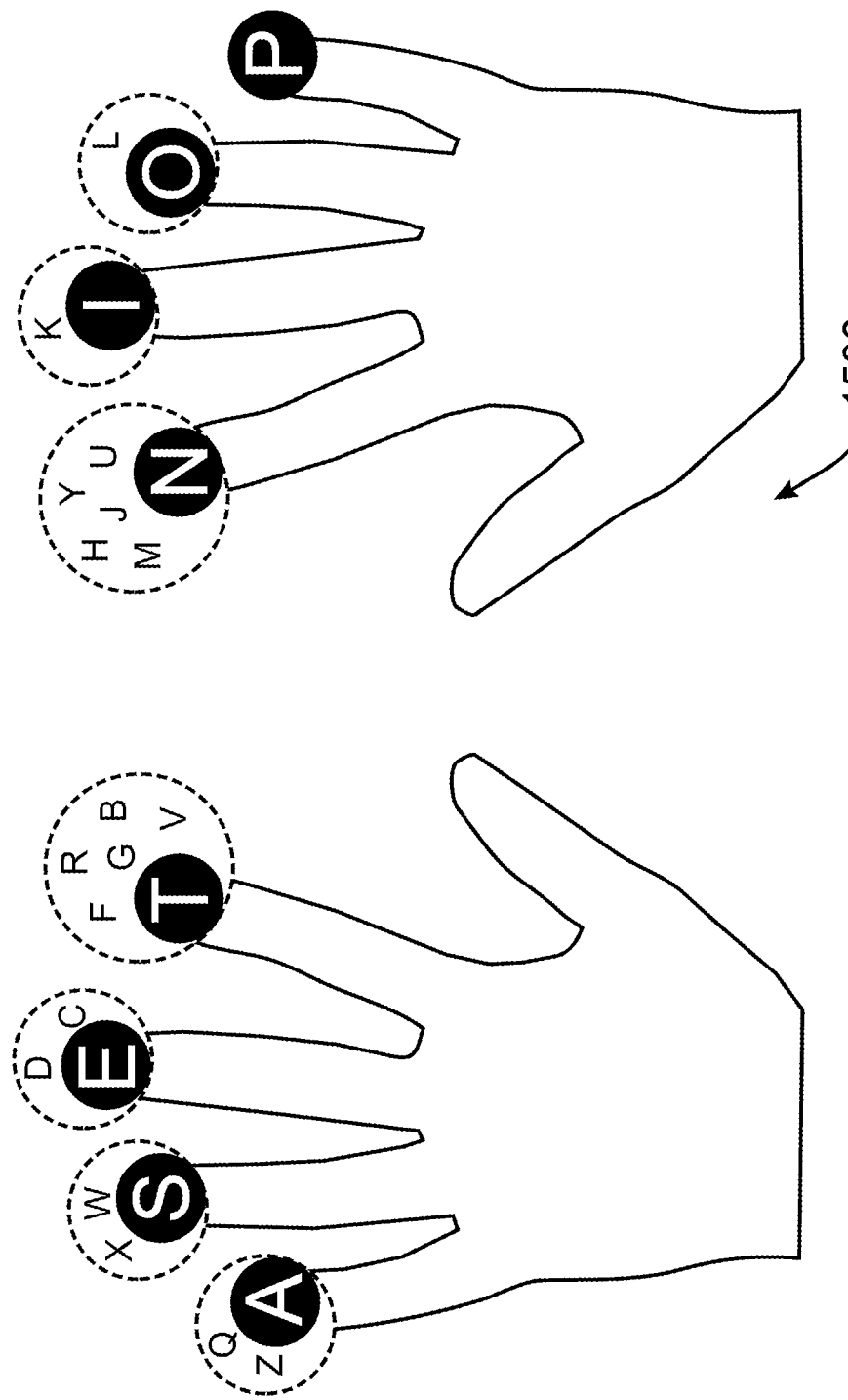
FIGS. 15A and 15B show examples of user key preference calibration maps.
Figure 15B:
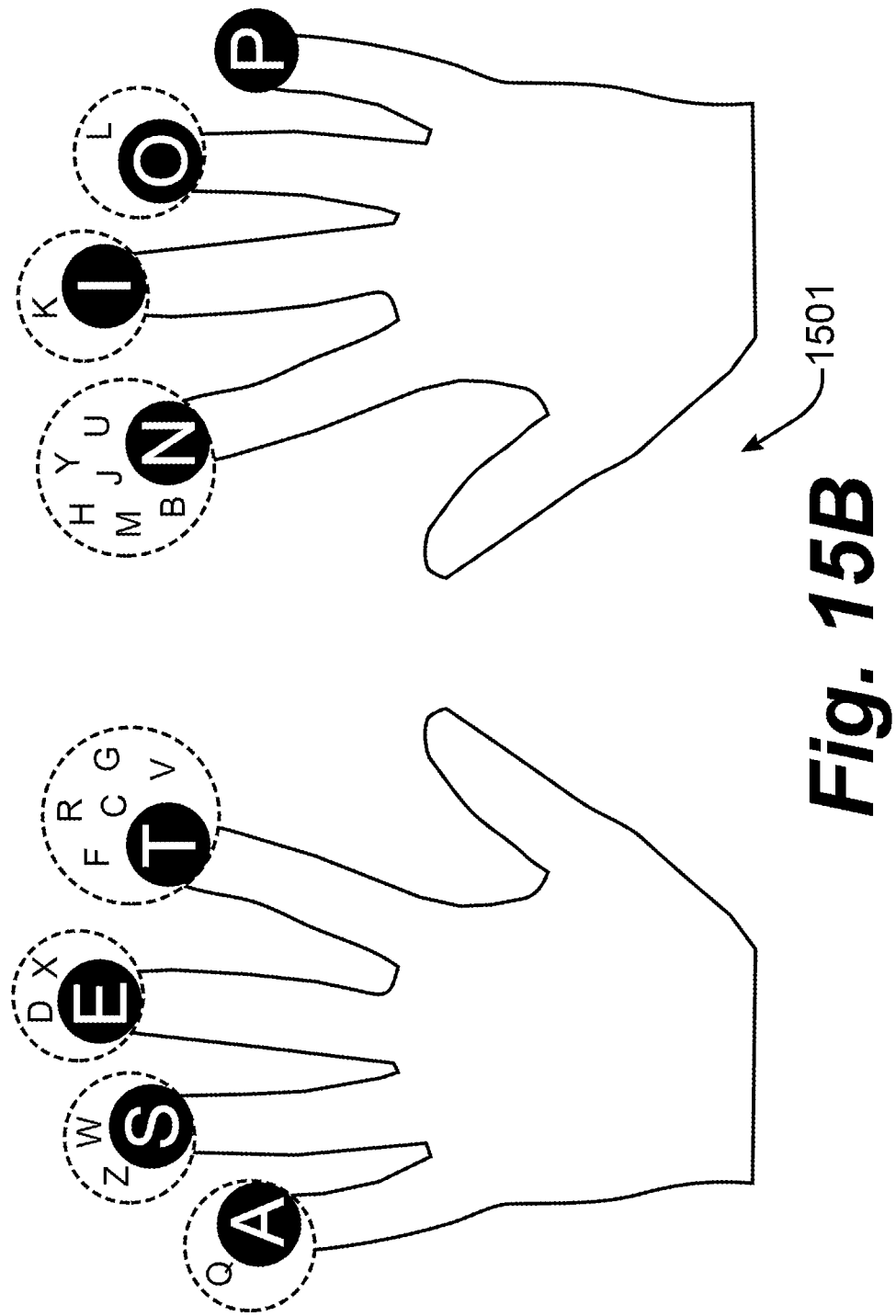

FIG. 15A and FIG. 15B show example key calibration maps. The FIG. 15A represents the map 1500 according to a traditional typing scheme that is taught to novice typists on a QWERTY keyboard; FIG. 15B shows a map 1501 that is similar to map 1500 but differs in some respects: for example, the Z, X, and C keys are shifted over, the B key is pressed by the right hand index finger instead of the left. In both examples, the ASETNIOP letters are considered to be "primary" letters and are unambiguous in terms of their output, while the additional letters of the alphabet are considered to be "secondary" and semi-ambiguous; they are considered if a word built using the primary letters is not recognized in a word list (e.g., a list of English words found in an in English dictionary).

The calibration can be performed by obtaining a list of which fingers 0-9 the user uses to input the various letters on a QWERTY keyboard. This list can be obtained, for example, by prompting the user to enter each letter in the alphabet (A through Z) without moving their fingers away from the home keys, thus training the computer which finger they use for each letter. On a ten-key input device, the user can enter each letter without moving his/her fingers away from the Input Keys 0-9. In some examples, a user can type a passage with various characters using a set of gloves equipped with sensors to sense when the user is pressing and releasing.

Once it is known which fingers are used to strike each letter of the alphabet (e.g., a particular user might use the left pinky, which corresponds to a code of 1, to strike Q, A, and Z; the left ring finger, which corresponds to a code of 2, to strike W, S, and X, and so forth) a database can be built with all the potential combinations of words based on the combinations of Input Keys 0-9 and Fingers 0-9 that correspond to these characters and functions typed with those fingers.

In some examples, the map 300 above can be supplemented with possible combinations that a user might naturally type based on his/her typing habits on the QWERTY keyboard. For example, an input code for the word 'who' is '12-56-7' using map 300 above. This input code corresponds to a chord 12 for W, chord 56 for H, and a single action input with input key 7 for O. On a traditional QWERTY keyboard, most users strike the W key with their left ring finger (which corresponds to input code 2), and strike the H key with their right index finger (which corresponds to input code 5). In order to compensate for other possible ways a user might enter letters with an intended output of the word 'who', the partially chorded input codes of '2-56-7' and '12-5- 7 ' and the unchorded input code of '2-5-7' can be added to the map 300 for the word 'who'.

Figure 16:
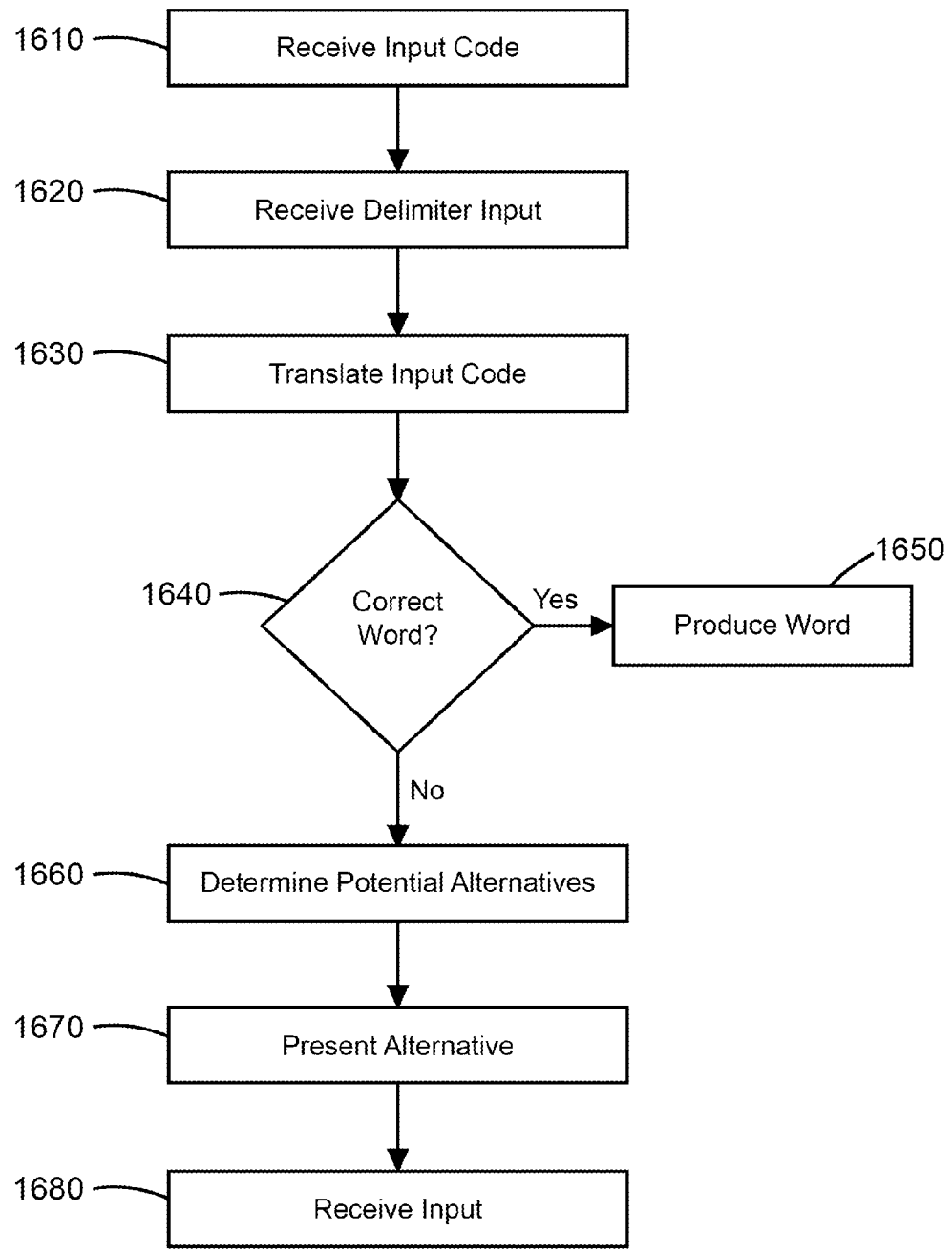
FIG. 16 shows a process for identifying an alternative word for an incorrectly typed word.

FIG. 16 shows a process 1600 for identifying an alternative word for an incorrectly or ambiguously typed word. At 1610, an input code is received from a user using a ten-key input device for a word. At 1620, a space input (e.g., Input Key 0) or a punctuation character is received indicating the end of a word. At 1630, the input code is translated into a potential output word that contains the letters as typed according to a map such as map 300. At 1640, the potential output word is looked up in a word list (e.g., a list of English words found in an in English dictionary), and it is determined whether the potential output word has been typed correctly and is recognizable as a word or has been typed incorrectly or ambiguously and does not correspond directly to a recognizable word. If the word is found in the word list then the word is produced for further output or processing at 1650 such as for display on an output device. For example, if input code is 0-14-7-57-34-0 is received then the translation (using map 300) at 1630 produces the potential output word "four" bracketed by a pair of spaces. Because "four" is recognized as a word at 1640, the word "four" is produced for further output or processing at 1650.

If at 1640, the potential output word is not found in the dictionary, then the process proceeds to determine at 1660 potential alternatives based on chords that a user may have failed to input. For example, if the input code is 4-7-5-4 followed by a space then the potential output word "tont" is produced. The word "tont" is not found in the word list. Potential alternatives are identified at 1660. The alternatives are determined by analyzing chord combinations for each entry of the input code (e.g., input code 4-7-5-4) and comparing words for those combinations with the list of words. If only one potentially correct alternative is identified, that alternative can automatically replace the incorrect word. However, some input codes can have multiple potential alternatives. For example, the following chord combinations can be identified for the input code 4-7-5-4 and the following words corresponding to those combinations are found in a list of English words:

TABLE 13

| Word | Discrete Input Code |
|------|---------------------|
| Bout | 45-7-57-4 |
| Font | 41-7-57-43 |
| Four | 41-7-57-43 |
| Gout | 47-7-57-4 |
| Rout | 43-7-57-4 |
| Tomb | 4-7-58-45 |
| Tour | 4-7-57-43 |
| Tout | 4-7-57-4 |
| Bout | 45-7-57-4 |

Each alternative input code listed above is a chorded combination of the originally received input code 4-7-5-4. At 1670, the determined alternatives are presented. For example, the list of alternatives can be displayed in a user interface. At 1680, a selection of an alternative is received.

Figure 17:
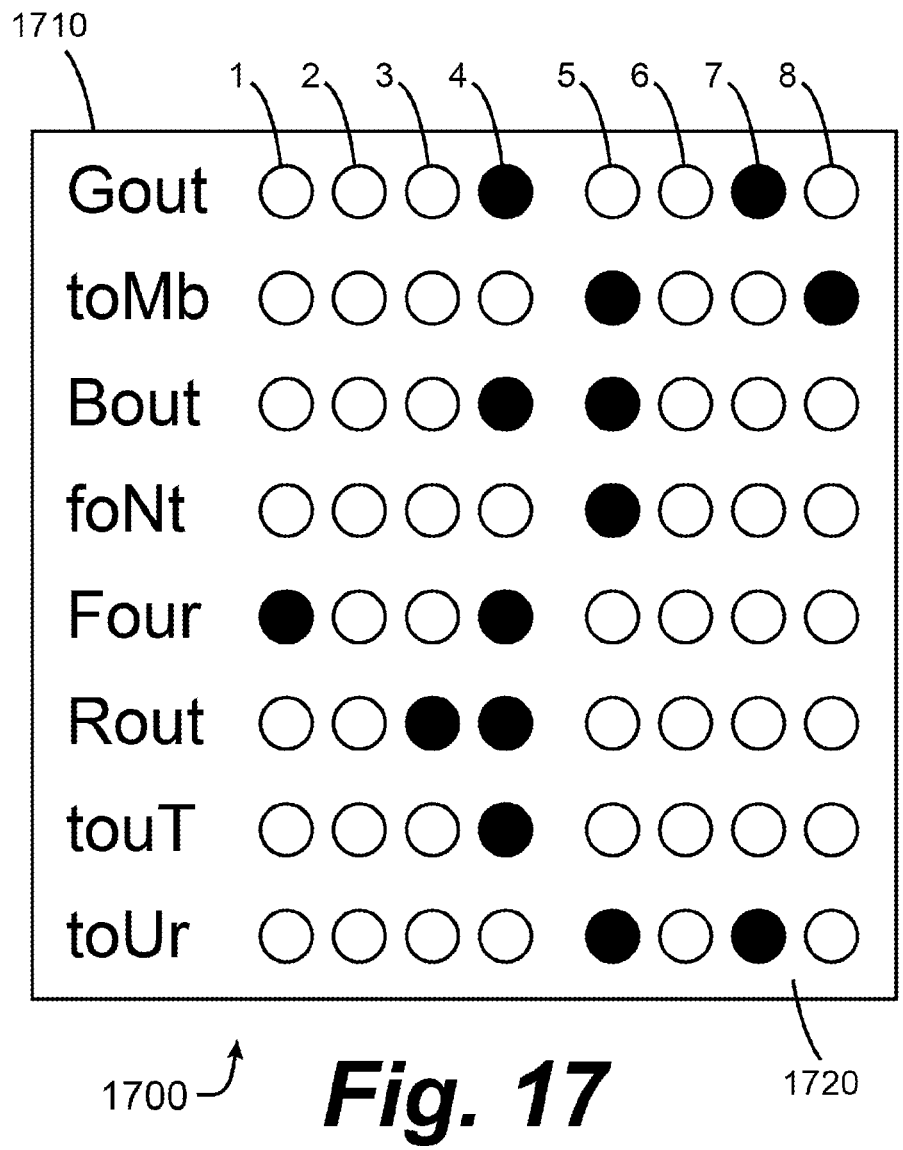
FIG. 17 shows an example of a visual menu for assisting a user in identifying possible alternatives to an incorrect word.

When two or more potential matches for an incorrectly typed word are encountered, a visual menu is opened that prompts the user to select the intended word. The visual menu provides the user an opportunity to learn the correct chords for the secondary characters. An example of a menu listing potential alternatives (presented at 1680) is shown in FIG. 17. FIG. 17 shows an example of a menu 1700 for assisting a user in identifying the intended output and for identifying the correct input to produce that output. The menu 1700 shows eight alternatives for the incorrect word "tont" based on the input code 4-7-5-4. Also, input positions 1-8 are shown for each suggested alternative.

The menu 1700 shows a first column 1710 having a row for each of the potential alternatives: 'gout', 'tomb', 'bout', 'font', 'four', 'rout', 'tout', and 'tour'. For each alternative, eight positions (position 1 through position 8) corresponding to Input Keys 1-8 are shown in a second column 1720. The letter that corresponds to the chord the user must press to select the word is indicated by capitalizing the letter in the word. In some examples, the suggested chord to select the menu option can be emphasized with italicization, an underline, a different color, bolding or the like. Also, positions of the eight positions showing the input keys for the chord for the menu selection are highlighted. When in the menu 1700 the correct word can be selected by inputting the appropriate chord. For example, to select the word "gout" the user would press the chord for the letter "g" (input code 47).

In some examples, there are enough potential words that the number of chords and primary character that are available to select a menu option are exhausted. For example, the text entry TATE (input code 4-1-4-3) corresponds to as many as thirteen different words (depending whether a calibration has been received to include input codes for the letter "C" for a user who strikes the letter "C" with his/her left index finger). In such an example, the user can be prompted to enter one of several sub-menus to select the intended word. The potential alternatives presented in each sub-menu can be grouped based on the first letter in each word or some other process that reduces the number of menu options to a manageable number.

Providing a menu listing potential alternatives in this manner helps a user learn mistyped chords (e.g., failing to include all of the input keys for the chord) by having the user input the mistyped chord to select the correct alternative. Words that include only primary characters (i.e., 'neat') will be recognized as words and will not open a menu even when other combinations are available ('heat', 'hear'). This is in order to maximize speed for proficient typists.

In some implementations, a word a user is inputting can be predicted based on known combinations of input keys that will output known words. A list of words such as a dictionary database can be used to consider partial words—i.e., words that have not been 'closed' through the addition of a space to the end of the word. For example, system 900 in FIG. 9 can be used to do predictive typing using a ten-key input device 910. The system 900 can include a dictionary database stored in memory 921. The computing device 920 can analyze an input code as it is received and can determine a likely output based on word frequency. The determined likely output can be displayed on display device 930. As the input code is added to, the likely output can change and the visual output at the display device 930 can be changed accordingly. This predictive typing feature can be calibrated as above for individual users to reflect their preference for certain keys for certain words (e.g., the left ring finger (Input Key 2) for the letter "Z").

For example, if the user inputs the letter "A" (via Input Key 1) followed by inputting the letter "N" (via Input Key 5), the computing device can determine that Input Key 1 can map to letters of any of the keys that are normally struck on a QWERTY keyboard with the left pinky—letters "Q", "A", or "Z", and can determine that Input Key 5 can map to letters of any of the keys that are normally struck by the right index finger—"Y", "U", "H", "J", "N", or "M". Of the possible combinations of these letters—"QU", "QH" "QJ" "QN", "QM" "AU", "AH", "AJ", "AN", "AM", "ZU" "ZH", "ZJ" "ZN", "ZM") only four are either words or potentially part of words (QU, AH, AN, AM, ZU). The most common word that begins with any of these combinations of letters is 'and' (the third most common word in written English). Consequently, the computing device 920 can display the letters "an" on display device 930 because the entry is recognized in the dictionary database and consists only of primary characters. If the user then enters a space by pressing Input Key 0, the word "an" is selected. If the user subsequently presses Input Key 3 (left ring finger), the expected output of "and" will be displayed. If the user presses the space bar (Input Key 0), the word "and" is selected, because it is the only combination of the letters corresponding to Input Keys 1 5, and 3 that builds an actual three-letter word in an English dictionary.

However, if instead of entering a space, the user continues to press letter keys (such as an additional Input Key 5 corresponding to the letter "n") the computer will check to see if any words in the dictionary correspond to the new combination (for example, "anen" would be converted to "anem" because 'anemic' or 'anemone' is the most likely word the user intended to enter). If the user continues to enter letters (such as Input Key 2 corresponding to the letter "S") and the partial word does not correspond to any entry in the dictionary, the computing device 920 can revert the originally input word—"anens".

Figure 18A:
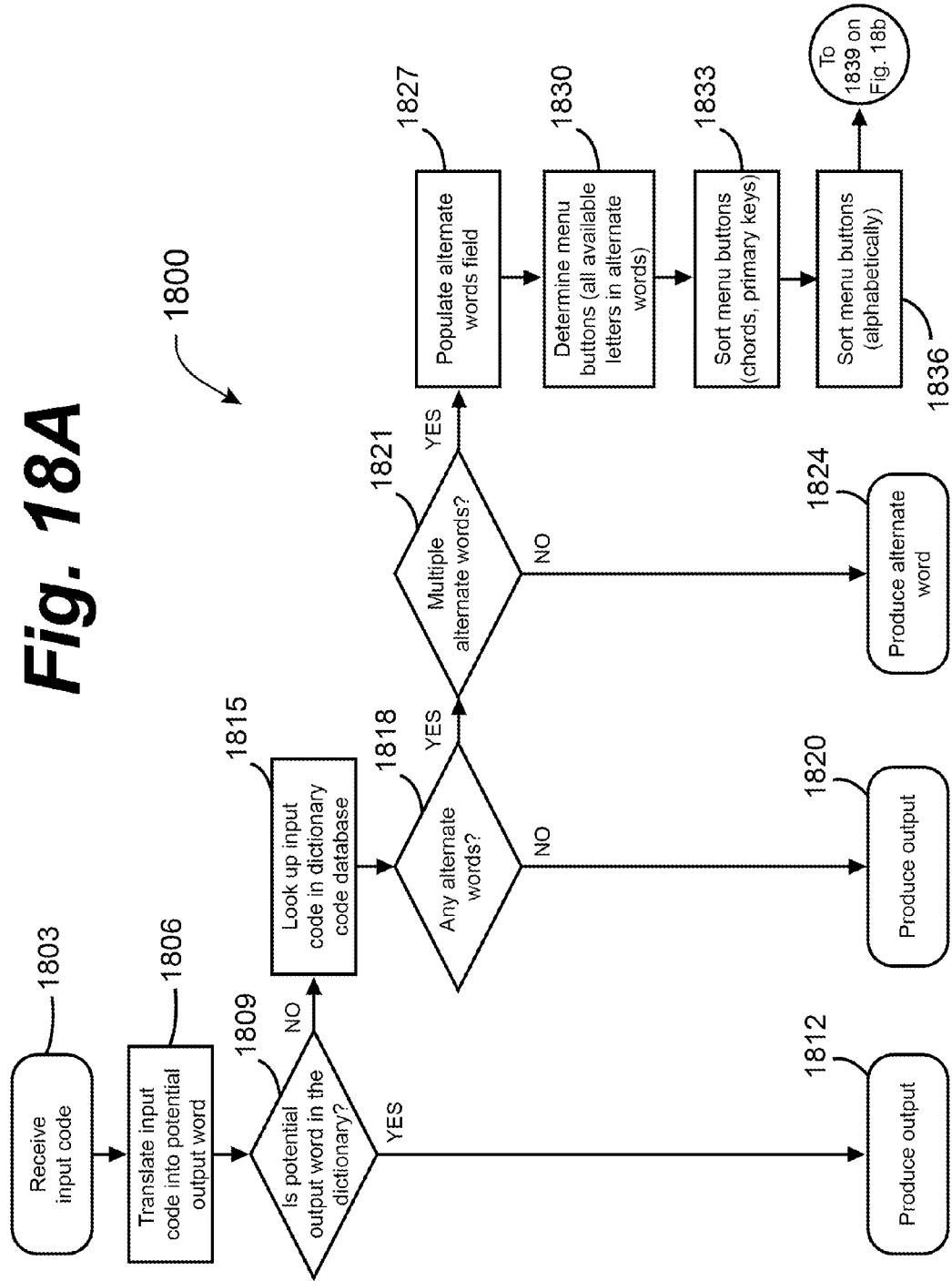
FIGS. 18A and 18B show an example process 1800 for determining menu outputs for an input code.
Figure 18B:
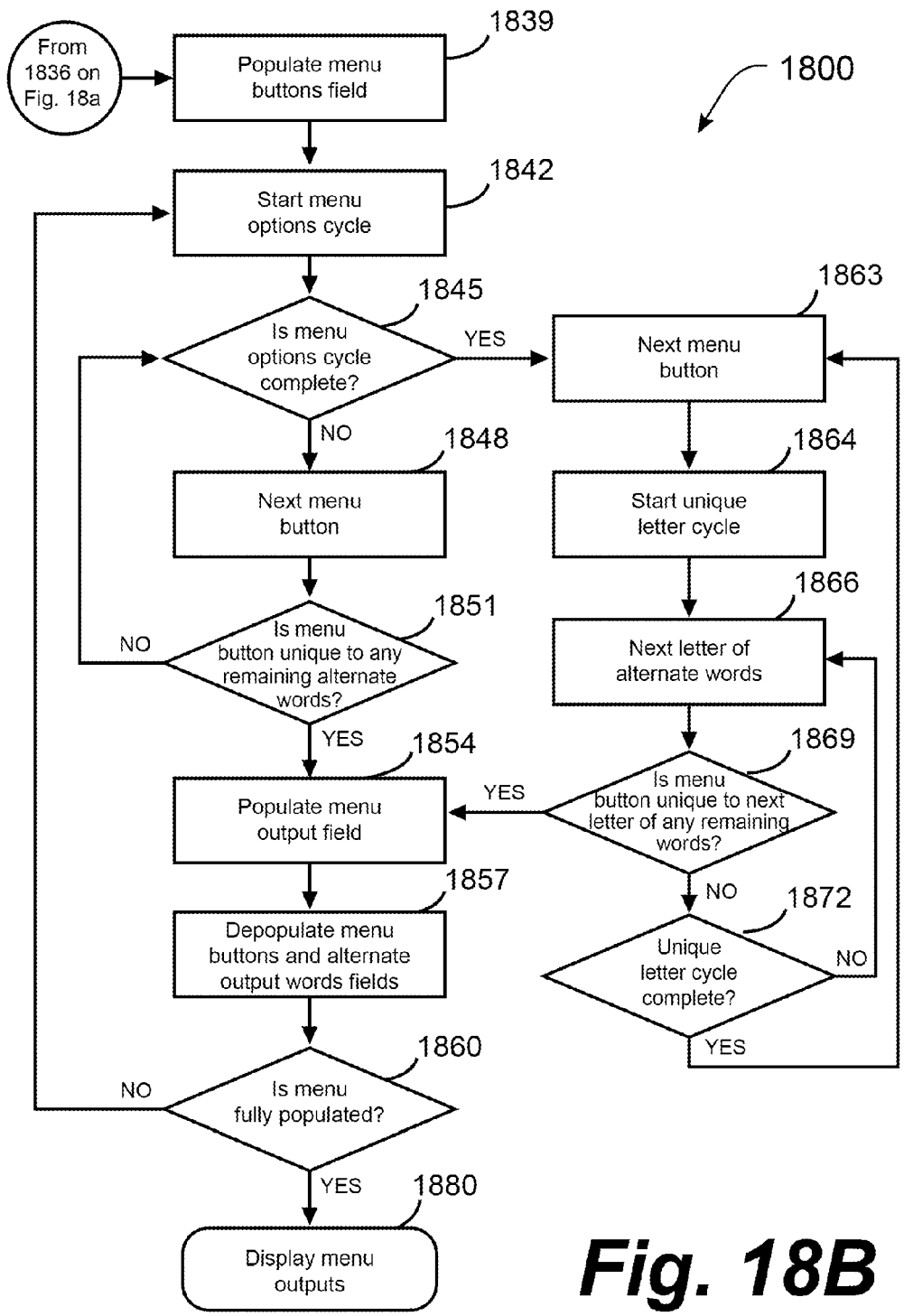

FIGS. 18A and 18B show a process 1800 for identifying an alternative word for an incorrectly or ambiguously typed word. At 1803, an input code is received from a user using a ten-key input device that ends with a space input (e.g., Input Key 0) or a punctuation character that indicates the end of a word. At 1806, the input code is translated into a potential output word that contains the letters as typed according to the map 300. At 1809, the potential output word is looked up in a word list (e.g., a list of English words found in an in English dictionary), and it is determined whether the potential output word has been typed correctly and is recognizable as a word or has been typed incorrectly or ambiguously and does not correspond directly to a recognizable word. If the word is found in the word list then the word is produced for further output or processing at 1812 such as for display on an output device. For example, if input code is 14-7-57-34-0 then the translation at 1806 produces the potential output word "four". Because "four" is recognized as a word at 1809, the word "four" (followed by a space or other punctuation character, as entered) is produced for further output or processing at 1812.

If at 1809, the potential output word is not found in the dictionary, then the process proceeds to determine at 1815 potential alternatives based on chords that a user may have failed to input. For example, if the input code is 4-7-5-4 followed by a space then the potential output word "tont" is produced. The word "tont" is not found in the word list. Potential alternatives are identified at 1815 by comparing the input code with entries in a dictionary database. The dictionary database is populated by considering all of the potential ways a user might type each word in the word list based on the user preference map that was determined during a calibration mapping process. For example, to type the word "tour" the proper (unambiguous) input code would be 4-7-57-43, but other potential input codes of 4-7-5-43, 4-7-57-4, and 4-7-5-4 might also indicate the user intended to produce this word. These potential input codes are determined for every word in the word list.

If the input code does not correspond to any of the potential alternate words in the dictionary database at 1818, the output for the potential output word (exactly as typed) is produced at 1820. This will often occur for proper names and places and acronyms that are not normally found in a standard dictionary and thus will not interrupt the typing process. If the input code corresponds to one potentially correct alternative at 1821, the alternative replaces the ambiguously entered word at 1824. However, some input codes can have multiple potential alternatives and the list of alternate words is populated at 1827. For example, the following chord combinations can be identified for the input code 4-7-5-4 and the following words corresponding to those combinations are found in a list of English words:

TABLE 14

| Word | Proper Input Code |
|---|---|
| Bout | 45-7-57-4 |
| Font | 41-7-57-43 |
| Four | 41-7-57-43 |
| Gout | 47-7-57-4 |
| Rout | 43-7-57-4 |
| Tomb | 4-7-58-45 |
| Tour | 4-7-57-43 |
| Tout | 4-7-57-4 |
| Bout | 45-7-57-4 |

Each alternative input code listed above is a chorded combination of the originally received input code 4-7-5-4. At 1830 the process determines all of the available menu buttons that are available for the user to select as an indication for their choice of the alternate words. For the above example, the menu buttons that are available are B, F, G, M, N, O, R, T, and U (all of the unique letters that are found in the alternate output words). At 1833 these output buttons are sorted into two groups—chords (any of the available letters that are formed using a two-key chord) and primary keys (any of the letters that are formed using the primary ASETNIOP home keys). At 1836 each group of menu buttons is sorted alphabetically. In the above example, the menu buttons would be sorted into the following groups: B, F, G, M, R, and U for chords, and N, O, and T for primary characters.

At 1839 the potential menu buttons are used to populate the menu buttons field. The menu options cycle, which determines which alternate output word is associated with which menu button, begins at 1842. The process then continues stepwise considering each of the buttons in the menu buttons field with the remaining list of alternate output words; it cycles through 1845 for each of the menu buttons.

In the above example, the cycle would begin by first considering the menu button B at 1848. At 1851, it is determined that this button is not unique to any of the words in the alternate output words field (both "tomb" and "bout" contain this letter), so it returns to 1845, where it is determined that the menu options cycle is not complete (only one of the nine potential menu buttons has been considered thus far). Similarly, for the next potential menu button F that is considered at 1848 is not unique to any of the words in the alternate output words field (both "font" and "four" contain this letter) so the process returns to 1845 again.

The next potential menu button G is considered at 1848 and it is determined at 1851 that only one of the alternate words, "gout" contains this letter. The menu button G is assigned to the alternate word "gout" at 1854. G is removed from the list of potential menu buttons and "gout" is removed from the list of alternate words at 1857. At 1860 it is recognized that the menu is not fully populated (the menu buttons field contains B, F, M, R, U, N, O and T and the alternate output fields word contains "bout," "font", "four," "rout," "tomb," "tour," and "tout") and the cycle begins again at 1845.

Continuing the above example, the menu button B once again passes unused through the cycle because "tomb" and "bout" are both still available in the alternate output words field (proceeding through steps 1848, and 1851 and returning to 1845). The same occurs for the menu button F, because "font" and "four" are both still available. The next menu button M is considered at 1848. This menu button is found to be unique to the word "tomb" at 1851, so the combination of M and "tomb" is assigned at 1854 and removed from the appropriate fields at 1857 and the cycle begins again.

At 1848, the menu button B is considered again. This time, since "tomb" has been assigned to the letter M and has been removed from the alternate output words field, the letter B is unique to the word "bout". This combination is paired at 1854 and 1857 and the remaining menu buttons (F, R, U, N, O, and T) and alternate words ("font", "four", "rout," "tour", and "tout") are considered at 1845.

Continuing the above example, the menu buttons F, R, and U pass unused through the cycle because none of them are unique to the remaining words (proceeding through steps 1848, and 1851 and returning to 1845 for a total of three cycles). The next menu button N is considered at 1848. This menu button is found to be unique to the word "font" at 1851, so the combination of N and "font" is assigned at 1854 and removed from the appropriate fields at 1857 and the cycle begins again.

At 1848, the menu button F is considered again. This time, since "font" has been assigned to the letter N and has been removed from the alternate output words field, the letter F is unique to the word "four". This combination is paired at 1854 and 1857 and the remaining menu buttons (R, U, O, and T) and alternate words ("rout," "tour", and "tout") are considered at 1845.

None of these menu buttons are unique to the remaining words, so the menu options cycle proceeds four times (considering each of the remaining menu buttons and finding no unique alternate words for any). Once the menu options cycle is complete at 1845, the process once again considers the next menu button R at 1863. The unique letter cycle begins at 1864, and the next letter of the remaining alternate words is considered at 1866. For the first iteration of the cycle, the first letter of each of the remaining alternate output words is considered; R for "rout," T for "tour", and T for "tout." At 1869, it is determined that the menu button R is unique to the first letter of the word "rout" and this combination is assigned at 1854 and depopulated at 1857.

Since the menu has not yet been fully populated ("tour" and "tout" remain), the menu options cycle begins again at 1845 with the remaining menu buttons U, O, and T. Once again, these are not unique to either of the remaining words, so the menu options cycle is completed without resolution and the process shifts to the unique letter cycle at 1863. At 1866 the cycle first considers the letter U and compares it to the first letter of the remaining words at 1869 (T for "tour" and T for "tout"), but the letter is not unique to the first letter of the remaining words. Since the unique letter cycle is not complete (at 1872) the next letter of the alternate words is considered at 1866 (O for "tour" and O for "tout"). Once all four words in the cycle have been considered, the cycle proceeds to 1863 and the next menu button O is considered. Once again, the cycle fails to deliver resolution, so the last menu button T is considered. In the fourth cycle, when considering the fourth letter of each word (R for "tour" and T for "tout") a unique match is finally made, so the menu button T is assigned to the word "tout".

During the final cycle, the next menu button U is associated with the word "tour" and the menu is determined to be fully populated at 1860. The menu options are then displayed at 1880 (as shown in FIG. 17).

Various ten-key input devices can be used with the ten-key input techniques described above. For example, a traditional QWERTY keyboard can be used as a ten-key input device. Ten of the keys on the QWERTY keyboard can be assigned as Input Keys 0-9. For example Input Keys 1-8 can be assigned to "A", "S", "D", "F", "J", "K", "L", and ";". Input Key 0 can be assigned to the space bar. And, Input Key 9 can be assigned to any or all of the V, C, B, N, or M keys.

Figure 19:
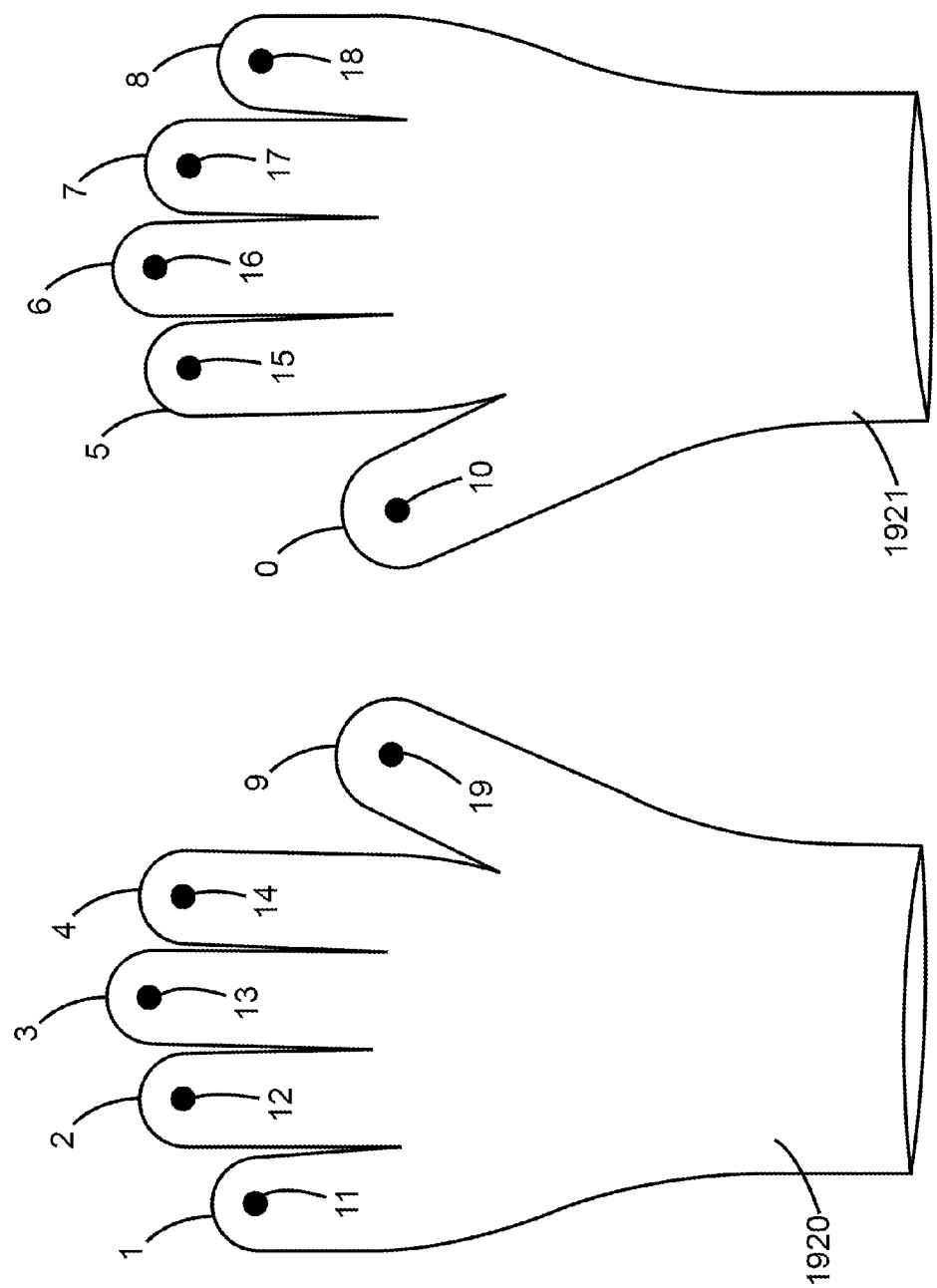
FIG. 19 shows an example ten-key input device in the form of gloves.

In some implementations a glove can be worn that has sensors for receiving typing input from the ten fingers on the right and left hands. For example, FIG. 19 shows a left glove 1920 and a right glove 1921 with fingers 0-9. Each finger has a pressure sensor (10 ... 19) for sensing a press and a release on a surface with each finger. A single action input with finger 1 can be performed by pressing and releasing the finger 1. A chord can be input by pressing two fingers simultaneously and then releasing one or both of the two fingers. In some examples, sensors 10-19 can be motion sensors (e.g., accelerometers) for detecting the motion of the fingers. The left glove 1920 and the right glove 1921 can be included in an astronaut suit, an underwater diving suit, or a radiation suit.

A ten-finger input device can be included on a right and left joystick with keys or other sensors on the joysticks for receiving input from each of the ten fingers. For example, an airplane pilot yoke can be configured to receiving typing input from the ten fingers on the left and right hands such as by pressure sensors. In some examples, a sensor can be implanted on each of the fingers of the right and left hands to detect typing motion.

Figure 20A:
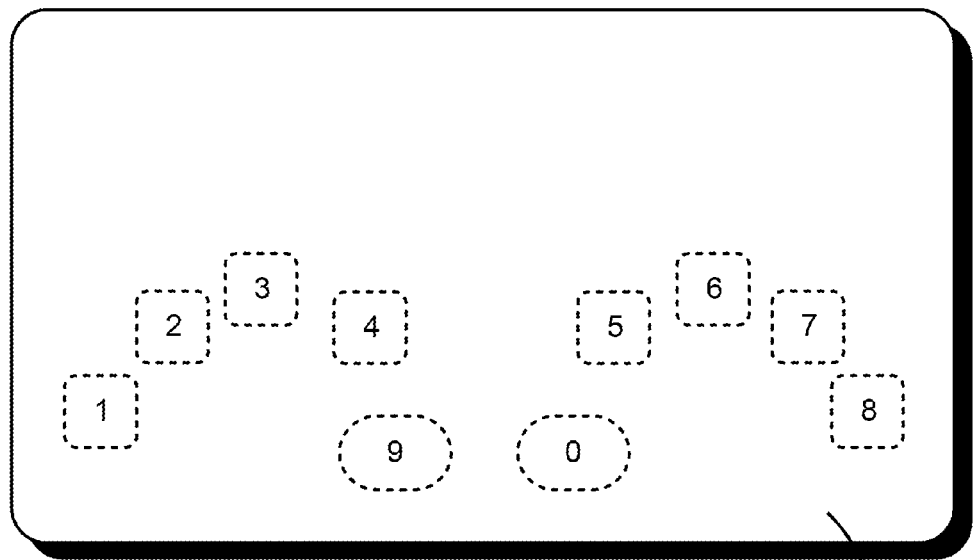
FIGS. 20A and 20B show a touch screen configured to receive input with ten-keys.

FIG. 20A shows a touchscreen device 2000. The touch screen device has ten areas, (area 0, area 1, . . . area 9) for receiving touch input from each of the ten fingers 0-9. Each of the ten areas can corresponding to an Input Key 0-9 described above. To provide input, a user can press and release on one or more of the ten areas. In some examples, the touch screen can be configured to detect the ten areas. A user can be prompted to place his ten fingers on the touch screen. The touch screen can sense the ten fingers and define an area for each of the ten fingers. For example, in FIG. 20A, each of the ten areas can be defined by the user placing his ten fingers on the touch screen.

Figure 20B:
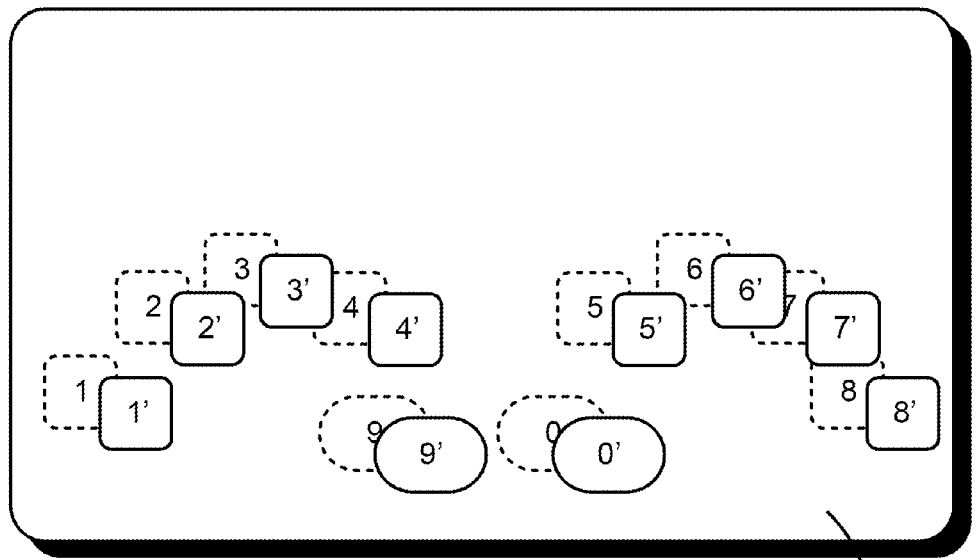

In some examples, as the user types on the ten areas 0-9, the touch screen can sense drift in the ten fingers. For example, if the user begins to gradually shift to the right with one or both hands, the touch screen can dynamically redefine the areas. FIG. 20B shows the ten areas 0-9 redefined as areas 0', 1', 2' . . . 9' shifted to the right.

In some examples, each area recalibrates each time the user types with the corresponding finger for that area. For example, the center of each of the ten areas can be relocated to the center of a press received from the corresponding finger. Also, as one area for one hand begins to drift, other areas can drift in response because as one finger drifts the other fingers on the same hand are likely to drift in the same direction.

Ten finger input devices can be used in various contexts such as on a steering wheel, operating equipment, weapons, television remote, etc. In some examples, an infrared device can use an infrared sensor for sensing 3-d motion of the ten fingers. Typing motion can be performed on a surface or in space. The infrared sensor senses a downward movement of a finger with respect to the other fingers as a press and an input key is activated. When the infrared sensor detects an upward movement of the finger, the activation of the input key is released. Such an infrared sensor can be included on mobile device such as a cellular phone, a pda, a remote control, or the like.

Figure 21:
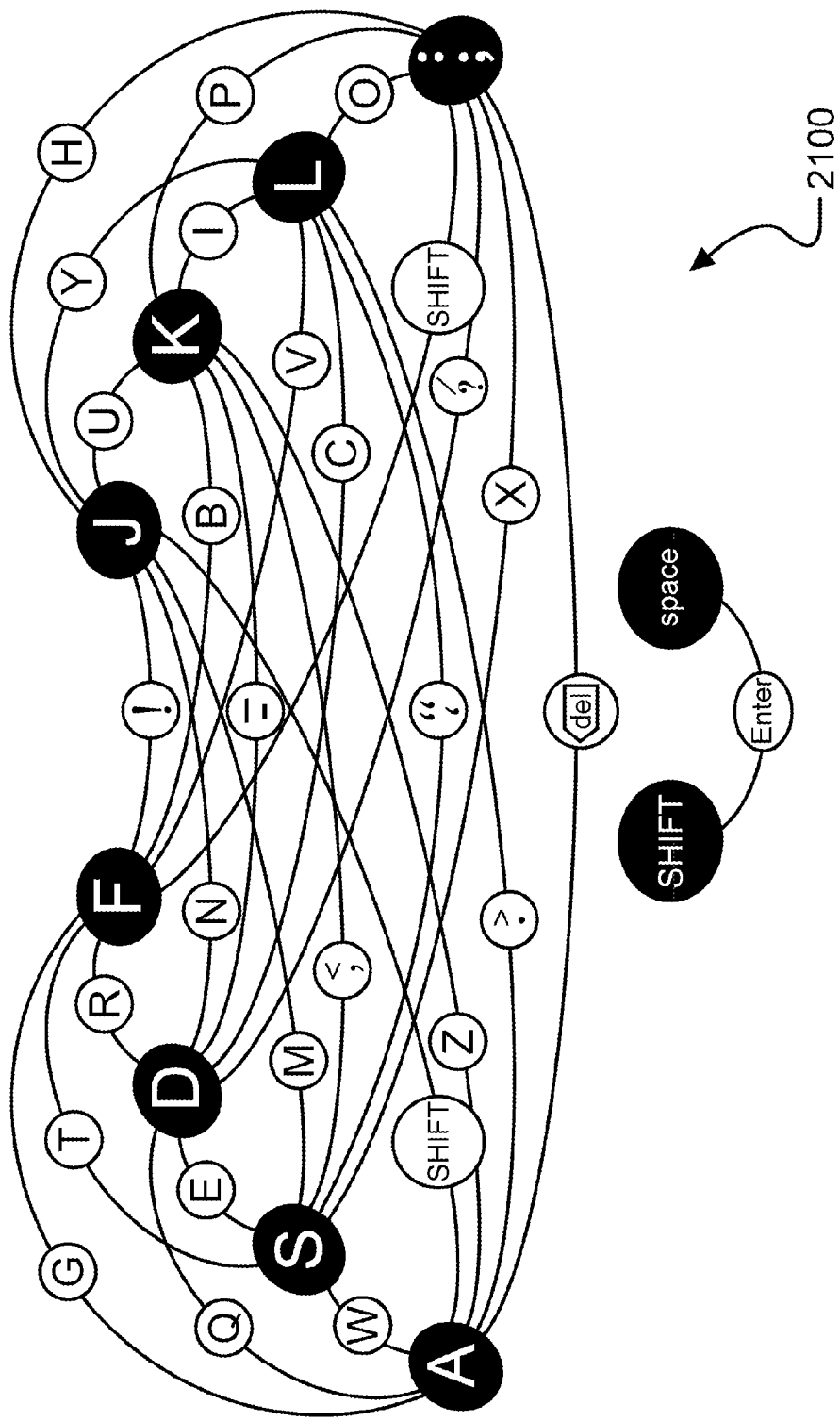
FIG. 21 shows a graphical depiction of at least a portion of an example of a map.
Figure 22:
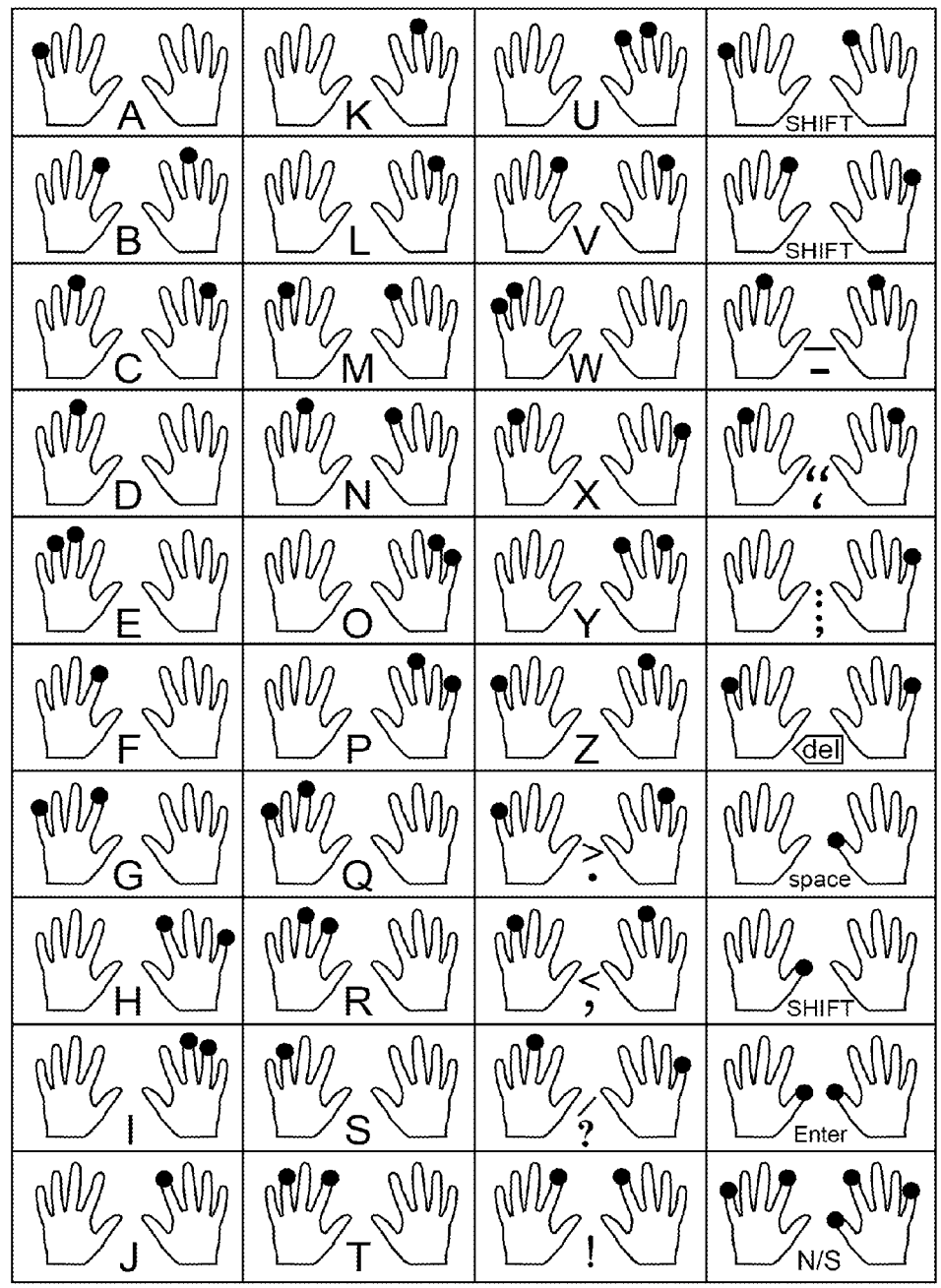
FIG. 22 shows a graphical depiction of examples of combinations of typing inputs and corresponding outputs.
Figure 23:
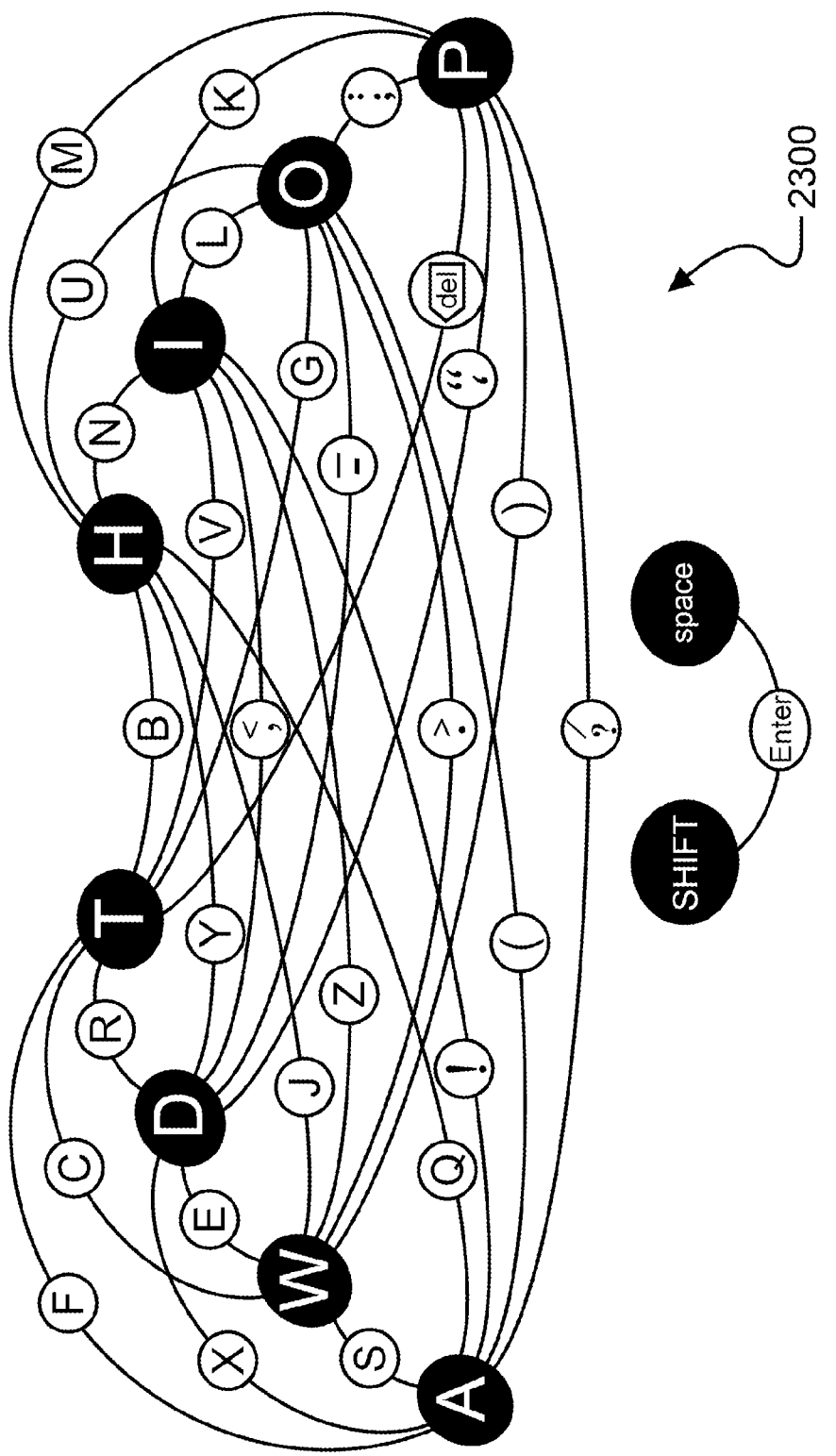
FIG. 23 shows a graphical depiction of at least a portion of an example of a map.
Figure 24:
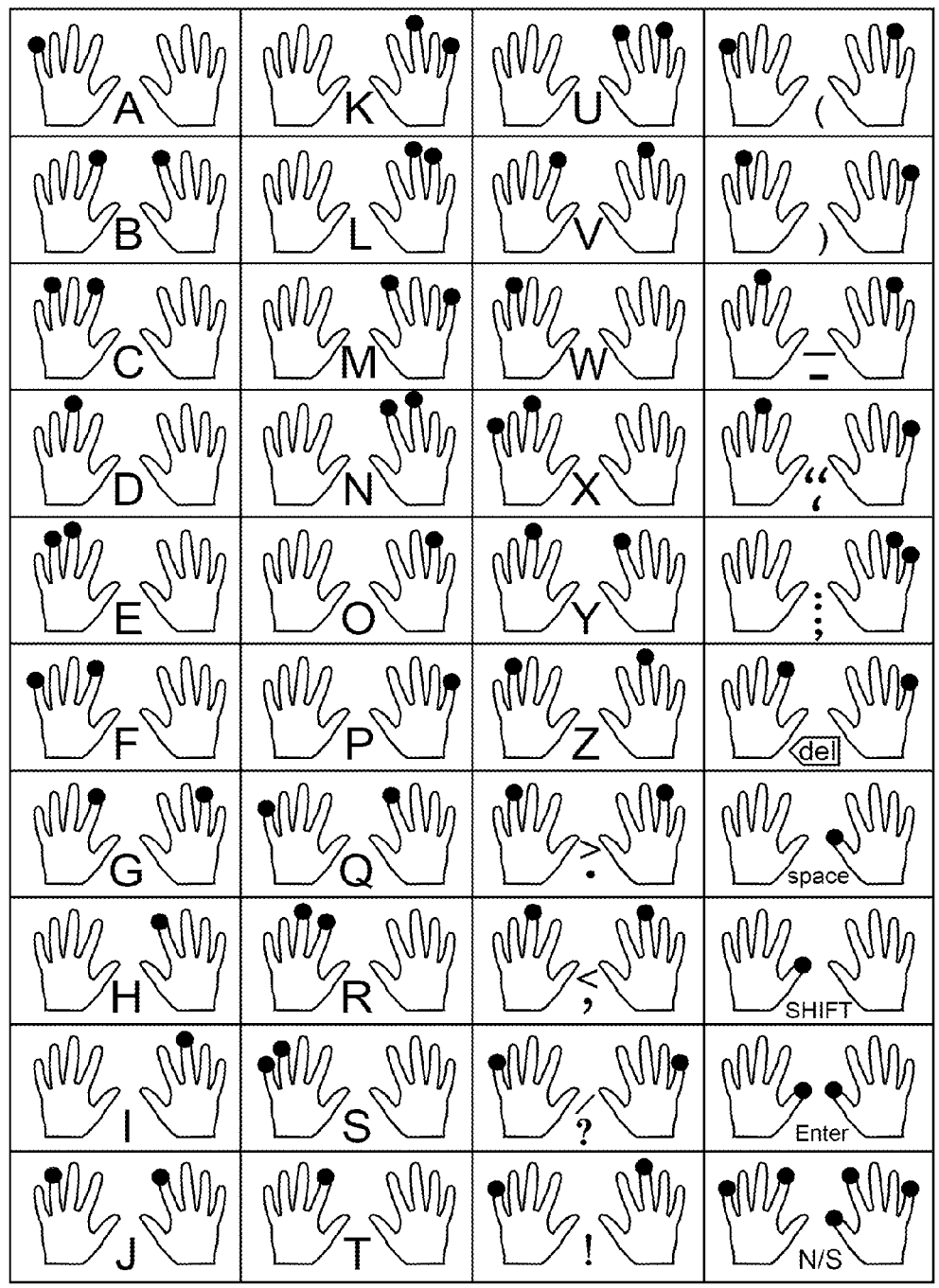
FIG. 24 shows a graphical depiction of examples of combinations of typing inputs and corresponding outputs.
Figure 25:
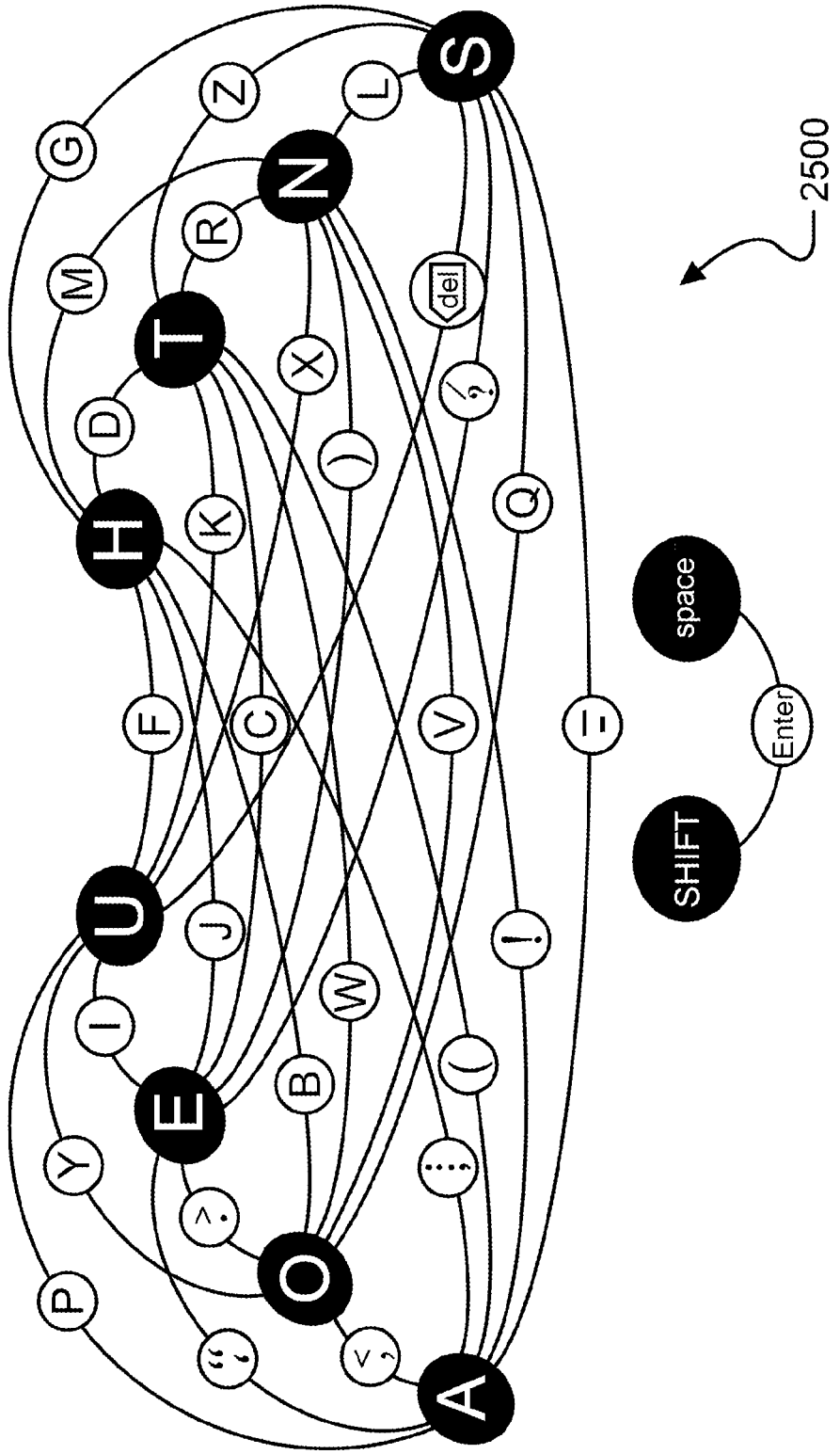
FIG. 25 shows a graphical depiction of at least a portion of an example of a map.
Figure 26:
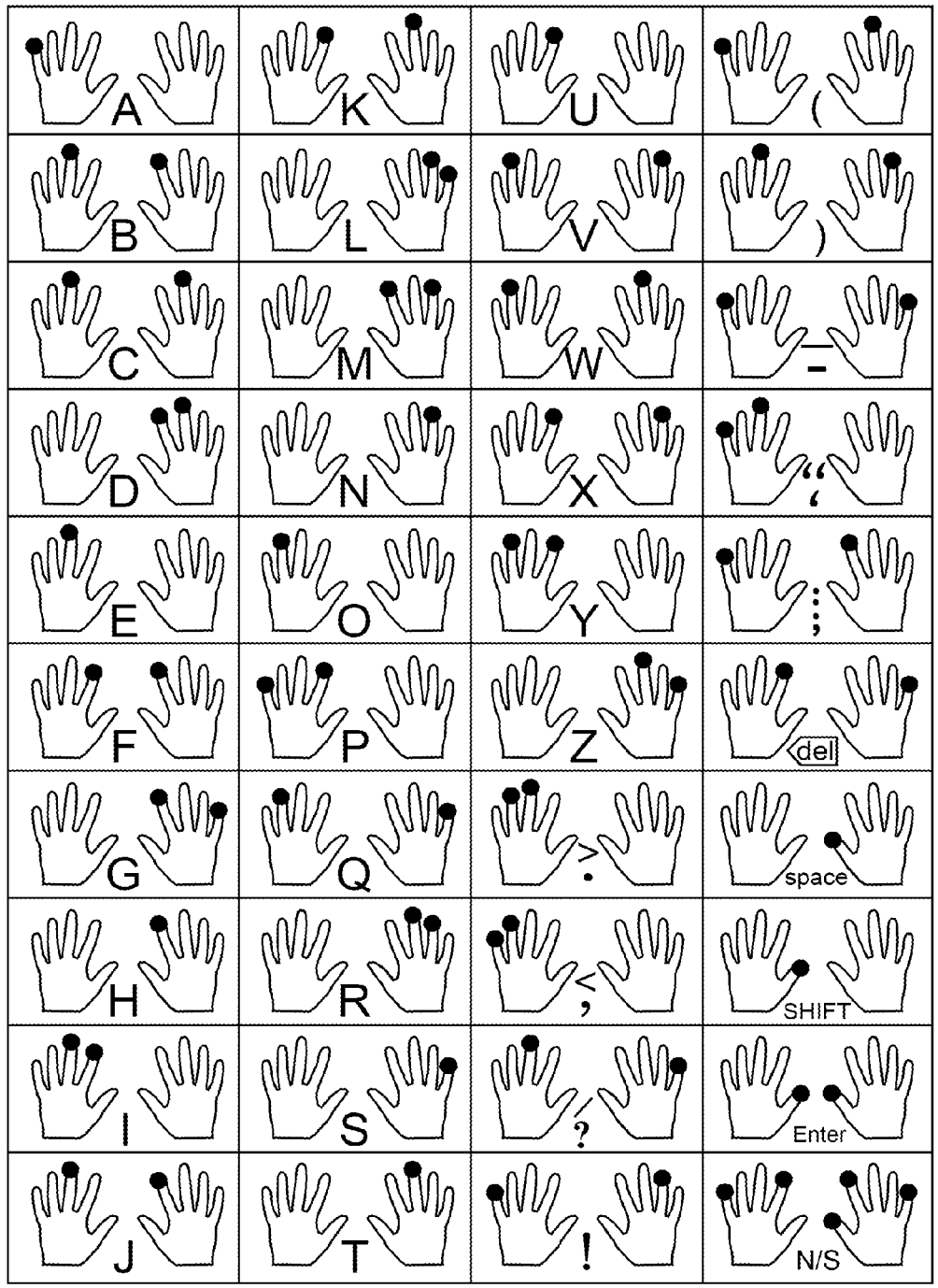
FIG. 26 shows a graphical depiction of examples of combinations of typing inputs and corresponding outputs.
Figure 27:
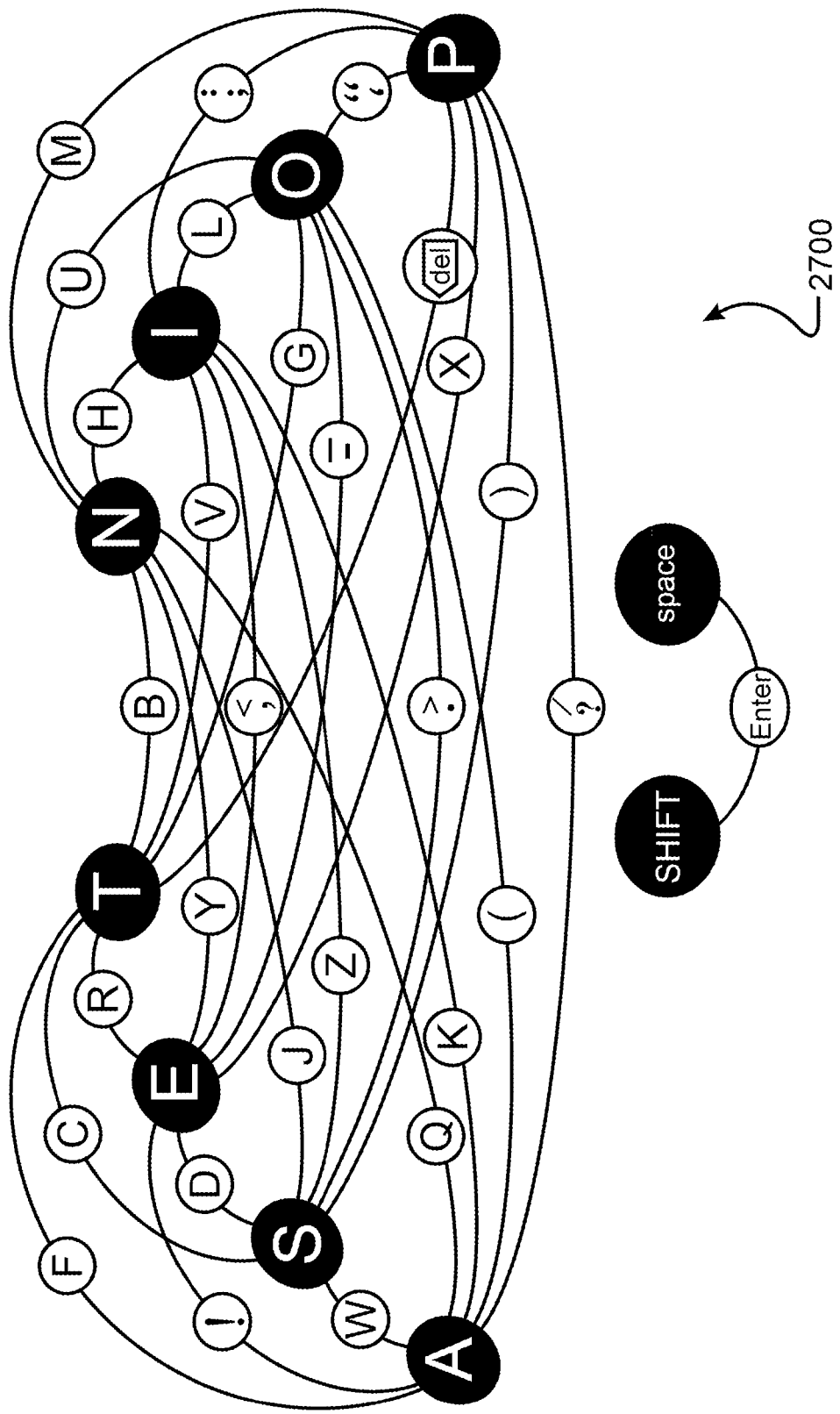
FIG. 27 shows a graphical depiction of at least a portion of an example of a map.
Figure 28:
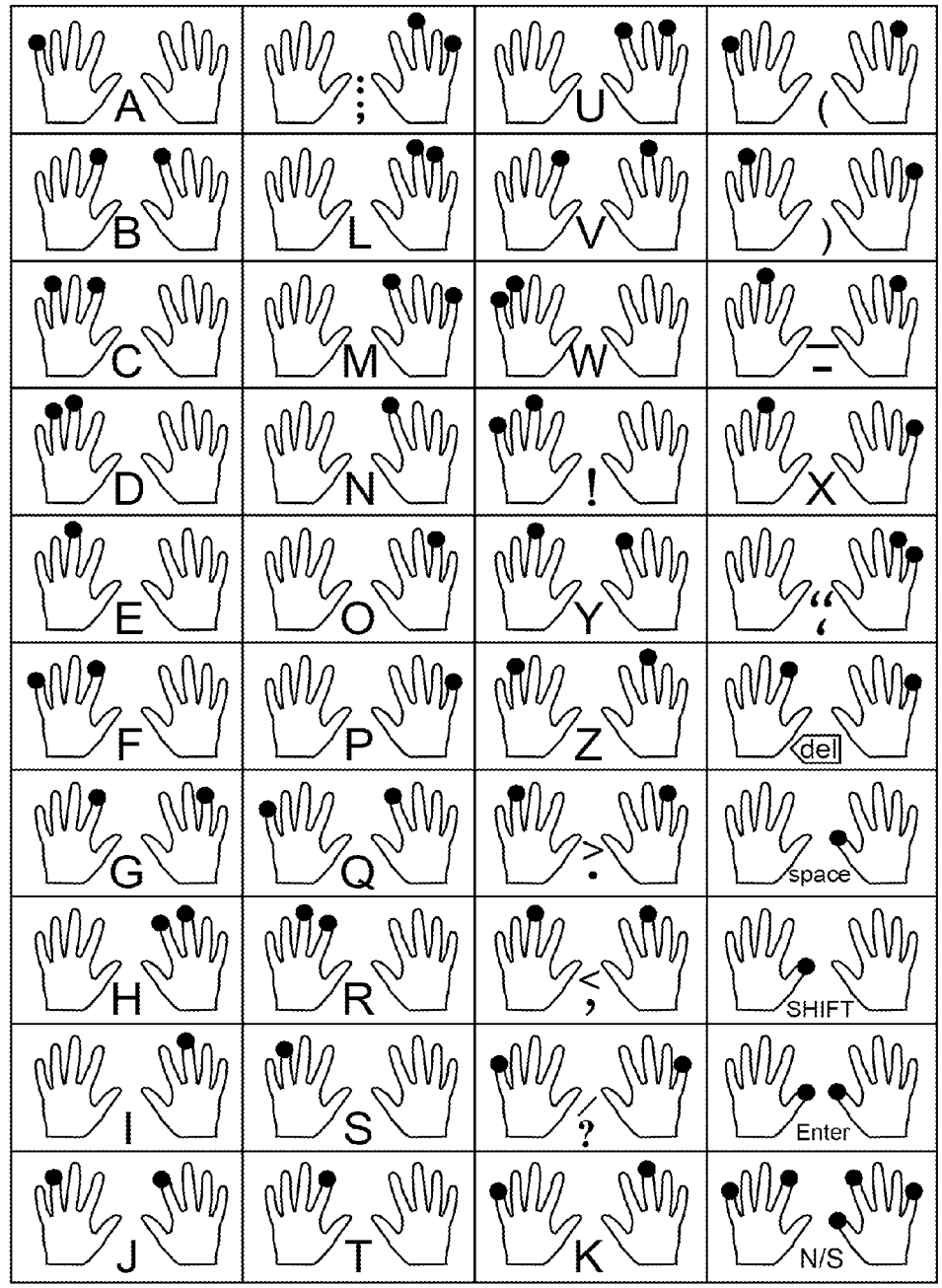
FIG. 28 shows a graphical depiction of examples of combinations of typing inputs and corresponding outputs.

FIGS. 21-44 show examples of several additional maps. A map 2100 and a graphical depiction 2200 are shown in FIG. 21 and FIG. 22, respectively, and are based on an original QWERTY layout, using ASDF and JKL; as primary keys. Another example is a map 2300 and a graphical depiction 2400, which are shown in FIG. 23 and FIG. 24, respectively, and use the letters AWDT and HIOP as the primary input keys. These are based on the most commonly used first letter of words; for example, W is not a particularly common letter, but words that begin with W occur more frequently than words that begin with S. Another example is a map 2500 and a graphical depiction 2600, which are shown in FIG. 25 and FIG. 26, respectively, and are based on the Dvorak simplified keyboard layout, using the letters AEOU and HTNS as the primary keys. Another example is a map 2700 and a graphical depiction 2800 shown in FIG. 27 and FIG. 28, which includes alternate formulations of the X, K, exclamation point, apostrophe, and semicolon chords.

Figure 29:
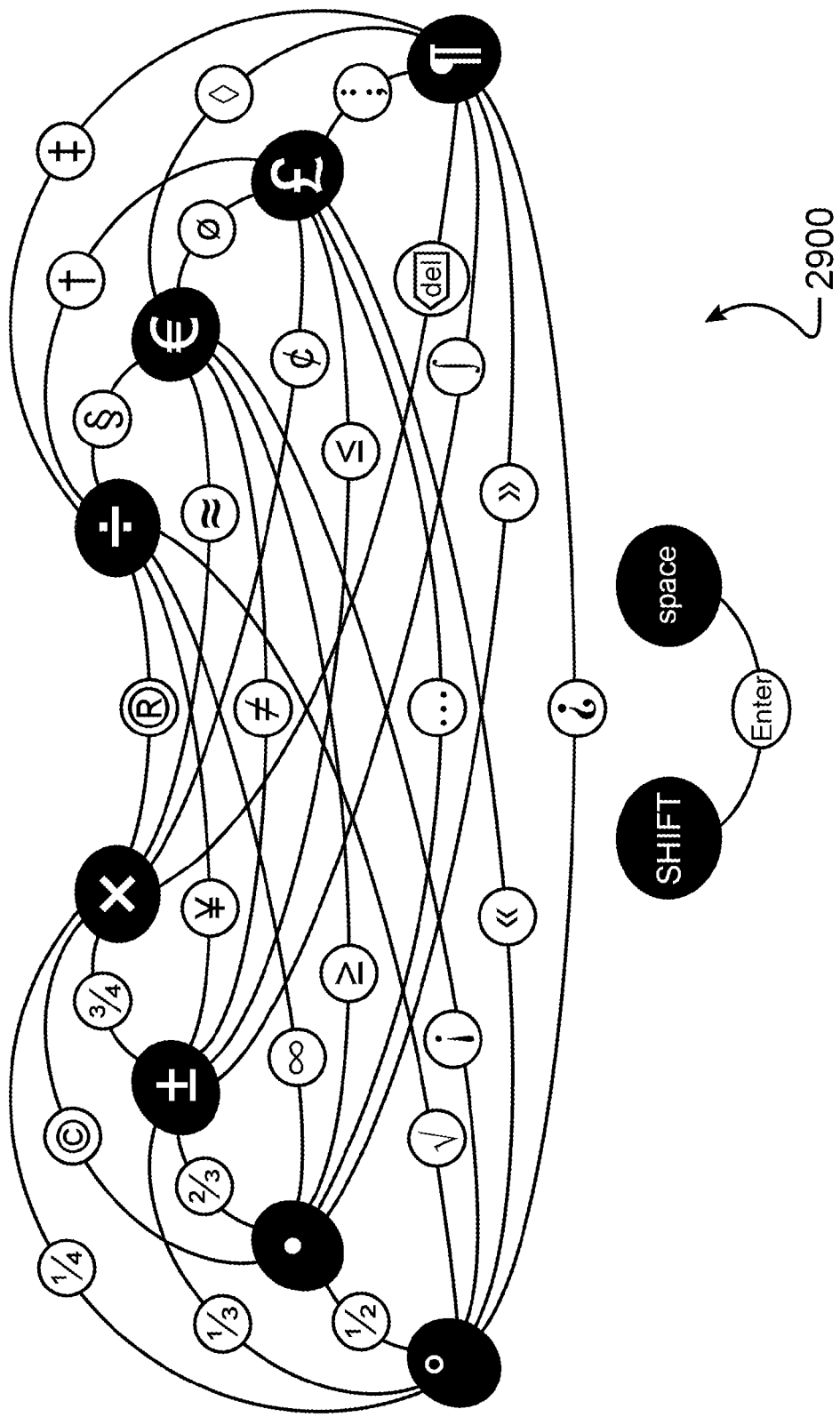
FIG. 29 shows a graphical depiction of at least a portion of an example of a map.
Figure 30:
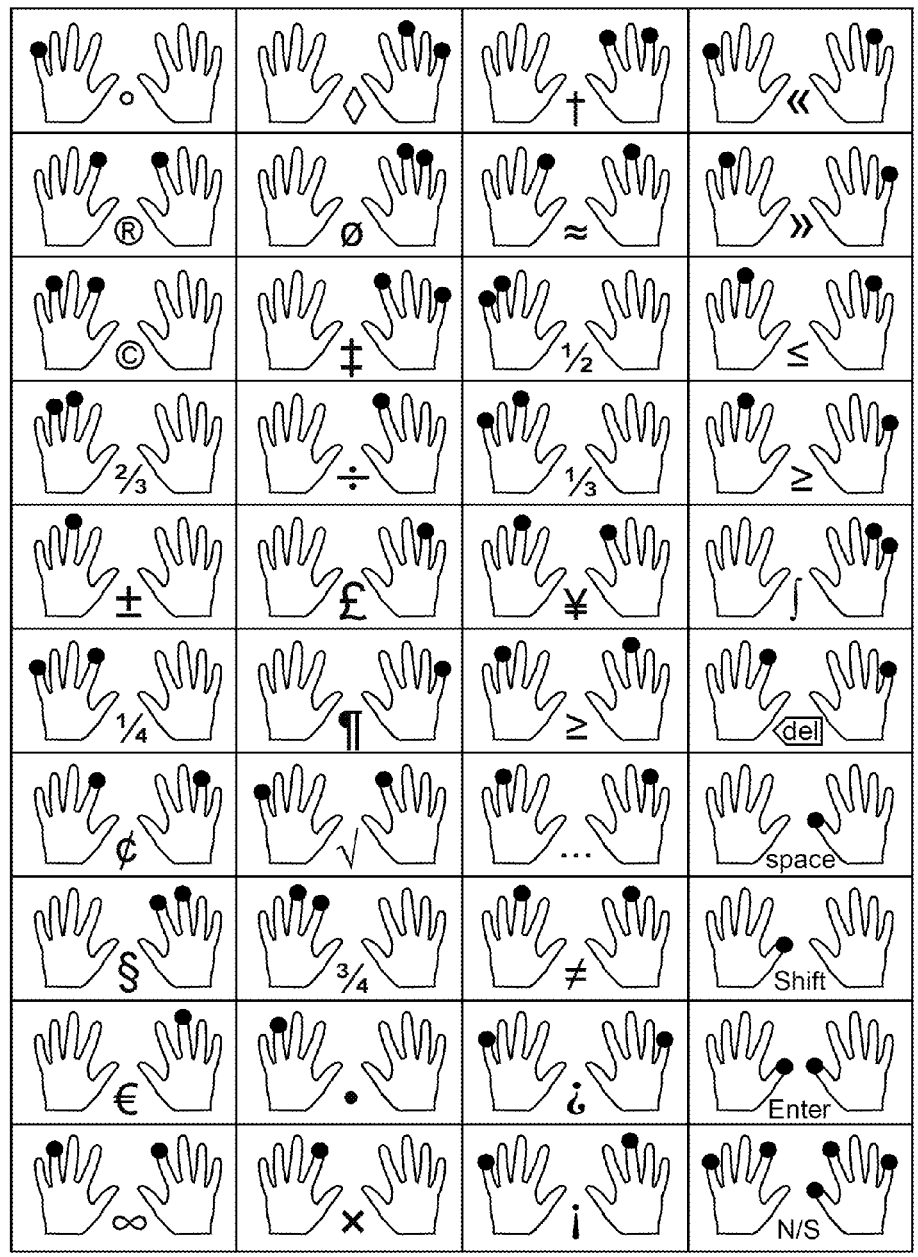
FIG. 30 shows a graphical depiction of examples of combinations of typing inputs and corresponding outputs.
Figure 31:
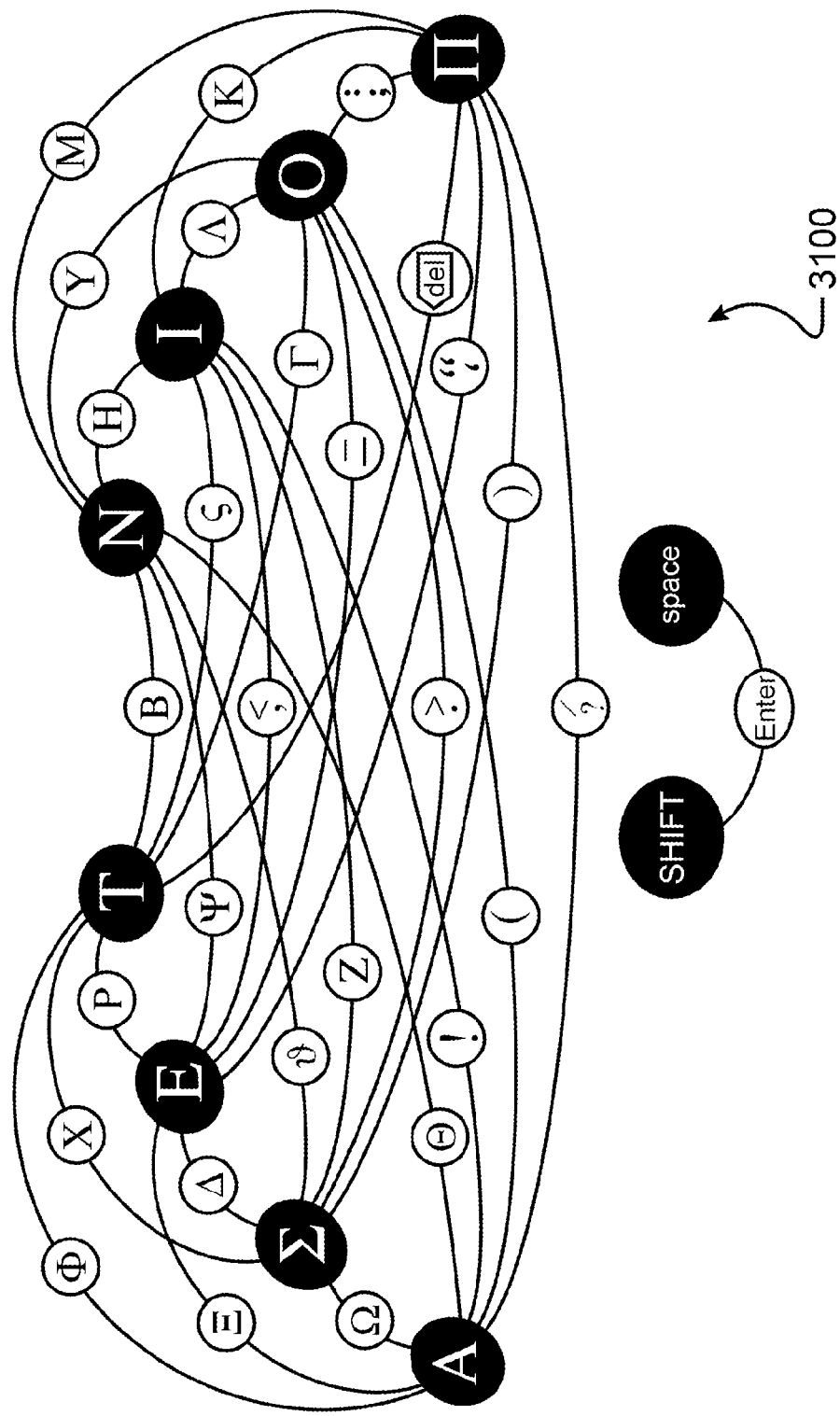
FIG. 31 shows a graphical depiction of at least a portion of an example of a map.
Figure 32:
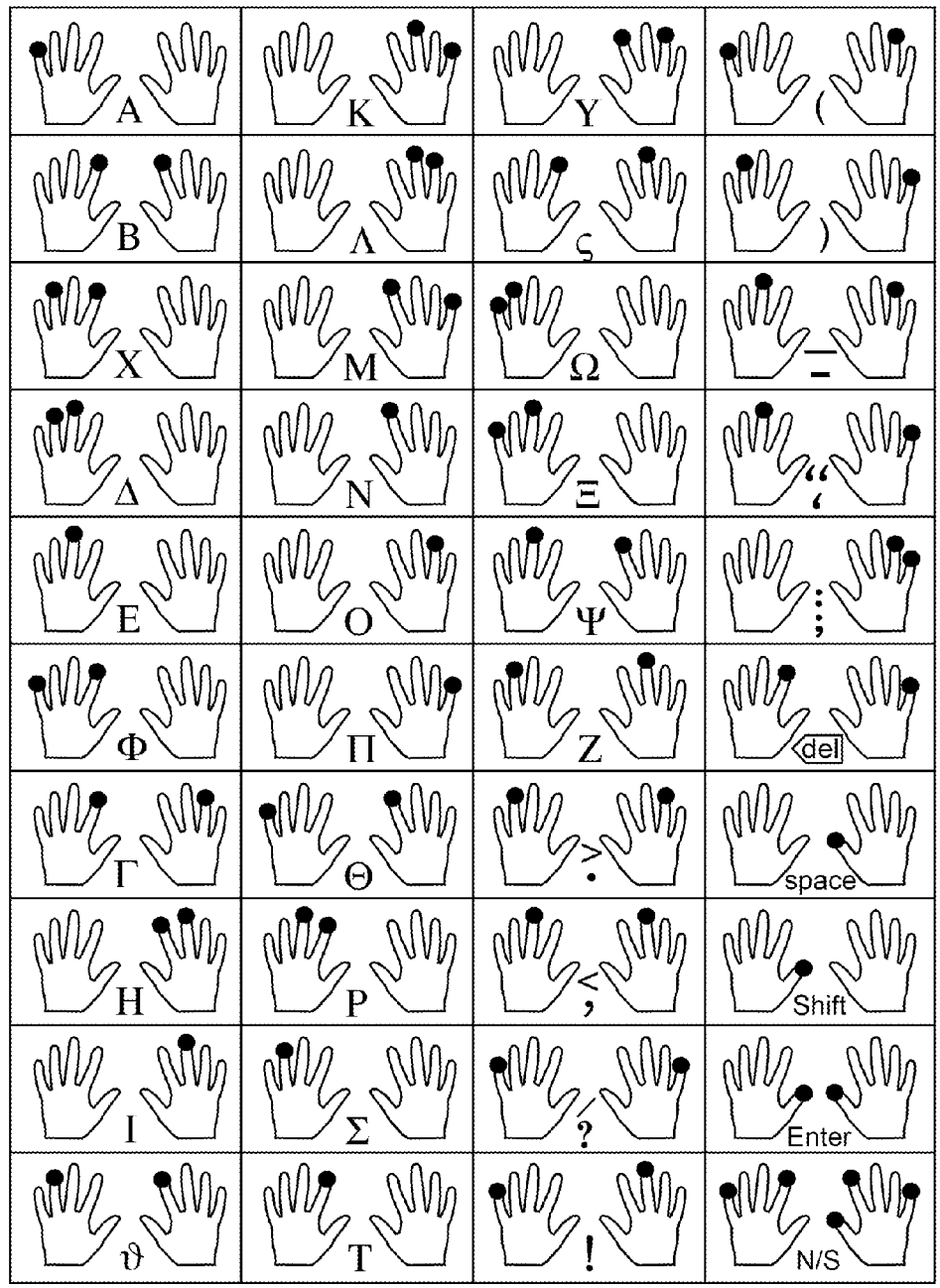
FIG. 32 shows a graphical depiction of examples of combinations of typing inputs and corresponding outputs.
Figure 33:
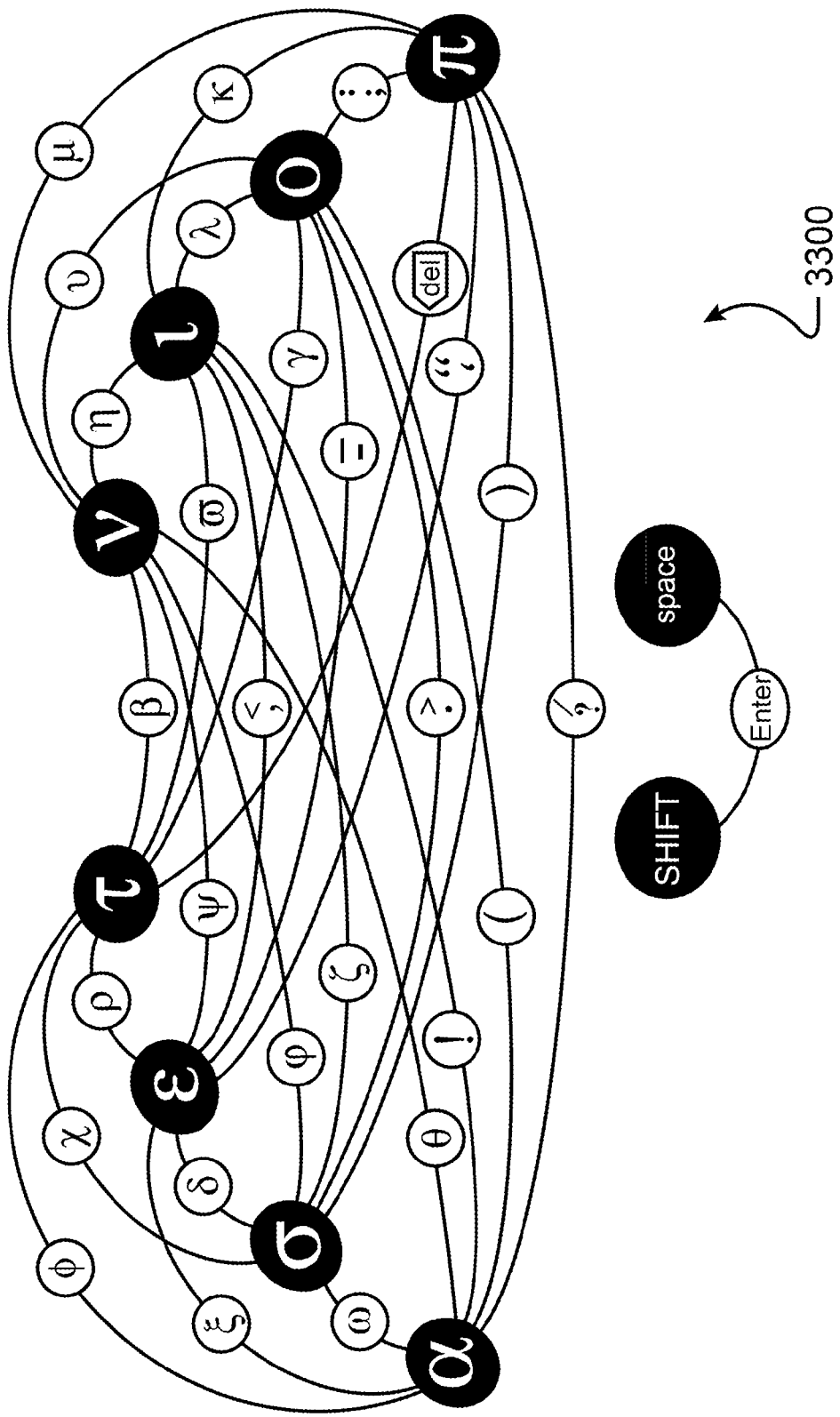
FIG. 33 shows a graphical depiction of at least a portion of an example of a map.
Figure 34:
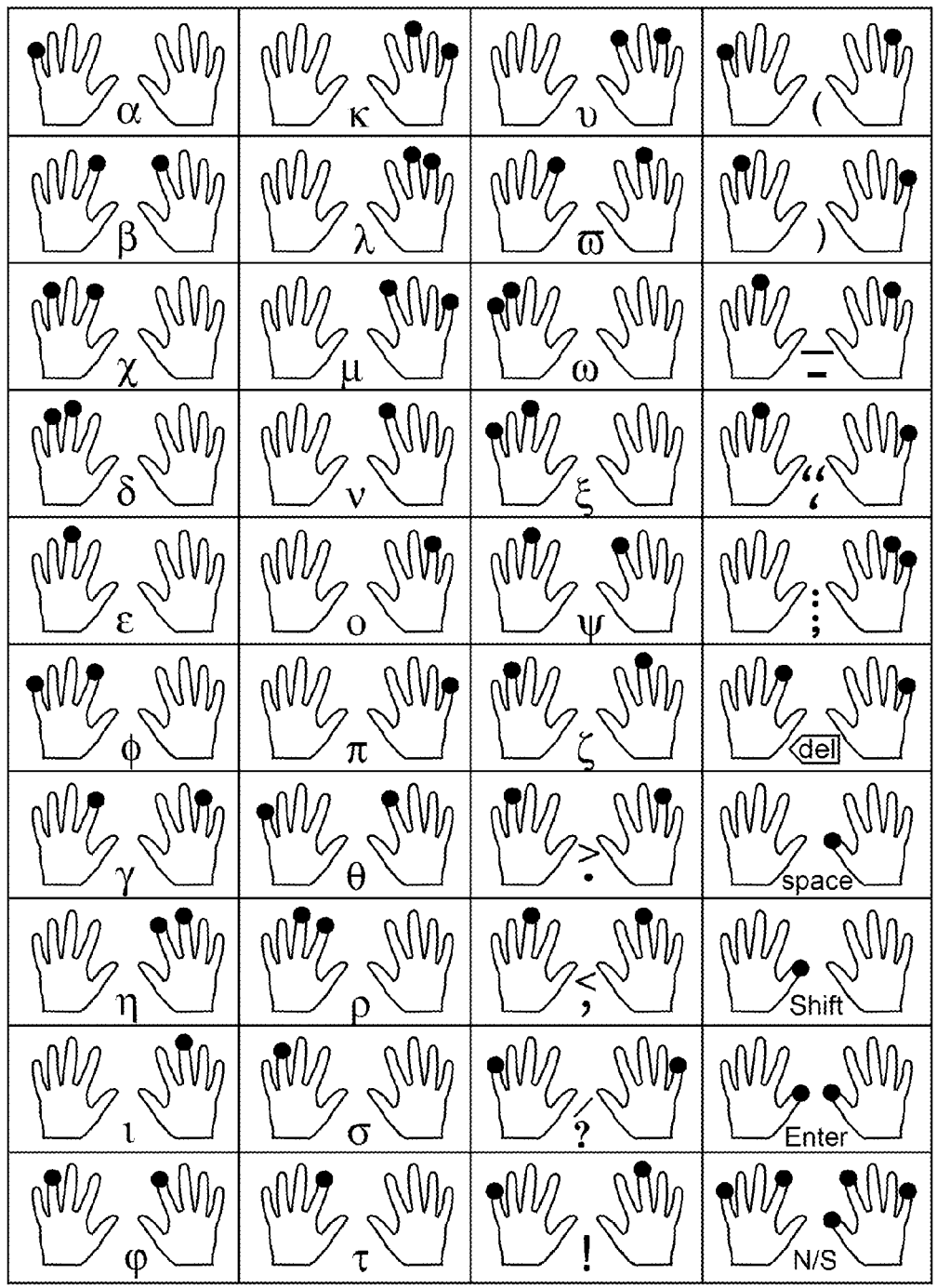
FIG. 34 shows a graphical depiction of examples of combinations of typing inputs and corresponding outputs.
Figure 35:
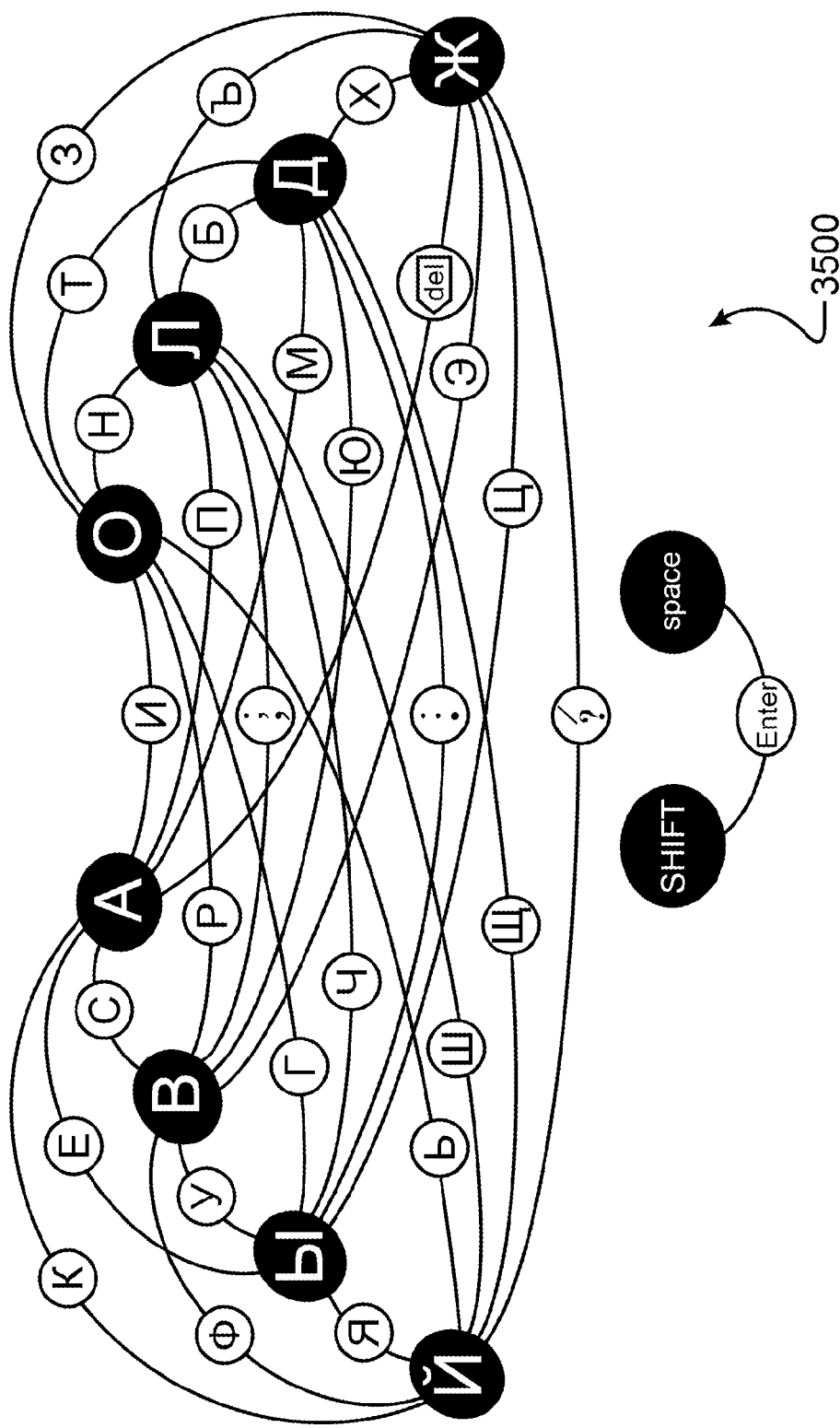
FIG. 35 shows a graphical depiction of at least a portion of an example of a map.
Figure 36:
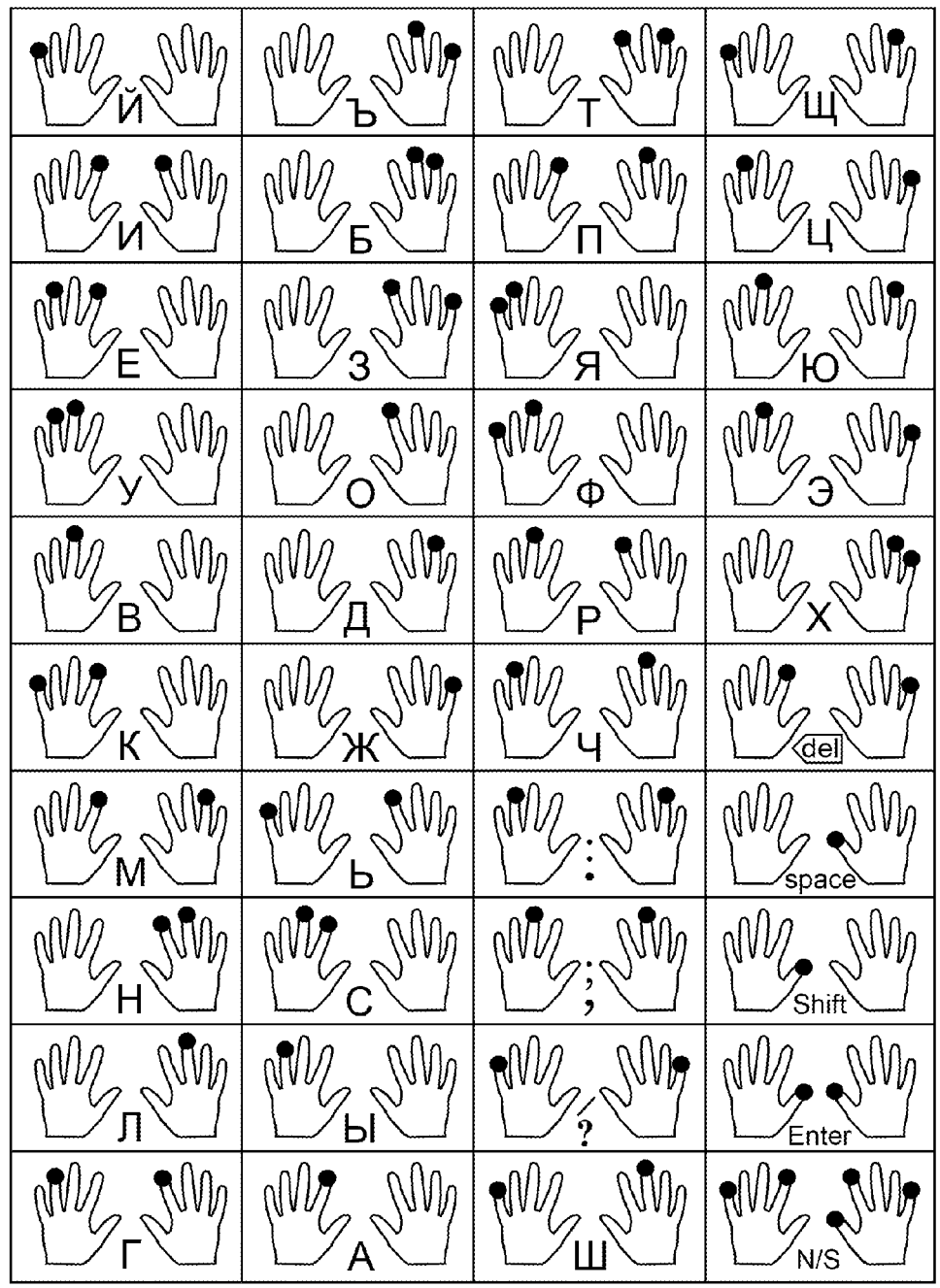
FIG. 36 shows a graphical depiction of examples of combinations of typing inputs and corresponding outputs.
Figure 37:
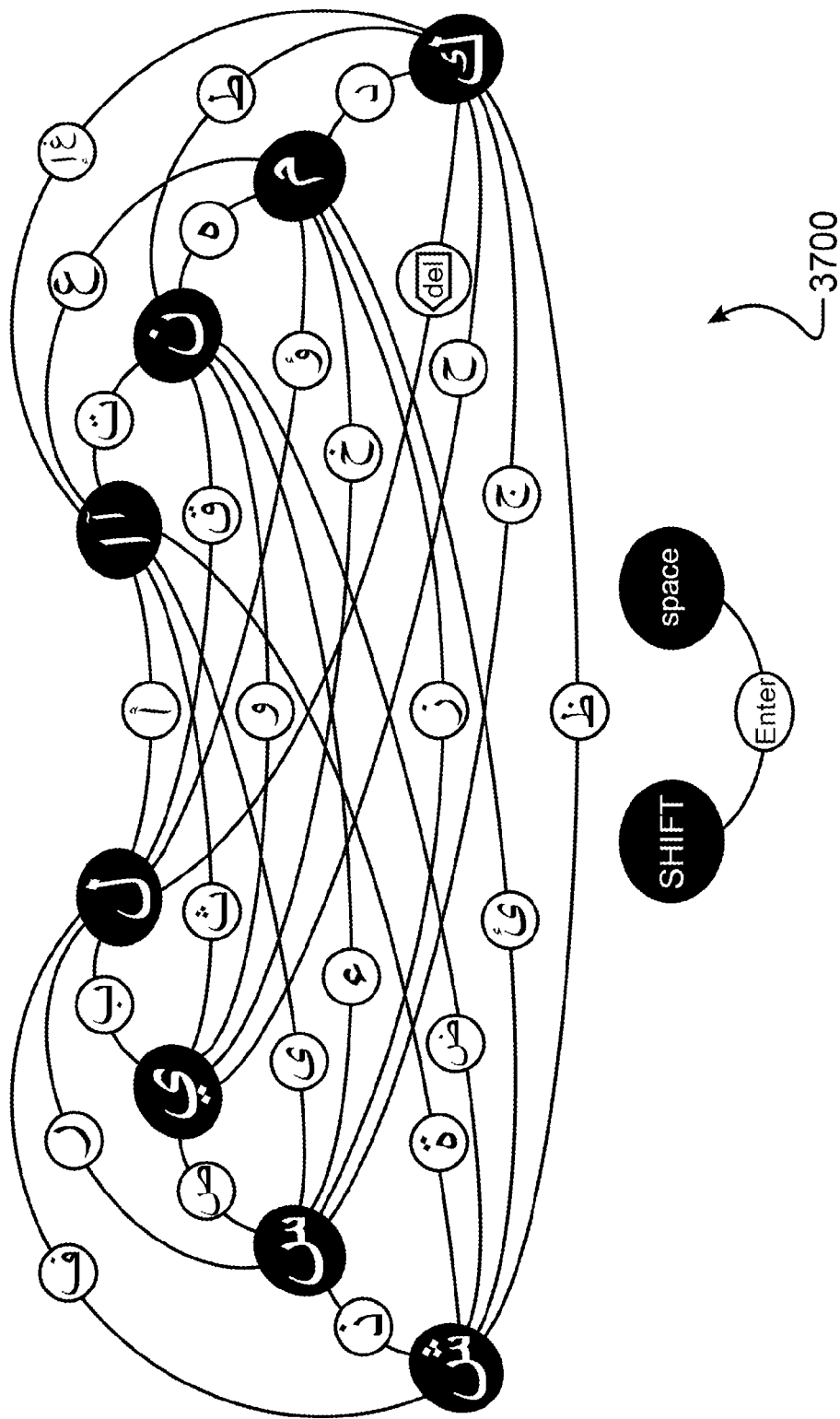
FIG. 37 shows a graphical depiction of at least a portion of an example of a map.
Figure 38:
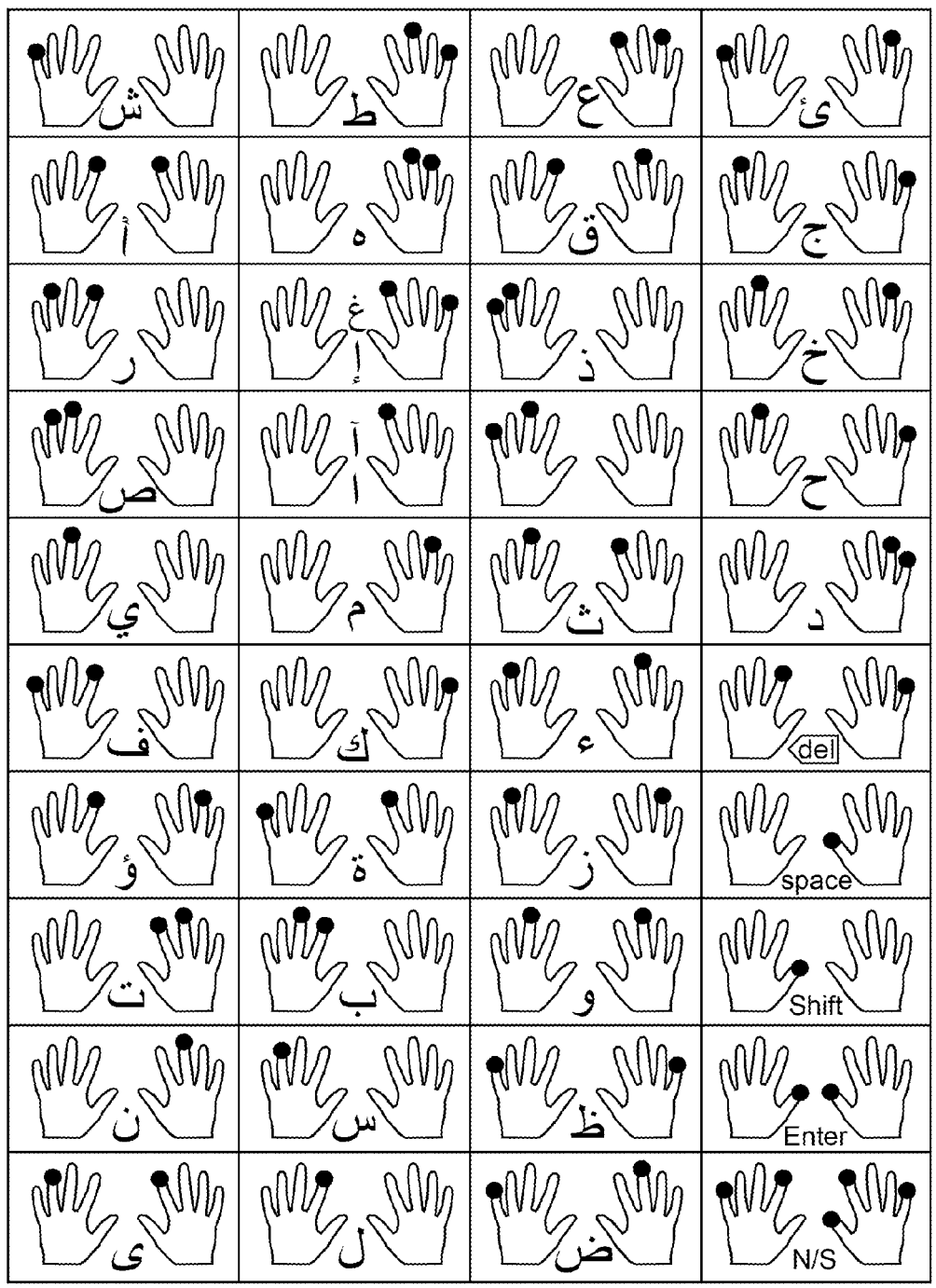
FIG. 38 shows a graphical depiction of examples of combinations of typing inputs and corresponding outputs.
Figure 39:
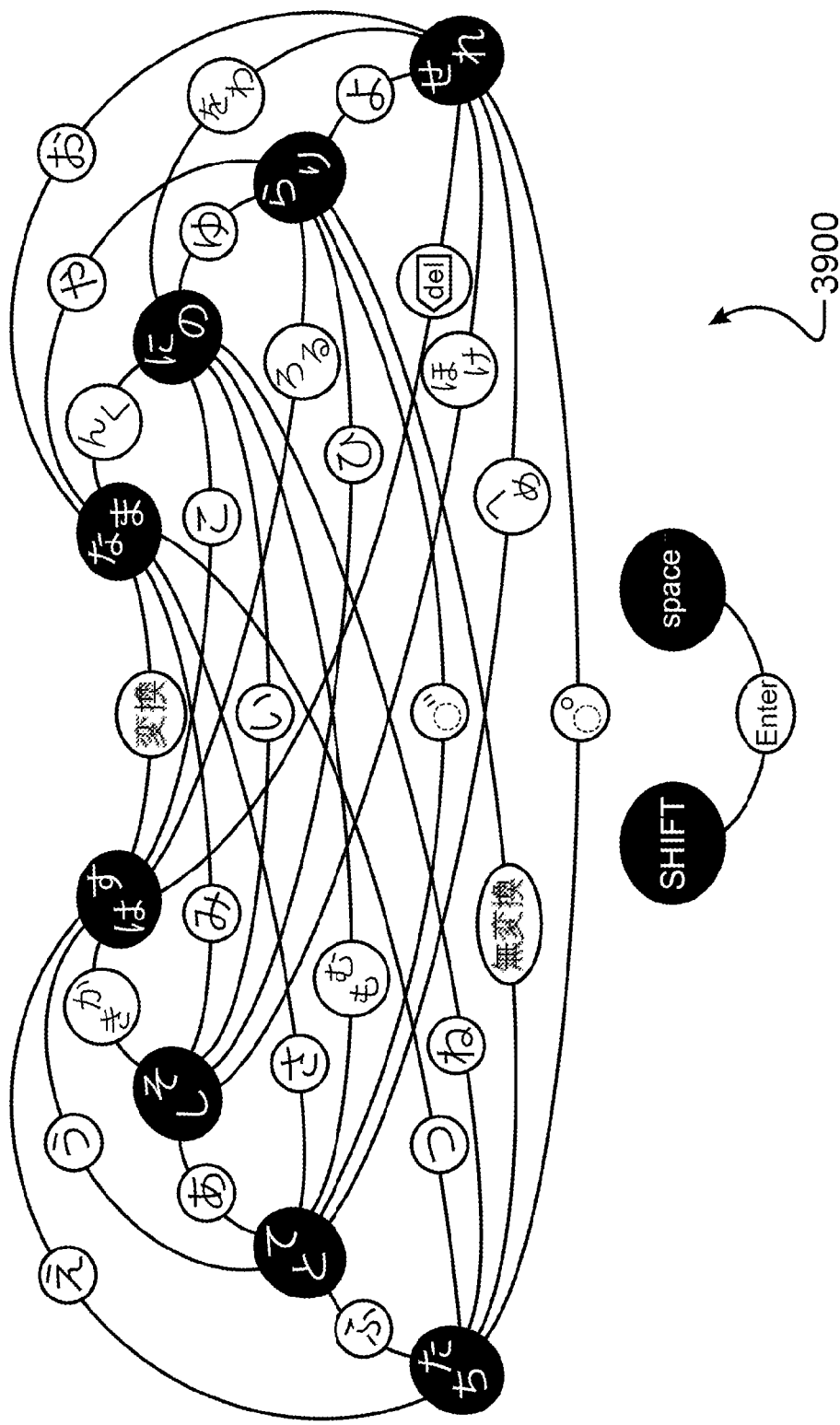
FIG. 39 shows a graphical depiction of at least a portion of an example of a map.
Figure 40:
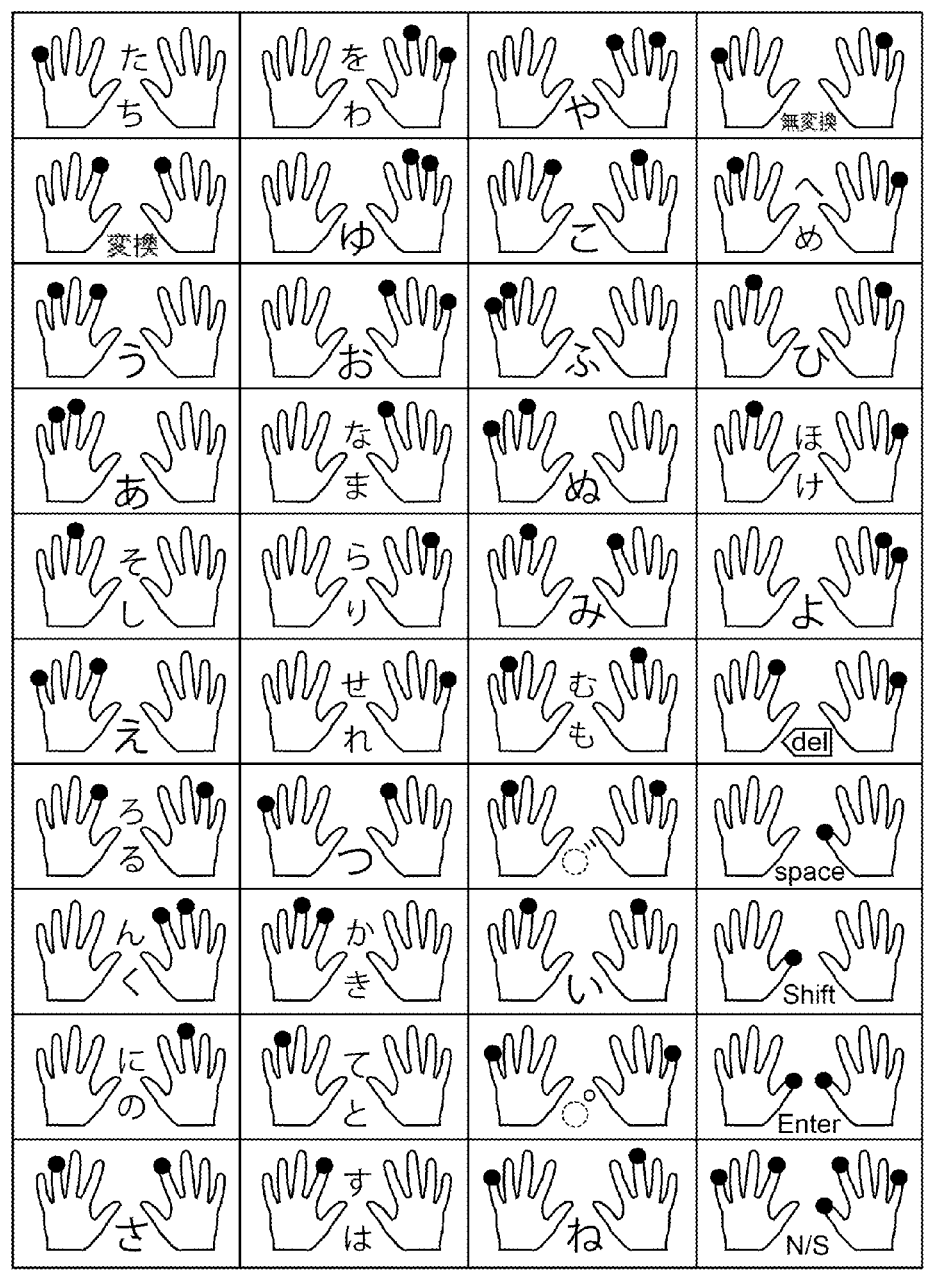
FIG. 40 shows a graphical depiction of examples of combinations of typing inputs and corresponding outputs.
Figure 41:
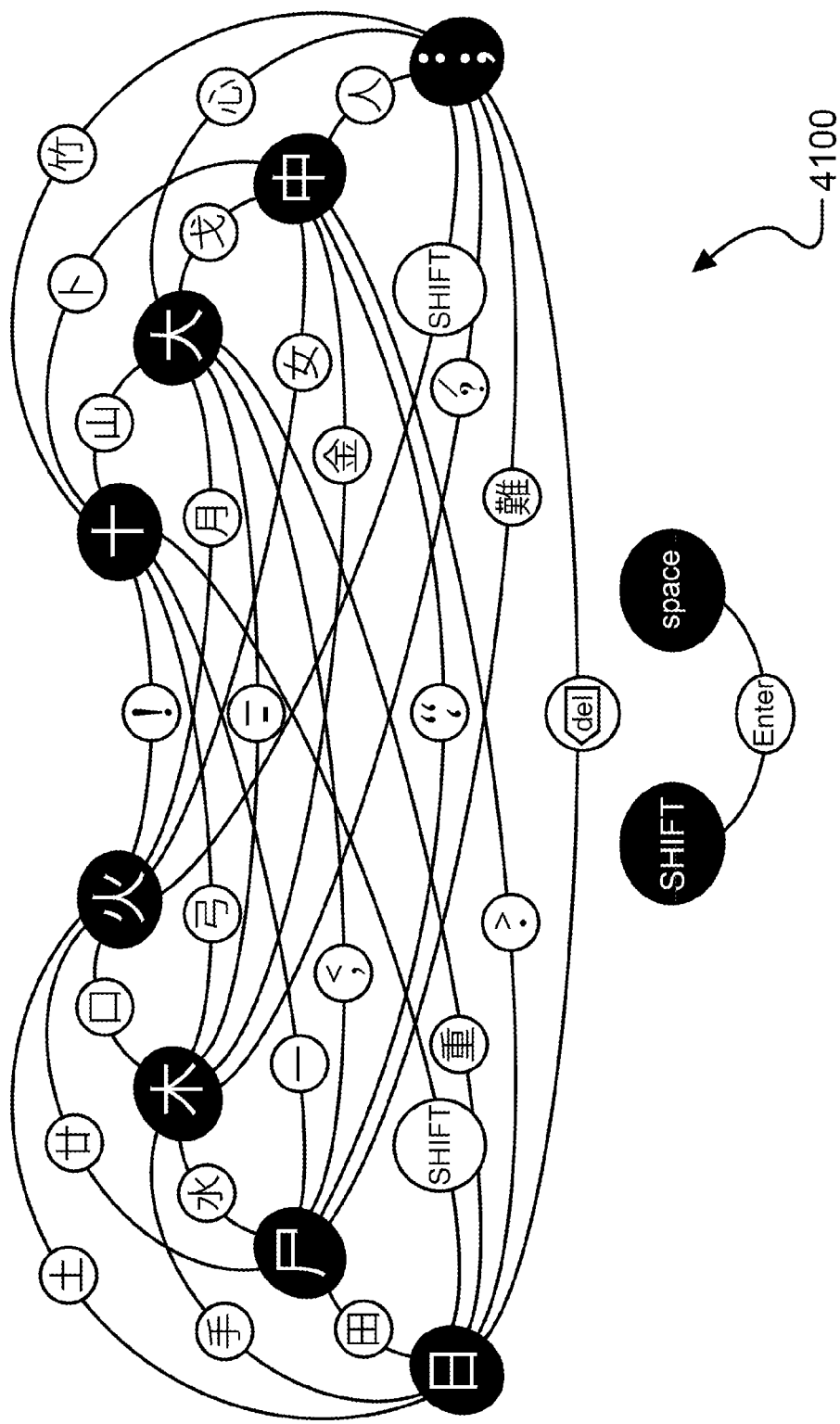
FIG. 41 shows a graphical depiction of at least a portion of an example of a map.
Figure 43:
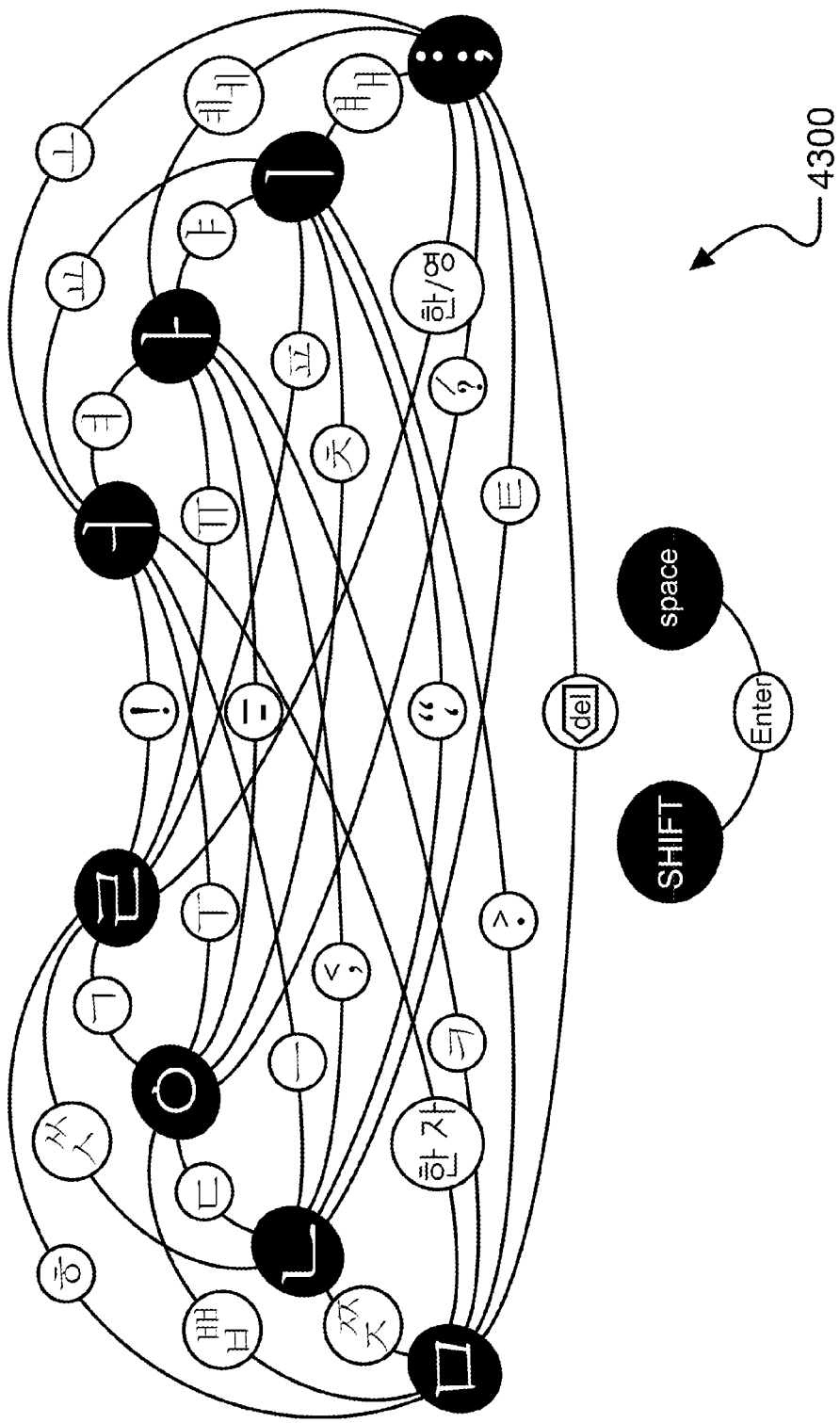
FIG. 43 shows a graphical depiction of at least a portion of an example of a map.
Figure 44:
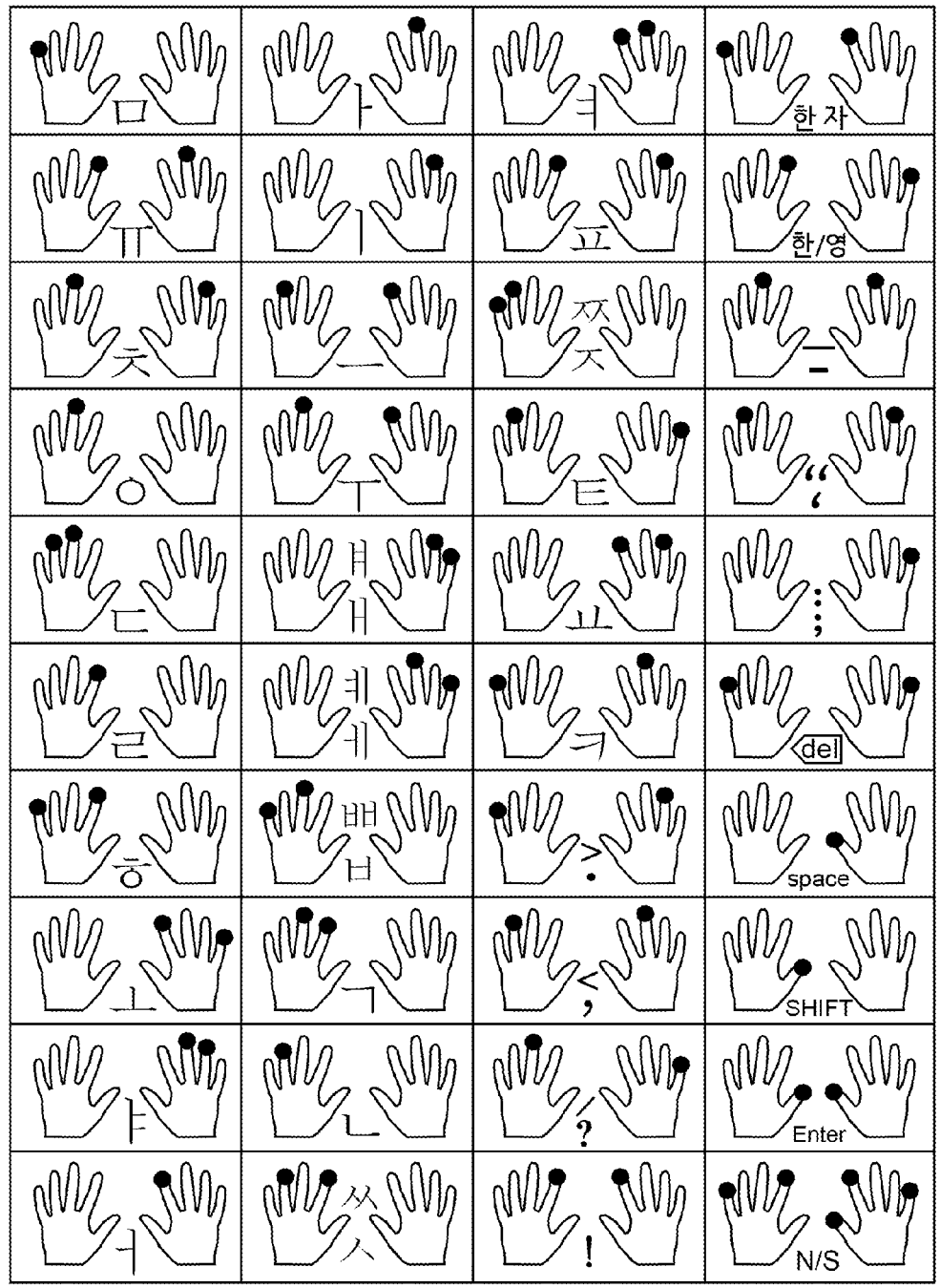
FIG. 44 shows a graphical depiction of examples of combinations of typing inputs and corresponding outputs.

Another example is a map 2900 and a graphical depiction 3000 shown in FIG. 29 and FIG. 30, which includes a map for less frequently used symbols.

In addition to the English alphabet, maps for other languages have also been developed. An example is a map 3100 and a graphical depiction 3200 shown in FIG. 31 and FIG. 32, which produce the upper-case letters of the Greek alphabet. Another example is a map 3300 and a graphical depiction 3400 shown in FIG. 33 and FIG. 34, which produce the lower-case letters of the Greek alphabet. Another example is a map 3500 and a graphical depiction 3600 shown in FIG. 35 and FIG. 36, which produce the Cyrillic (Russian) alphabet. Another example is a map 3700 and a graphical depiction 3800 shown in FIG. 37 and FIG. 38, which produce the Arabic alphabet. Another example is a map 3900 and a graphical depiction 4000 shown in FIG. 39 and FIG. 40, which produce Japanese characters. Another example is a map 4100 and a graphical depiction 4200 shown in FIG. 41 and FIG. 42, which produce Chinese characters. Another example is a map 4300 and a graphical depiction 4400 shown in FIG. 43 and FIG. 44, which produce Korean characters.

Chord combinations for larger combinations (three keys or more) in all of the alternate layouts may be mapped based on the processes 700 and 800.

Many European languages use diacritics (accent marks) to modify letters (u, e, g, etc.). In some implementations, unused or low-priority chords can be reassigned to attach diacritics to previously typed letters. In an example, the code 278 is not assigned to any digraphs or words, and could be used to add the umlaut diacritic to a typed letter. For example, if the user enters the input code 14-57, which translates to the text "fu" followed by the input code 278, an umlaut would be added to the last letter in the text to produce "fü". It is also possible to reassign some chord combinations to allow accented letters to be produced directly; for example the input code 1278 could be reassigned to produce "ä", the input code 2678 could be reassigned to produce "ö", and the input code 2578 could be reassigned to produce "ü". If the preceding character is a space or other delimiter character, the diacritical mark would be produced as a separate character. Table 15 shows potential input code assignments for some commonly used diacritics. Input codes for diacritics can be assigned based on the chord assignments for individual languages; the digraphs, words, and diacritics associated with a French dictionary and text sample, for example, might be different from those associated with a German dictionary and text sample. Diacritics may also be added as part of an autocorrect process; when a word is not recognized in a native dictionary but a version of the word with a diacritic would be recognized, the word can be replaced with its correct form. For example, in a configuration that uses a German dictionary for the autocorrect process, the word "fullen" would not be recognized as a viable word, and would be replaced with the correct form "füllen".

TABLE 15

| Diacritic | Potential Input Code Assignment | Common Uses | Additional Input Code Assignments |
|---|---|---|---|
| ¨ | 278 | ä ö ü | ä - 1278 |
|  |  |  | ö - 2678 |
|  |  |  | ü - 2578 |
| ` | 258 | à è | à - 1258 |
|  |  |  | è - 2358 |
| ´ | 248 | é | é - 2348 |

TABLE 15-continued

| Diacritic | Potential Input Code Assignment | Common Uses | Additional Input Code Assignments |
|---|---|---|---|
| ° | 478 | å | å - 1478 |
| ¸ | 378 | ç ç | ç - 23478 |
|  |  |  | ç - 2378 |
| ^ | 468 | ĉ ĝ | ĉ - 2468 |
|  |  |  | ĝ - 4678 |
| ˇ | 237 | ǧ ǔ | ǧ - 2347 |
|  |  |  | ǔ - 2357 |
| 1) | 178 | ı | ı - 1678 |
| . | 128 | ż | ż - 1268 |
| ~ | 378 | ñ | ñ - 5678 |

Notes:
1) Removes tittle from character

Implementations of the subject matter described in this specification can be implemented as one or more computer programs, i.e., one or more modules of computer program instructions, encoded on a computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources. The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), peer-to-peer networks (e.g., ad hoc peer-to-peer networks), wireless networks, mobile phone networks etc.

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

A number of implementations have been described. Nevertheless, it will be understood that various modifications may be made. In addition, other steps may be provided, or steps may be eliminated, from the described flows, and other components may be added to, or removed from, the described systems. Accordingly, other implementations are within the scope of the following claims.

What is claimed is:

1. A non-transitory computer-readable medium for encoding a computer program operable to cause a data processing apparatus to perform operations to determine a stenographic chord, the operations comprising:
   determining an input code that corresponds to more than two keys on an input device;
   determining multiple possible letter combinations that can be mapped to multiple respective combinations of the two or more keys based on a map for mapping the keys on the input device to letters;
   determining a frequency of use in language of the determined possible letter combinations; and
   assigning a combination of letters from the determined possible letter combinations to the input code based on the determined frequency of use, the combination of letters to be output when the two or more keys on the input device are input together as the chord.

2. A non-transitory computer-readable medium for encoding a computer program operable to cause a data processing apparatus to perform operations to determine a stenographic chord, the operations comprising:
   determining an input code that corresponds to more than two keys on an input device;
   determining multiple possible letter combinations that can be mapped to multiple respective combinations of the more than two keys based on a map for mapping the keys on the input device to letters;
   determining a frequency of use in language of the determined possible letter combinations by determining a first frequency of use for the first letter combination and a second frequency of use of a second letter combination of the multiple letter combinations; and
   assigning a letter combination from the determined possible letter combinations to the input code based on the determined frequency of use, the assigned letter combination to be output when the more than two keys on the input device are input together as the chord, wherein the assigned letter combination comprises a first letter combination;

determining that the first frequency of use and the second frequency of use exceed a threshold for frequency of use, determining that a difference between the first frequency of use of the first letter combination and the second frequency of use of the second letter combination does not exceed a comparison threshold, assigning the second letter combination to the input code dependent upon a second order of input of the more than two keys, and wherein assigning the first letter combination from the determined possible letter combinations to the input code based on the determined frequency of use comprises assigning the first letter combination to the input code letter dependent upon a first order of input of the more than two keys, the first order and the second order being different orders.

3. A non-transitory computer-readable medium for encoding a computer program operable to cause a data processing apparatus to perform operations to determine a stenographic chord, the operations comprising:

determining an input code that corresponds to more than two keys on an input device;

determining multiple possible letter combinations that can be mapped to multiple respective combinations of the more than two keys based on a map for mapping the keys on the input device to letters;

determining a frequency of use in language of the determined possible letter combinations by determining a first frequency of use for the first letter combination and a second frequency of use of a second letter combination of the multiple letter combinations; and assigning a letter combination from the determined possible letter combinations to the input code based on the determined frequency of use, the assigned letter combination to be output when the more than two keys on the input device are input together as a chord, wherein the assigned letter combination comprises a first letter combination;

determining that the first frequency of use and the second frequency of use exceed a threshold for frequency of use, determining that the first frequency of use of the first letter combination exceeds the second frequency of use of the second letter combination by more than a threshold, and wherein assigning the first letter combination from the determined possible letter combinations to the input code based on the determined frequency of use comprises assigning the first letter combination to input code letter irrespective of an order of input of the more than two keys.

4. A non-transitory computer-readable medium for encoding a computer program operable to cause a data processing apparatus to perform operations to determine a stenographic chord, the operations comprising:

determining an input code that corresponds to more than two keys on an input device;

determining multiple possible letter combinations that can be mapped to multiple respective combinations of the more than two keys based on a map for mapping the keys on the input device to letters;

determining a frequency of use in language of the determined possible letter combinations, wherein determining multiple possible letter combinations comprises determining multiple possible digraphs; and assigning a letter combination from the determined possible letter combinations to the input code based on the determined frequency of use, the assigned letter combination to be output when the more than two keys on the input device are input together as the chord, wherein assigning a letter combination comprises assigning a digraph from the multiple possible digraphs to the input code dependent upon the digraph being followed by one or more letters or preceded by one or more letters.

5. The non-transitory computer-readable medium of claim 4, wherein determining multiple possible letter combinations comprises determining multiple complete words; and the operations comprising assigning a word from the multiple complete word to the input code dependent upon the input code being terminated by a delimiter character.

6. The non-transitory computer-readable medium of claim 1, wherein the keys are letter keys.

7. The non-transitory computer-readable medium of claim 1, wherein the input device comprises more than five keys.

* * * * *